United States Patent [19]

Echizen et al.

[11] Patent Number: 5,114,770
[45] Date of Patent: May 19, 1992

[54] METHOD FOR CONTINUOUSLY FORMING FUNCTIONAL DEPOSITED FILMS WITH A LARGE AREA BY A MICROWAVE PLASMA CVD METHOD

[75] Inventors: Hiroshi Echizen, Tokyo; Yasushi Fujioka; Katsumi Nakagawa, both of Nagahama; Masahiro Kanai, Tokyo; Toshimitsu Kariya, Nagahama; Jinsho Matsuyama, Nagahama; Tetsuya Takei, Nagahama, all of Japan

[73] Assignee: Canon Kabushiki Kaisha, Tokyo, Japan

[21] Appl. No.: 543,431

[22] Filed: Jun. 26, 1990

[30] Foreign Application Priority Data

Jun. 28, 1989 [JP] Japan .................................. 1-166233
Aug. 14, 1989 [JP] Japan .................................. 1-207852

[51] Int. Cl.⁵ .............................................. B05D 3/06
[52] U.S. Cl. .................................... 427/38; 427/45.1; 427/248.1; 427/314; 427/398.1
[58] Field of Search ...................... 427/38, 45.1, 248.1, 427/314, 398.1

Primary Examiner—Bernard Pianalto
Attorney, Agent, or Firm—Fitzpatrick, Cella, Harper & Scinto

[57] ABSTRACT

A method for continuously forming a functional deposited film with a large area according to a microwave plasma CVD process is described. The method comprises the steps of continuously traveling a band-shaped member containing a conductive member along its length during which a pillar-shaped film-forming space capable of being kept substantially in vacuum therein is established by the use of the traveling band-shaped member as a side wall for the film-forming space, charging starting gases for film formation through a gas feed means into the film-forming space, and simultaneously radiating a microwave through a microwave antenna in all directions vertical to the direction of movement of the microwave so that microwave power is supplied to the film-forming space to initiate a plasma in the space whereby the film is deposited on the surface of the continuously traveling band-shaped member which constitutes the side wall exposed to the plasma. An apparatus for carrying out the method is also described.

25 Claims, 24 Drawing Sheets

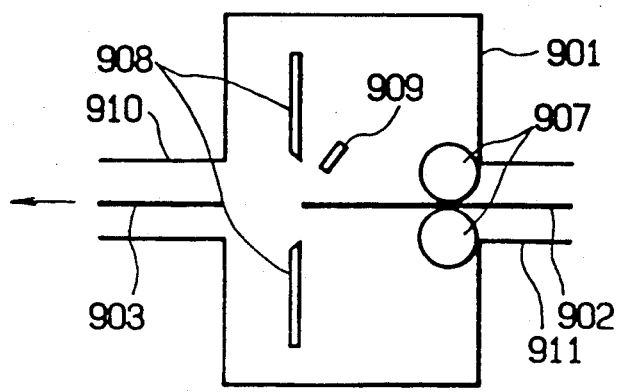
FIG. 9(iii)

FIG. 10 (i)
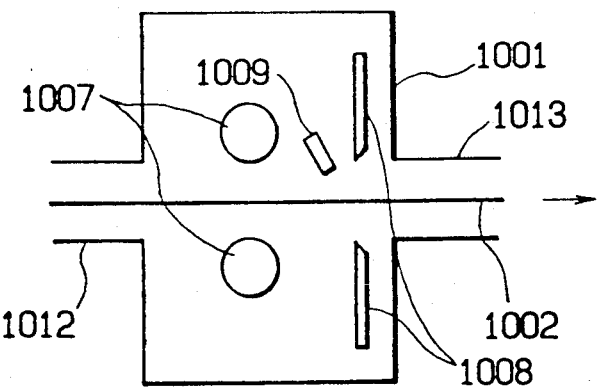
FIG. 10 (ii)
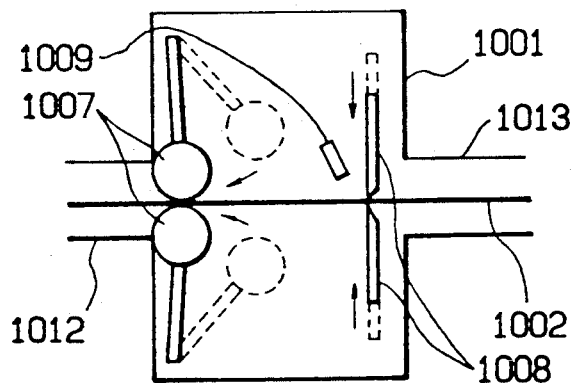
FIG. 10 (iii)
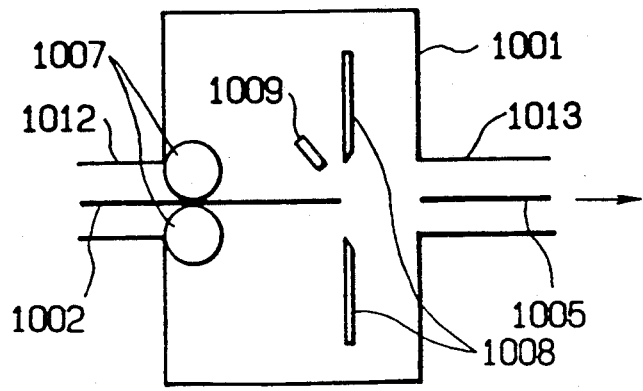

FIG. 10 (iv)
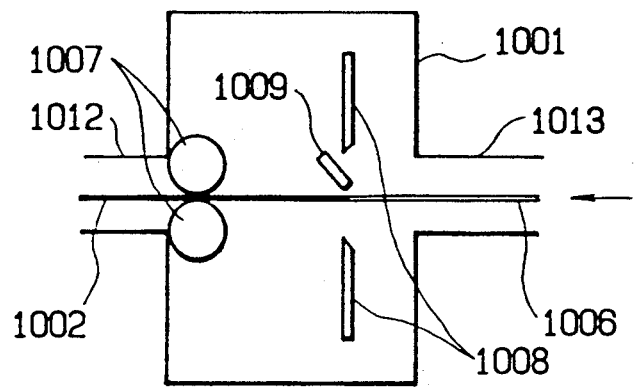
FIG. 10 (v)
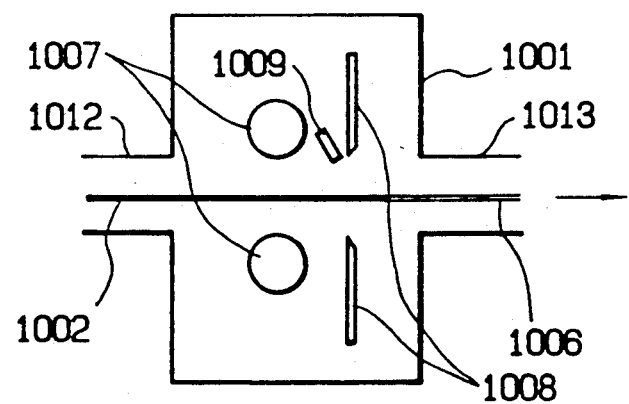

FIG. 11
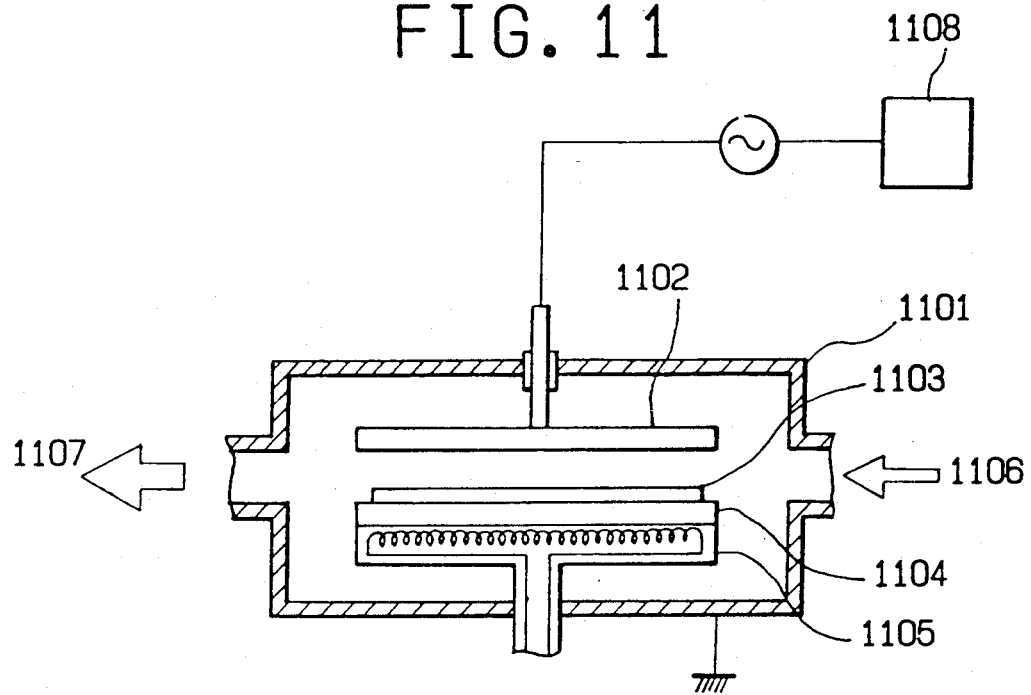
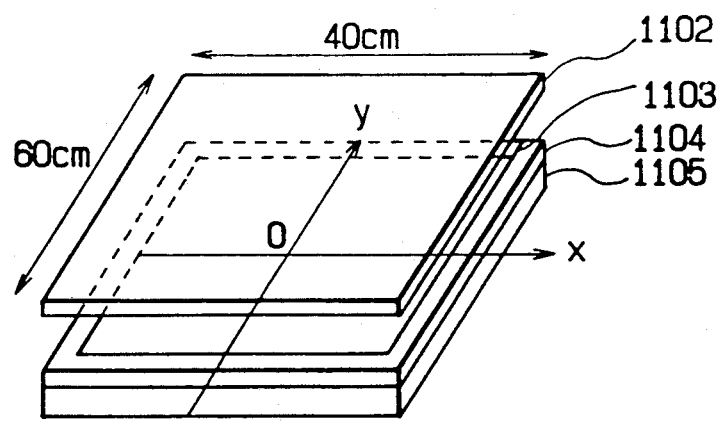

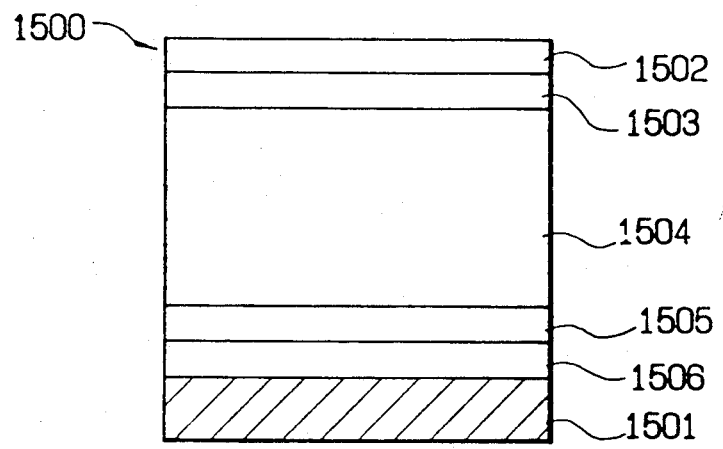
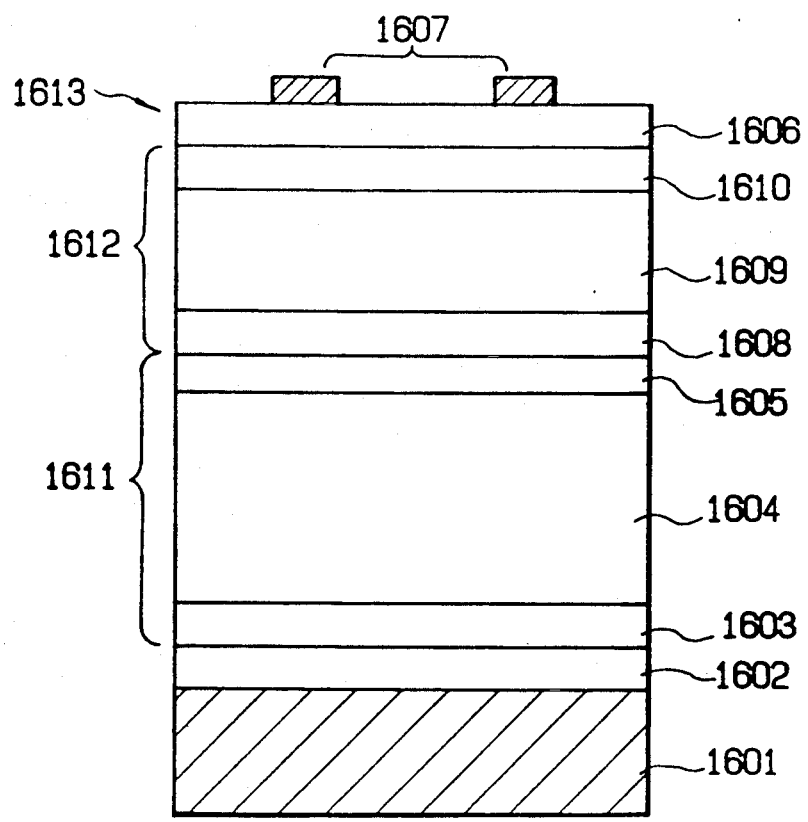

METHOD FOR CONTINUOUSLY FORMING FUNCTIONAL DEPOSITED FILMS WITH A LARGE AREA BY A MICROWAVE PLASMA CVD METHOD

BACKGROUND OF THE INVENTION

1. Field of the Invention

This invention relates to a method and apparatus for continuously forming functional deposited films with a large area by decomposing and exciting starting gases through plasma reactions caused by a novel microwave energy applicator capable of generating a uniform microwave plasma over a large area. More particularly, the invention relates to a method and apparatus for continuously forming functional deposited films with good uniformity over a large area by drastically increasing the utilization efficiency of the starting gases and at high speed. By this, mass production of large area thin film semiconductor devices such as photovoltaic devices can be realized at low costs.

2. Description of the Prior Art

Electric power demand is now on the drastic increase on a worldwide scale. Studies have been made on how the electric power production should be conducted to meet the demand as one of worldwide problems. At present, electric power production has been made through hydroelectric power generation, steam power generation and atomic power generation. Among these power generation systems, the hydroelectric generation, which utilizes rain fall, is difficult in a given amount of stationary electric power production. The steam power generation makes use of so-called fossil fuels such as petroleum, coal and the like and most of the power consumption has been met by this generation system. However, the fossil-fuel is limited in amount, coupled with another substantial problem that carbon dioxide inevitably discharged during the power generation will invite the global greenhouse effect. Thus, the necessity of conversion into other power generation systems has been discussed.

Under these circumstances, great attention has been paid to the atomic power generation with a tendency to increase a ratio of the atomic power generation in the electric power production. Since, however, the atomic power generation involves the great possibility of presenting a serious life-or-death question on all creatures, i.e. the radioactive contamination problem, the security of safety is essential and studies on this have been made globally.

In the light of this background, "solar power generation" has attracted great attention in recent years and a great number of proposals have been made on the solar power generation. However, all the proposed solar power generation systems have never enabled the power production from the standpoint of supplying the electric power demand. The hitherto proposed solar power generation systems can be broadly classified into the following two groups.

System A: sunlight is converged to heat water to boiling thereby generating steam (photo-thermo conversion), followed by power generation in boiler (thermoelectric conversion).

System B: electric power is generated by the photoelectric conversion through solar cells.

The solar generation system A is one wherein electric power is generated after two energy conversion stages with a low conversion efficiency of the system. Although small plant tests started, this system has not been in use yet.

On the other hand, with regard to the solar power generation system B, a number of systems have been proposed, among which some have been actually used as a power source such as of wrist watches, desk calculators and the like. The power generation apparatus for the purpose of electric power have been tested on a small scale but are now not beyond the range of investigation stages.

This is because there are several problems which have to be solved in order to stationarily produce electric power on a large scale, of which the greatest problem is whether or not solar cells having a large area enough to entail large-scale power production can be manufactured on an industrial scale since the capability of power generation is proportional to the area of the solar cell. The solar cell includes semiconductor junctions, such as so-called p-n junctions, p-i-n junctions and the like, in semiconductor layers used as important members. These semiconductor junctions are formed by superposing semiconductor layers of different conduction types, implanting one conduction-type dopant into a semiconductor layer of the other conduction type such as by ion implantation, or diffusing the dopant into the semiconductor layer by thermal diffusion. A number of materials used to form the semiconductor layer have been proposed but directed mainly to polycrystalline silicon (hereinafter referred to simply as "x-Si"), amorphous silicon (hereinafter referred to simply as "a-Si") and compound semiconductive materials.

In case where any material mentioned above is employed, production problems such as of uniformity, reproducibility and the like, problems on the photoelectric conversion efficiency and problems on production costs arise, so that production processes of solar cells with a large area in large amounts and element structures of the solar cell, which meet a huge power demand, have not been accomplished yet.

Especially, a solar cell panel using single crystal Si is fabricated by subjecting an Si wafer cut away from a silicon ingot to ion implantation to form p-n junctions and arranging the implanted wafers as closely as possible to connect them with one another. The production process of the solar cell element is not suitable for treating a large number of substrates with a large area. To begin with, the single crystal Si ingot with a larger diameter is very expensive. In the step of cutting away of the Si wafer, a great amount of non-utilizable portions are produced as a swarf. These cause the production costs of the single crystal Di solar cell to be increased. Any effective measure for solving the above problems has not bee found up to now. With regard to solar cells using polycrystalline Si, the photoelectric conversion efficiency is slightly better than the solar cell using a-Si, but the technique of controlling the size of crystal particles which is one of factors of determining the characteristics has not been accomplished. Moreover, the device fabrication process is almost the same as that for the single crystal Si solar cell and is not thus suitable for the mass production.

x-Si, which is either in a single crystal form or in a polycrystal form, has inherent properties of crystals that it is liable to break. Accordingly, for solar power generation in outdoor environments, severe protective materials are necessary. The solar cell panel units covered with a protective material become so high in weight that limitations are placed on the setting place and environment.

On the other hand, in the fabrication of solar cells with a large area by the use of a-Si, starting gases containing a dopant element, e.g. phosphine ($PH_3$), diborane ($B_2H_3$) and the like, are mixed with silanes used as a main starting gas and subjected to decomposition by glow discharge to obtain a semiconductor layer with a desired conduction type. A plurality of the semiconductor layers are successively deposited on a desired substrate to readily obtain semiconductor junctions. Thus, it is known that the cell can be fabricated more inexpensively than in the case using x-Si.

As for the glow discharge decomposition, the RF (radio frequency) glow discharge decomposition process has been technically established and, in fact, are in wide use. However, this process enables one to form the semiconductor film of relatively high quality at low deposition rate but is difficult in forming high-quality semiconductor films sufficient to function as a solar cell at high speed over a large area. Needless to say, the fabrication of solar cells on an industrial scale for supplement of the power demand will be very difficult.

As a process for forming deposited films of high quality at high speed, attention has been drawn to a plasma process using microwaves. Since the microwave has a short frequency band, it is possible to increase a power density in a film-forming chamber over conventional processes using RF. This process is suitable for efficiently initiating and sustaining a plasma.

For instance, U.S. Pat. Nos. 4,517,223 and 4,504,518 describe processes for the deposition of thin films on substrates at a low pressure by causing glow discharge by microwave power. According to these patents, these formation processes of deposited films are carried out at low pressure with attendant advantages such as a reduced number of recombinations of radicals which would cause deposited film characteristics to be lowered when great power is charged, a reduced degree of formation of fine powder, such as of polysilane, in the plasma and an improved film-forming speed. However, the transmission efficiency of the microwave energy to the plasma is not satisfactory. In the latter patent, it is disclosed to provide two microwave applicator means serving as slow wave circuits, which are not parallel to each other, in a plane parallel to a substrate. More particularly, it is disclosed that the central axes of the microwave applicator means should preferably be provided so that they are crossed in the planes parallel to the substrate and on a straight line which is at right angles to the direction of movement of the substrate and that in order to prevent the interference between the two microwave applicator means, the microwave applicator means are provided by transversely shifting with respect to the direction of movement of the substrate by a length corresponding to half the major side of a waveguide.

As an antenna system which is relatively easy in handling among microwave applicator means, microwave plasma CVD apparatus, as shown in FIGS. 18 and 19, are described, for example, in Japanese Patent Publication No. 57-53858 and Japanese Laid-open Patent Application No. 61-283116. In these apparatus, the antenna is surrounded by a cylinder constituted of a microwave-transmitting material and a film-forming chamber is air-tightly sealed by means of the cylinder. The microwave is introduced from outside of the film-forming chamber. As a result, the life of the antenna is prolonged by preventing deposition of the film on the antenna, ensuring generation of a high density plasma over a wide pressure range. In the apparatus shown in FIG. 19, within a reaction container 1901 are provided a substrate 1903 mounted on a substrate holder 1902 and a microwave applicator means. Reference numeral 1904 is a coaxial line serving as the microwave applicator means. The microwave power is supplied from a space 1905 provided by cutting away part of an outer conductor of the coaxial line 1904 into the reaction container 1901 through a microwave-permeable cylinder 1906. However, with this apparatus, it will be apparently difficult to uniformly form an a-Si film on the substrate with a large area and, in fact, the uniform formation over a large area is not particularly described. On the other hand, in the apparatus shown in FIG. 18, a reaction container 1801 has a rod antenna 1802 serving as a microwave applicator means, a gas feed port 1803, a gas exhaust port 1805 connected to a vacuum pump 1804, and substrates 1807 mounted on a quartz cylinder 1806. The microwave power generated with a microwave oscillator is transmitted through a waveguide 1808 and is discharged into a space surrounded by the quartz cylinder 1806 through the rod antenna 1802 and the microwave-transmitting member 1809 wherein a plasma is developed for the treatment with the plasma. However, because of inherent properties of the rod antenna where the microwave power or energy is radiated into the space through transmission of the rod antenna, the microwave energy is attenuated along the length of the rod antenna, making it difficult that the plasma is made uniform along the lengthwise direction.

With a cavity resonator system known as another type of microwave applicator means, there have been proposed several means for sustaining the uniformity of plasma. These proposals are reported, for example, in Journal of Vacuum Science Technology B-4 (January--February, 1986) pp. 295-298 and B-4 (January-February, 1986), pp. 126-130. According to these reports, a cylindrically-shaped cavity resonator-type microwave reactor called a microwave plasma disc source (referred to simply as MPDS) has been proposed. More particularly, the plasma is in the form of a disc and is included in the cylindrically-shaped cavity resonator as part of the resonator with its diameter being a function of the microwave frequency. These reports give evidence that MPDS is provided with a resonator length variable mechanism adapted to tune with the microwave frequency. In the MPDS designed to operate at 2.45 GHz, the plasma confined diameter is at most approximately 10 cm and the plasma volume is approximately 118 $cm^3$. This is far from a large surface area. It is also reported that in a system designed for operation at the lower frequency of 915 MHz, a lower frequency source would provide a plasma diameter of about 40 cm with a plasma volume of 2000 $cm^3$.

In the reports, it is further stated that operation at a lower frequency, for example, of 400 MHz will scale up the discharge to a diameter in excess of 1 m. In order to achieve the above purpose, a specific type of microwave oscillator for great electric power has to be developed. Even if such a microwave oscillator will be successfully assembled, the use of the oscillator would be difficult since limitation is placed on the industrially utilizable frequency according to the radio law in order to avoid disturbances on communication lines.

As yet another type of microwave applicator means, systems using electron cyclotron resonance (ECR) have been proposed in Japanese Laid-open Patent Application Nos. 55-141729 and 57-133636. These systems include electromagnets coaxially provided about a cavity resonator which becomes a plasma chamber. A magnetic field of 875 gausses is formed by means of the electromagnets in the vicinity of a microwave introducing window to establish electron cyclotron resonance (ECR) conditions, thereby enhancing a coupling rate of the microwave into a plasma and causing a high density plasma to be generated. The high density plasma is transferred along the dispersed magnetic field formed by means of the electromagnets, thereby forming a desired deposited film on a desired substrate.

This system is similar to the afore-described microwave plasma disc source system (MPDS) with respect to the use of the cavity resonator. However, part of the interior of the cavity resonator is occupied by the plasma in the MPDS system, from which the ECR system differs in that the plasma is filled in the interior of the cavity resonator and that the electron cyclotron resonance phenomenon is utilized.

In the academic circles in this field, a number of formations of various types of semiconductor thin films by utilizing the high density plasma formed by the ECS system have been reported. This type of microwave ECR plasma CVD apparatus has been already on the market.

In the processes using these ECR systems, the plasma is controlled by the use of a dispersed magnetic film applied from outside of the cavity resonator, so that the distribution of the magnetic field which is made by the electromagnets on the substrate surfaces becomes nonuniform, making it very difficult to form a uniform and homogeneous deposited film on a large-area substrate.

Japanese Laid-open Patent Application No. 63-283018 discloses a process wherein part of the above difficulty is overcome and the distributions of the film thickness and the film quality are improved. In this process, a magnetic field generator means (e.g. second electromagnets) other than the electromagnets provided about the cavity resonator is provided about the substrate by which uniformity in the film thickness and quality distributions is attained. However, the second electromagnet is too large in size. Even when the apparatus is arranged using so large a magnet, only the uniformity in the film quality and thickness of approximately 15 cm $\phi$ is obtained.

As described hereinabove, in addition of the extablishment of applicator means for high frequencies such as RF or microwave, it seem to be necessary to establish a continuous film formation apparatus for producing a solar cell device by successively depositing a plurality of semiconductor films with desired conduction types to form semiconductor junctions.

As an example of such a continuous film formation apparatus, there has been proposed an apparatus which includes a plurality of separate film-forming chambers for forming a plurality of semiconductor films, the chambers being connected through partition valves, and a pair of parallel flat plate-shaped RF electrodes provided in the respective film-forming chambers, wherein in the respective film-forming chambers, the respective semiconductor films are deposited by an RF glow discharge decomposition technique under conditions isolated from other film-forming chamber. More particularly, a so-called three chamber separation-type continuous film formation apparatus has been proposed as a continuous film formation apparatus of a deposited semiconductor device having p-i-n junctions. The respective film formation chambers for forming a p-type semiconductor layer, an i-type semiconductor layer and an n-type semiconductor layer are separated from one another by means of the partition valves wherein the respective layers are formed by the RF glow discharge decomposition method. During the deposition of the respective layers, the cycle of film formation, exhaustion, transfer and film formation is repeated and thus, it takes a long time for the film formation. In addition, the width of the substrate is limited by the partition valves. Thus, this apparatus is, by no means, a continuous film formation apparatus which is able to produce solar cell devices in amounts sufficient to substitute for current power generation systems.

In contrast, U.S. Pat. No. 4,400,409 discloses a roll-to-roll continuous film formation apparatus which is substantially free from the limitations on the film formation time and the width of the substrate and has thus a practical merit. According to this apparatus, a flexible band-shaped substrate having a desired with and an appropriate length is passed along which a plurality of RF glow discharge regions are provided. In the respective RF glow discharge regions, a semiconductor film mainly composed of a-Si is formed. The band-shaped substrate is continuously transferred along the lengthwise direction substantially horizontally. As a result, devices having semiconductor junctions constituted of a number of semiconductor layers corresponding to the number of the RF glow discharge regions can be continuously formed. In this patent, it is stated that the diffusion and incorporation of dopant gases used at the time of the formation of the respective semiconductor layers in other RF glow discharge regions are prevented by provision of gas gates. More particularly, the gas gates are used to separate the RF glow discharge regions from one another by means of slits serving as a gas separation passage. At the respective separation passages, a means for forming a stream of a scavenging gas such as, for example, Ar, $H_2$ or the like is provided.

However, since the formation of the respective semiconductor layers is carried out by the plasma CVD method using RF (radio frequency), limitation is inevitably placed on an improvement of the film deposition rate while keeping the characteristics of the continuously formed film. For instance, even when the semiconductor film having a film thickness of, at most, 5000 angstroms, the film deposition rate is so slow that it is necessary to invariably initiate a given plasma along the travel direction of the elongated band-shaped substrate over a large area and to uniformly sustain the plasma. In doing so, an appreciable skill is required and it is difficult to generalize various related plasma control parameters. Moreover, the decomposition and utilization efficiencies of the starting gases used for the film formation are not so high, which is one of factors raising the production costs.

Japanese Laid-open Patent Application No. 61-288074 discloses a deposited film formation apparatus using an improved roll-to-roll continuous film formation process. In this apparatus, a flexible continuous band-shaped member set in a reaction container is formed at part thereof with a curved portion, to which an active species produced from starting gases in an activation space different from the reaction container is transferred. Thereafter, the active species is introduced into the reaction container to cause chemical interaction by thermal energy, thereby forming a deposited film on the inner surface of the curved portion of the band-shaped member. The deposition on the inner surface of the curved portion will make a compact apparatus. In addition, the use of the previously activated species will facilitate the film formation rate upon comparison with the case of the known deposited film formation apparatus.

This apparatus makes use of the deposited film formation reaction by the chemical interaction caused by application of the thermal energy. Accordingly, the distance between the reaction container of the deposited film formation apparatus and the activation space and the film forming conditions are limited depending on the manner of supplying the thermal energy, the likelihood of the reaction between the active species and other molecules and the life of the active species before deactivation. This results in a difficulty in forming a large area.

The thin film semiconductors have been appropriately applied not only to the afore-described solar cells, but also to thin film semiconductor devices requiring a large area or an elongated film such as thin film transistors (TFT) for driving picture elements of liquid crystal displays, photoelectric conversion elements for contacted image sensors and switching elements. In practice, some thin film semiconductors have been employed as a key component for the image input and output apparatus. However, provision of a novel deposited film formation process capable of forming films of high quality and good uniformity with a large area at high speed will widespread the thin film semiconductors for general purposes.

SUMMARY OF THE INVENTION

An object of the invention is to provide a novel method and apparatus for forming functional deposited films which overcome the problems of the prior art methods and apparatus of forming thin film semiconductor devices and wherein the functional deposited films of high quality can be formed uniformly over a large area at high speed.

Another object of the invention is to provide a method and apparatus for continuously forming a functional deposited film of high quality on a band-shaped or elongated member.

A further object of the invention is to provide a method and apparatus whereby the utilization efficiency of starting gases used to form the deposited film can be drastically enhanced and the mass production of the thin film semiconductor devices can be realized at low costs.

A still further object of the invention is to provide a method and apparatus wherein a substantially uniform plasma can be initiated and sustained over a large area and in large volumes.

Yet another object of the invention is to provide a method and apparatus wherein the plasma potential for a microwave plasma generated over a large area and in large volumes can be controlled uniformly, reproducibly and stably.

BRIEF DESCRIPTION OF THE DRAWINGS

FIGS. 9(i) to (v) and FIGS. 10(i) to 10(v) are, respectively, schematic views illustrating mechanisms of attaching and removing a band-shaped substrate;

FIG. 11 is a schematic view illustrating a known RF plasma CVD apparatus;

FIGS. 13 to 17 are, respectively, schematic views showing arrangements of deposited films;

DESCRIPTION AND THE PREFERRED EMBODIMENT OF THE INVENTION

Figure 1:
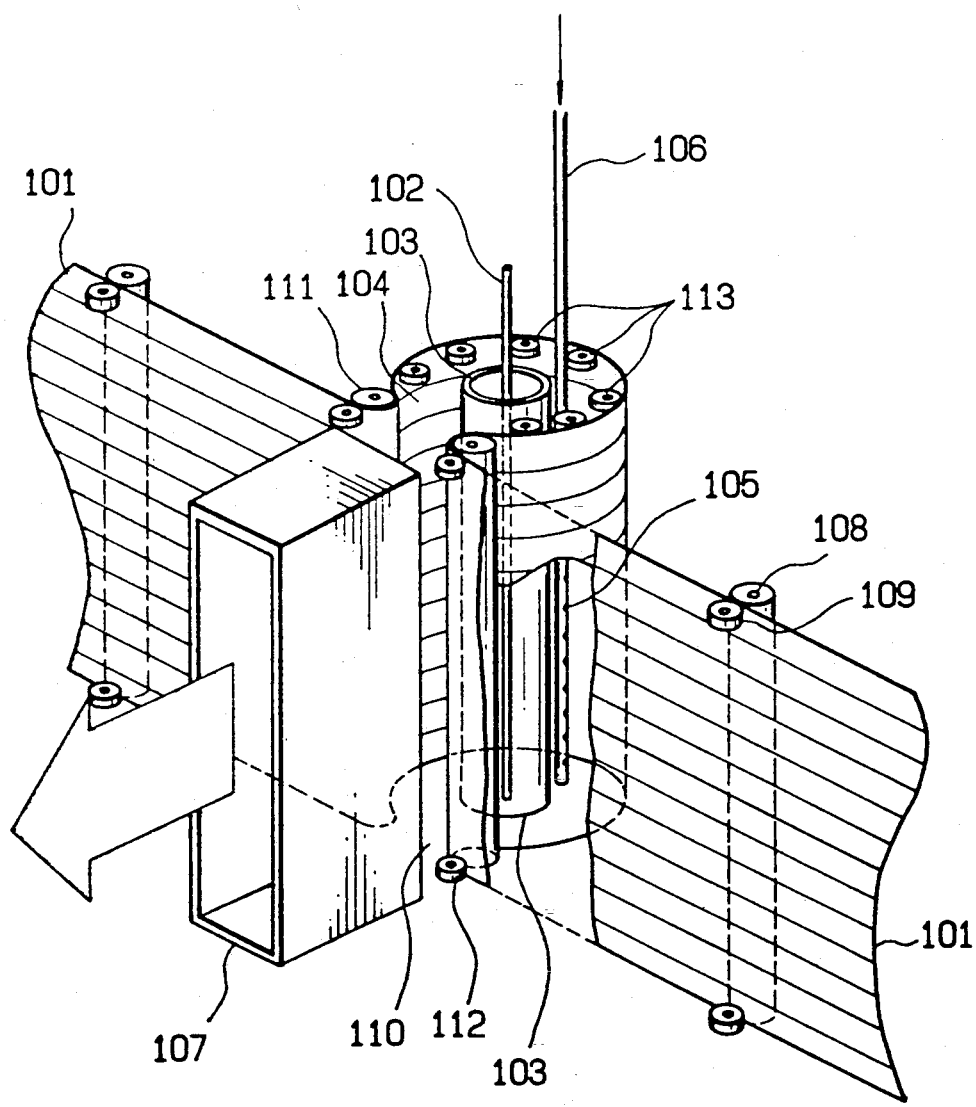
FIGS. 1 and 2 are, respectively, perspective illustrative views of a film forming chamber and its peripheral mechanisms of an apparatus according to the invention.

We made intensive studies in order to solve the problems involved in the known semiconductor deposited film forming apparatus and to achieve the objects of the present invention. As a result, it was found that when the side walls of a film-forming chamber is constituted of a band-shaped member to be continuously moved and microwave power is supplied toward the side walls of the film-forming chamber from a microwave antenna means through a microwave transmitting member under such conditions that the film-forming chamber is maintained at a pressure where starting gases are readily diffused, a functional deposited film with a large area can be continuously formed in good uniformity as a result of the synergistic effect of the above combination, irrespective of the non-uniformity in the introduction of the microwave and starting gases.

It was also found that when a bias voltage was applied to a bias applicator means provided separately of the band-shaped member in the film-forming chamber, a microwave plasma which is uniform along the lengthwise direction of the microwave antenna could be initiated and the plasma potential could be appropriately controlled.

The present invention is accomplished based on the above findings and contemplates to encompass a method and apparatus for continuously forming functional deposited films with a large area according to a microwave plasma CVD process as described hereinafter.

According to one embodiment of the invention, there is provided a method for continously forming a functional deposited film with a large area according to a microwave plasma CVD method, the method of the invention comprises: continuously traveling a band-shaped member containing a conductive member along its length during which a pillar-shaped film-forming space capable of being kept substantially in vacuum therein is established by the use of the traveling band-shaped member as a side wall for the film-forming space; charging starting gases for film formation through a gas feed means into the film-forming space; and simultaneously radiating a microwave through a microwave antenna in all directions vertical to the direction of movement of the microwave so that microwave power is supplied to the film-forming space to initiate a plasma in the space whereby the film is deposited on the surface of the continuously traveling band-shaped member which constitutes the side wall exposed to the plasma.

In the method of the invention, on the way of the band-shape member being moved, a curve-initiating edge forming means and a curve-completing edge forming means are provided to allow a space between the curve-initiating edge forming means and the curve-completing edge forming means and along the lengthwise direction of the band-shaped member so that the band-shaped member is curved to form the side wall for the film-forming space.

The microwave antenna is extended into the film-forming space from either of opposite end faces of the pillar-shaped film-forming space formed of the band-shaped member as the side wall, through which the microwave power or energy is supplied into the film-forming space The method of the invention further embraces a procedure which comprises selecting a material for the band-shaped member having a linear expansion coefficient which is larger than a linear expansion coefficient of the deposited film, curving the band-shaped member while keeping the band-shaped member at a desired film-forming temperature higher than room temperature, thereby forming a deposited film on the concave side of the curved surface, and developing the curved band-shaped member to make the member flat at outside of the film-forming space while cooling the band-shaped member down to room temperature and discharging the flat member to outside of the apparatus or winding the curved band-shaped member in the form of a convex and discharging it to outside of the apparatus.

Simultaneously with the supply of the microwave energy to the film-forming space by means of the microwave antenna means through a microwave transmitting member provided between the microwave antenna means and the film-forming space, the microwave antenna means should be separated from the plasma initiated within the film-forming chamber.

The outer diameter of the microwave transmitting member should preferably be controlled and selected depending on the complex dielectric constant of the plasma.

According to another embodiment of the invention, there is provided an apparatus for continuously forming a functional deposited film with a large area on a continuously traveling band-shaped member by a microwave plasma CVD method, the apparatus comprising: a film-forming chamber of a pillar-shaped form formed by a side wall made of a band-shaped material which is continuously traveled along the lengthwise direction through a means for supporting and transferring the band-shaped member and curved by a curved portion-forming means on the way of the travel; means for maintaining the interior of the film-forming chamber substantially in vacuum; a microwave coaxial line capable of supplying a energy in order to initiate a microwave plasma within the film-forming chamber; and a central conductor separation means which is made of a member capable of transmitting the microwave power supplied from the coaxial line and is capable of separating a central conductor of the coaxial line from starting gases used to form a film; exhaust means for the film-forming chamber, and means for introducing the starting gases into the film-forming chamber, whereby a deposited film is continuously formed on the inner surface of the band-shaped member which is continuously traveled and constitutes the side wall of the film-forming chamber.

In the apparatus of the invention, the curved portion-forming means consists of a curve-initiating edge forming roller, a curve-completing edge forming roller and rings for supporting the end faces of the curved portion which are facing each other in such a way that the curve-initiating edge forming roller and the curve-completing edge forming roller are disposed parallel to each other while leaving a space along the lengthwise direction of the band-shaped member.

The apparatus of the invention is so arranged that the central conductor of the coaxial line is extended into the interior of the film-forming chamber form either of opposite end faces of the pillar-shaped film-forming chamber and is arranged parallel to the band-shaped member in the vicinity of the central axis of the pillar-shaped film-forming chamber.

The central conductor separation means made of the microwave transmitting member in the apparatus of the invention is rotationally symmetric and has a vacuum flange at least at one end of the separation means. The separation means may take any of a cylindrical, truncated conical or conical form.

In a preferred embodiment of the apparatus of the invention, at least two tuning means are disposed on the coaxial line, one of which serves as an insertion length control means for the central conductor extending into the interior of the film-forming chamber.

According to a further embodiment of the invention, the method of the invention further embraces the following procedure for continuously forming a function deposited film with a large area according to a microwave plasma CVD method, which comprises: continuously traveling a band-shaped member along its length during which a pillar-shaped film-forming space capable of being kept substantially in vacuum is established by the use of the traveling band-shaped member as a side wall for the film-forming space; charging starting gases capable of forming a film by irradiation of a plasma through a gas feed means into the film-forming space; and simultaneously radiating a microwave through a microwave antenna in all directions vertical to the direction of movement of the microwave so that microwave power is supplied to the film-forming space to initiate a plasma in the space whereby the film is deposited on the surface of the continuously traveling band-shaped member, which constitutes the side wall exposed to the plasma, while controlling a potential of the microwave plasma.

In this method of the invention, on the way of the band-shaped member being moved, a curve-initiating edge forming means and a curve-completing edge forming means are provided to allow a space between the curve-initiating edge forming means and the curve-completing edge forming means and along the lengthwise direction of the band-shaped member so that the band-shaped member is curved to form the side wall for the film-forming space.

The method of the invention further embraces a procedure which comprises using a material for the band-shaped member having a linear expansion coefficient which is larger than a linear expansion coefficient of the deposited film, continuously curving the band-shaped member while keeping the band-shaped member at a desired film-forming temperature higher than room temperature, thereby forming a deposited film on the concave side of the curved surface, and cooling the band-shaped member, on which the deposited film has been formed, to room temerature at outside of the film-forming space whereupon the band-shaped member is cooled after development into a flat member or after winding in the form of a convex.

The microwave antenna is extended into the film-forming space from either of opposite end faces of the pillar-shaped film-forming space formed of the band-shaped member as the side wall, through which the microwave power is supplied to or discharged into the film-forming space.

The microwave power is discharged into the film-forming space by means of the microwave antenna means through a microwave transmitting member provided between the microwave antenna means and the film-forming space, and the microwave antenna means should be separated from the plasma initiated within the film-forming chamber by means of the microwave transmitting member.

In the method of the invention, the plasma potential should be controlled through a bias applicator means which is separated from the band-shaped member.

The bias applicator means is provided so that part of the bias applicator means contacts the microwave plasma under which a bias voltage is applied to the bias applicator means. At least a part of the bias applicator means which contacts the microwave plasma should preferably be subjected to conduction treatment.

The bias voltage used is preferably DC, ripple and/or AC voltage.

The bias applicator means may also serve as the gas feed means or may be disposed as separating from the gas feed means.

The bias applicator means is constituted of one bias bar or a plurality of bias bars.

In the method of the invention, the plasma potential may be controlled by a bias voltage applied to the band-shaped member, and the gas feed means is in ground potential and is arranged so that at least a part thereof is contacted with the microwave plasma.

The at least part of the gas feed means which contacts the microwave plasma should be subjected to conduction treatment.

Moreover, the outer diameter of the microwave transmitting member is controlled and selected depending on the complex dielectric constant of the plasma.

The side of the band-shaped member which is exposed to the microwave plasma should be subjected to conduction treatment.

According to a still further embodiment of the invention, there is provided an apparatus for continuously forming a functional deposited film with a large area on a traveling band-shaped member according to a microwave plasma CVD method which comprises: a film-forming chamber of a pillar-shaped or columnar form formed from a band-shaped member which is continuously traveled along the lengthwise direction through means for supporting and transferring the band-shaped member, the band-shaped member being curved by a curved portion-forming means on the way of the travel to form the filmforming chamber established by the band-shaped member as a side wall; means for keeping the inside of the film-forming chamber substantially in vacuum; a microwave coaxial line capable of suppling microwave power in order to initiate a microwave plasma within the film-forming chamber; and a central conductor separation means which is capable of transmitting the microwave power supplied from the coaxial line and capable of separating the central conductor of the coaxial line from the microwave plasma; exhaust means for the film-forming chamber; gas feed means for introducing starting gases used to form a film into the film-forming chamber; bias applicator means for controlling a plasma potential of the microwave plasma; and a temperature control means for heating and/or cooling the band-shaped member, whereby a deposited film is continuously formed on the surface, exposed to the microwave plasma, of the band-shaped member which forms the side wall of the film-forming chamber while being continuously traveled.

In the apparatus of the invention, the curved portion-forming means consists of a curve-initiating edge forming roller, a curve-completing edge forming roller and rings for supporting the end faces of the curved portion which are facing each other in such a way that the curve-initiating edge forming roller and the curve-completing edge forming roller are disposed parallel to each other while leaving a space along the lengthwise direction of the band-shaped member.

The bias applicaator means of the apparatus of the invention is disposed in a spaced relation with the band-shaped member.

The bias applicator means is so provided that at least a part of the abias applicator means contact the microwave plasma under which a bias voltage is applied to the bias applicator means. The at least part of the bias applicator means which contacts the microwave plasma is subjected to conduction treatment.

The bias voltage used is preferably DC, ripple and/or AC voltage.

In the apparatus of this embodiment, the bias applicator means may also serve as the gas feed means or may be disposed as separating from the gas feed means.

The bias applicator means is constituted of one bias bar or a plurality of bias bars.

In the apparatus of this embodiment, where bias applicator means is provided for serving also as the band-shaped member, the gas feed means is grounded so that at least a part thereof has to be disposed as contacting the microwave plasma. In this case, the at least part of the gas feed means which contacts the microwave plasma is subjected to conduction treatment.

In practice, the central conductor of the coaxial line is extended into the interior of the film-forming chamber from either of opposite end faces of the film-forming chamber of the pillar-shaped form and is arranged substantially parallel to the transverse direction of the band-shaped member in the vicinity of the central axis of the pillar-shaped film-forming chamber.

The central conductor separation means made of the microwave transmitting member in the apparatus of the invention is rotationally symmetric and may take any of a cylindrical, truncated conical or conical form.

In the apparatus of this embodiment, at least two tuning means are disposed on the coaxial line, one of which serves as an insertion length control means for the central conductor extending into the interior of the film-forming chamber.

Moreover, the band-shaped member is subjected to conduction treatment at the side which is exposed to the microwave plasma.

According to the present invention, the following advantages, features and effects can be obtained.

(1) While the band-shaped member which forms the side wall of the film-forming space is continuously moved or traveled, the microwave antenna means is arranged to extend into the film-forming space in juxtaposed relation to the width of the band-shaped member constituting the side wall of the film-forming space and a microwave energy is radiated from the microwave antenna means toward all directions vertical to the direction of movement of the microwave thereby initiating a plasma. By this, functional deposited films with a large area can be continuously and uniformly formed.

(2) Since the plasma is confined within the film-forming space, it is improved with respect to the stability and reproducibility along with a drastic improvement of the utilization efficiency of starting gases used to form the deposited film. The band-shaped member is continuously transferred while varying the curving length and the transfer speed, by which a deposited film having an arbitrary thickness can be continuously formed over a large area with good uniformity.

(3) Appropriate control of the plasma potential ensures continuous formation of functional deposited films of high quality having desired characteristics and a reduced number of defects in high efficiency at high yield.

According to the method and apparatus of the invention, the plasma is confined in the film-forming space and its potential is arbitrarily controlled, so that the plasma is improved in the stability and reproducibility with a drastic improvement in the utilization efficiency of starting gases for deposited film formation. Moreover, the continuous transfer of the band-shaped member at different curving lengths and at different transfer speeds ensures continuous formation of the deposited film with an arbitrary thickness and good uniformity over a large area.

(4) Functional deposited films can be continuously and uniformly on the surface of a relatively wide, elongated band-shaped member. Accordingly, the apparatus is particularly suitable for use as a mass production machine for solar cells with a large area.

(5) Since the deposited film can be continuously formed without stopping the discharge, good interfacial characteristics are obtained when layer-built devices are fabricated.

(6) The formation of the deposited film at low pressure is possible, so that generation of polysilane powder is suppressed and polymerization of active species is also suppressed, resulting in reduction in number of defects and improvements in the film characteristics and stability of the characteristics.

Accordingly, the operation efficiency and yield can be improved, making it possible to inexpensively mass produce solar cells of high efficiency.

(7) The solar cell obtained by the invention has a high photoelectric conversion efficiency and has a very reduced degree of deterioration of the characteristics over a long term.

EXPERIMENTS

The apparatus of the invention was used to conduct a series of experiments for investigating initiating conditions of microwave plasmas in order to uniformly form functional deposited film with high quality on band-shaped members.

EXPERIMENT 1

In this experiment, the inner diameter of a pillar-shaped or columnar film-forming space or chamber was varied to investigate the stability of plasma, and the distributions of film thickness and film quality.

More particularly, an apparatus set forth in Apparatus Example 1 described hereinafter was used wherein only the inner diameter of the film-forming chamber was changed to make five samples according to film-forming conditions indicated in Table 1. This experiment was carried out without moving a band-shaped member.

Table 2 shows the results of evaluation with respect to the state of the plasma at different inner diameters of the film-forming chamber.

With regard to the inner diameter of the film-forming chamber of 180 mm$\phi$ or 120 mm$\phi$ shown in Table 2, when a plasma was initiated under the same conditions as shown in Table 1 except that the microwave power was 2500 W, the discharge was stabilized for the inner diameter of 120 mm$\phi$. However, for the inner diameter of 180 mm$\phi$, the discharge was initiated but unstably and was found not to stand practical use.

Next, samples 2-1 to 2-4 were, respectively, subjected to evaluation of characteristics according to the evaluation methods described below.

The thickness of each deposited film was calculated from a peak position of a multiple interference fringe of a spectral reflectance curve measured by the use of the spectral reflectance measuring instrument, Model MCPD-200, available from Union Giken Co., Ltd. The measured portions of the respective samples were at equal distances of 50 mm along the directions of width (x) and length (y) of the substrate. Next, a Cr thin was vacuum deposited in about 70 angstroms on the a-Si:H film to form an ohmic electrode. In the dark, a voltage was applied between the ohmic electrode and the thin sheet (0.2 mm in thickness) of SUS430BA used as the band-shaped member to measure an electric current, from which a dark conductivity ($\sigma_d$) was determined. While applying a voltage in the same manner as stated above, a He-Ne laser beam was irradiated from the Cr electrode side and a photoconductivity ($\sigma_p$) was determined from the resultant current. Thus, the respective distributions of the characteristics were evaluated. Taking the absorption in the Cr electrode into account, the irradiation intensity of the He-Ne laser beams into the a-Si:H film was set at $4 \times 10^{15}$ photons/cm$^3$·second.

Figure 12A:
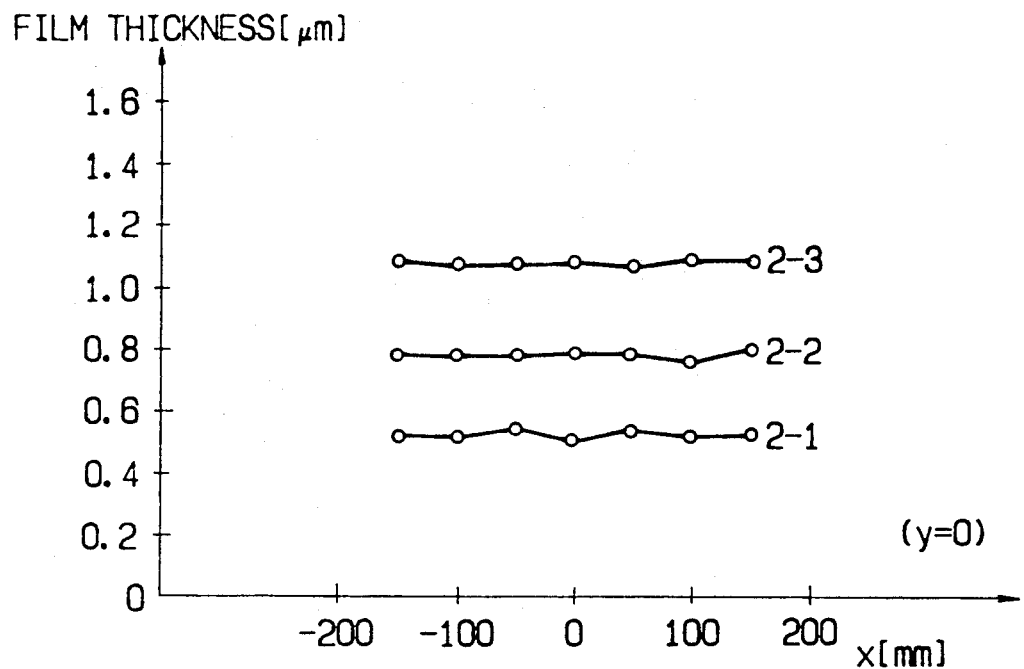
FIGS. 12(a) to 12(d) are, respectively, graphical representations of the results on film formation.
Figure 12B:
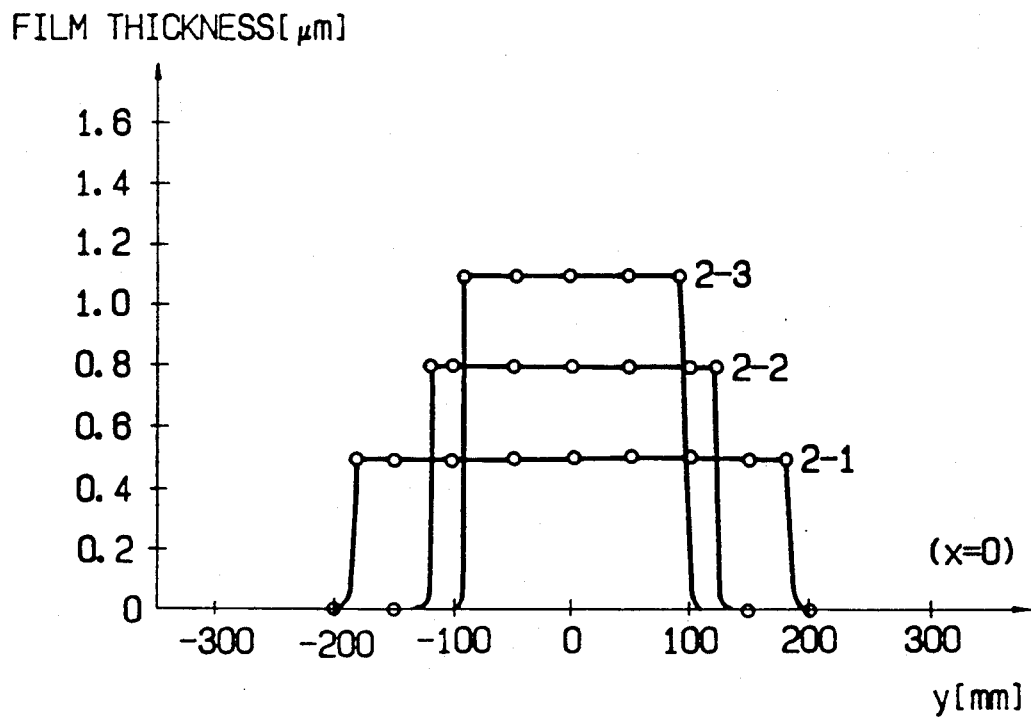
Figure 12C:
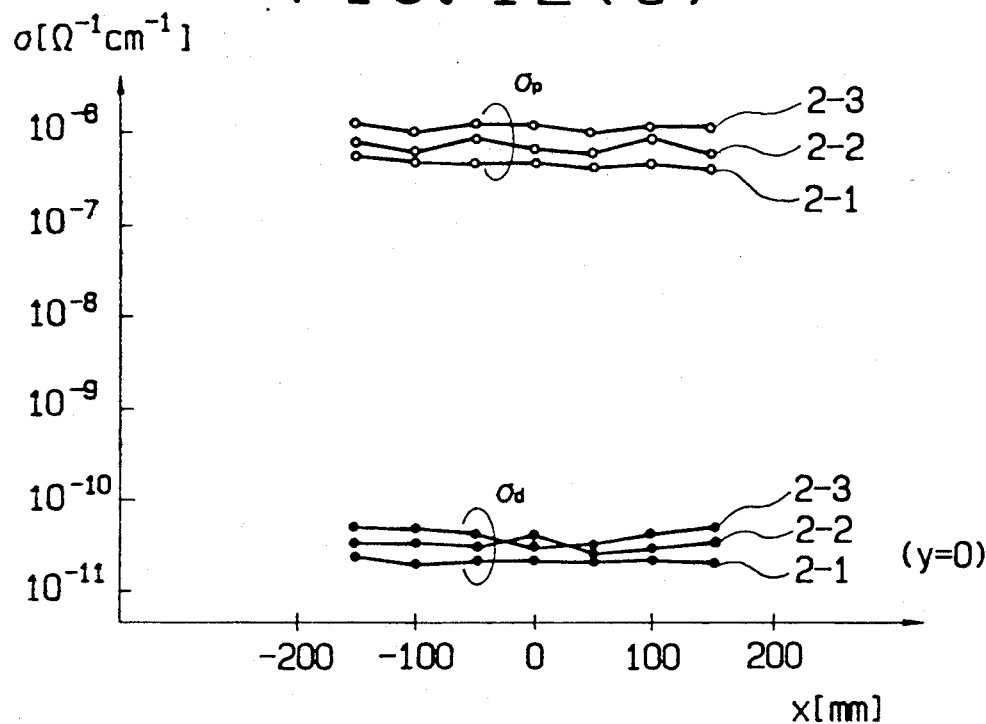
Figure 12D:
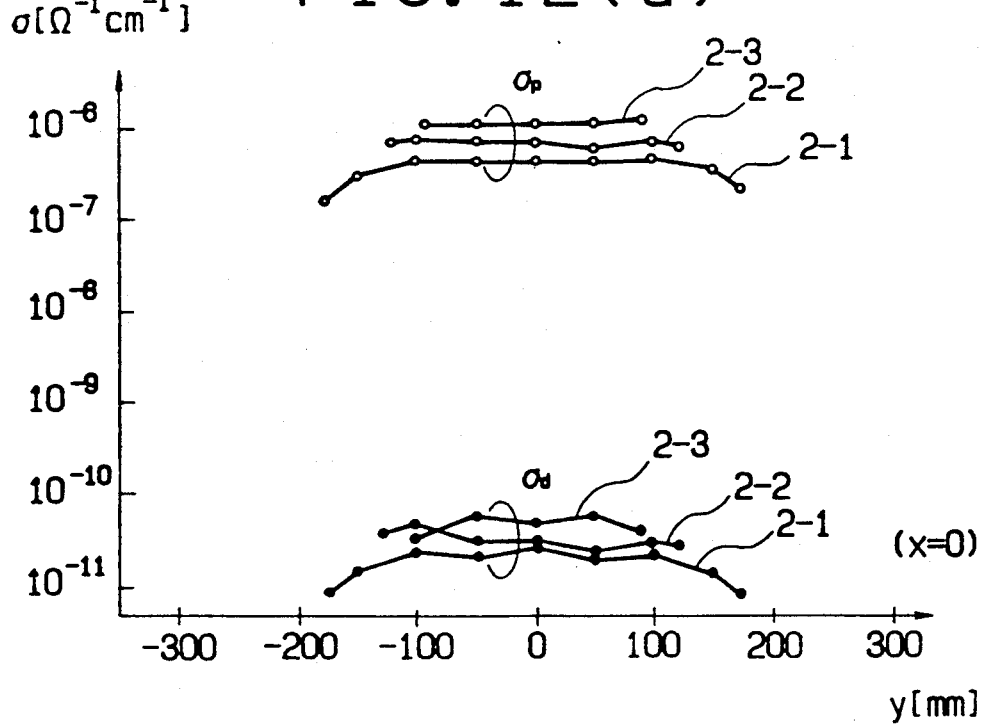

In FIG. 12(a), there are shown the results of the measurement on the distribution of the film thickness of the samples 2-1 to 2-3 along the direction of x and in FIG. 12(b), there are shown the results on the distribution of the film thickness along the direction of y. FIG. 12(c) shows the results on the distributions of $\sigma_d$ and $\sigma_p$ along the direction of x, and FIG. 12(d) shows the results on the distributions of $\sigma_d$ and $\sigma_p$ along the direction of y. It will be noted that x=0 indicates the center of the band-shaped member along the direction of width and y=0 indicates the center when the band-shaped member is developed along its length.

From these results of the measurements, the uniformity in both the film thickness and the film quality is good with respect to the direction of width of the band-shaped member and the deposited film thickness decreases with an increasing inner pressure in the film-forming chamber. With regard to the lengthwise direction of the band-shaped member, the uniformity is sustained but it is apparently recognized that the characteristic of the sample 2-1 deteriorates. More particularly, a larger inner diameter of the film-forming chamber leads to a greater tendency toward the worsening of the characteristic of the a-Si:H film.

It will be noted that since the sample 2-4 is very close to the coaxial line, the plasma density becomes significantly higher than those for the other samples. As a result, the substrate temperature exceeds 350° C. by which after the film formation, the film separates from the substrate and could not be evaluated.

EXPERIMENT 2

In this experiment, the apparatus of the invention shown in FIG. 1 (see Apparatus Example 1 described hereinafter) and the known RF glow discharge decomposition apparatus were used to form deposited films under conditions indicated in Table 3, followed by measurement of a degree of strain of the substrate prior to and after the formation of the deposited film to determine a variation of compression stress in the deposited film. The stainless steel used as the band-shaped member had a Young's modulus of $2.04 \times 10^4$ [kg/mm$^2$] and a linear expansion coefficient of $11.9 \times 10^{-6}$ [°C.$^{-1}$].

As a result, any separation of the deposited films was not recognized for the apparatus used in this experiment. The results of the measurement of the compression stress accumulated in the deposited film revealed that the compression stress was 32 kg/mm$^2$ for the known apparatus of FIG. 11 and 9 kg/mm$^2$ for the apparatus of the invention of FIG. 1. From this, it was found that the stress relaxation was made to an extent of approximately 1/3.5.

EXPERIMENT 3

In this experiment, a-Si:H films were deposited by the use of the apparatus of FIG. 1 for carrying out a procedure, wherein a pressure difference were made between the inner and outer sides of the film-forming space, under conditions shown in Table 3 except that the gap at an open portion of the slid was varied.

The results of the experiment and the evaluation are shown in Table 4.

In the table, the effective conductance, $E_{ef}$ [l/sec] was determined by converting the flow rate from [sccm] to [Torr·l/sec] and dividing it by a pressure differential, $\Delta P$ [Torr], between the inner and outer sides of the film-forming space.

The results of Table 4 reveals that in order to prevent leakage of the plasma, it is favorable to make a pressure differential between the inner and outer sides of the film-forming space prevent of not smaller than 9 mTorr.

EXPERIMENT 4

Figure 8A:
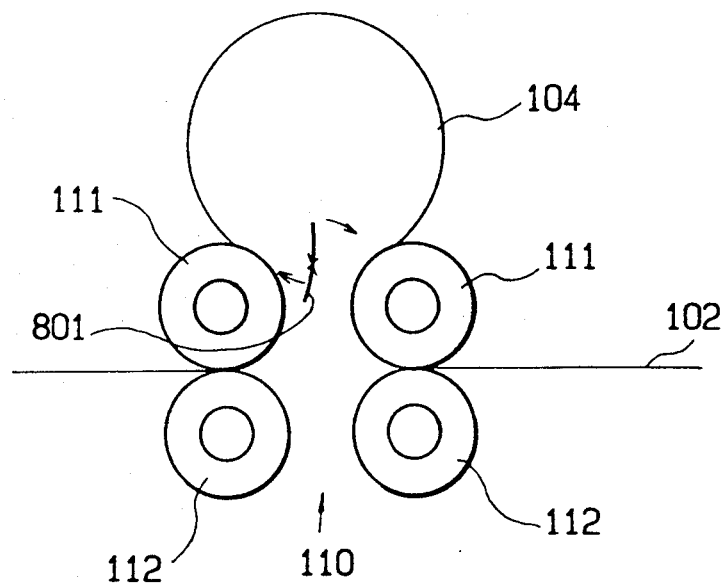
FIGS. 8(a) and 8(b) are, respectively, illustrative views for operation of an exhaust port of the film-forming chamber.

In this experiment, the apparatus of FIG. 1 was used for carrying out a procedure of suppressing anomalous discharge by keeping a low outer pressure of the film-forming space. Moreover, a vacuum exhaust port was provided with a throttle valve as shown in FIG. 8 and connected with an oil diffusion pump so that an effective exhaust speed could be varied. The discharge test was conducted under conditions indicated in Table 3 except that the pressure at the outside of the film-forming chamber was varied at different levels. The results are shown in Table 5.

From these results, it will be seen that when the pressure in the isolated container at the outside of the film-forming chamber was so increased that it became substantially equal to the pressure in the inside of the film-forming space, anomalous discharge or discharge concentration took place, thereby causing a film with poor adhesion to be deposited. Accordingly, it is preferred to keep the pressure of not less than 6 mTorr inn the outside of the film-forming space for preventing the lowering of film quality owing to the anomalous discharge.

EXPERIMENT 5

Figure 21A:
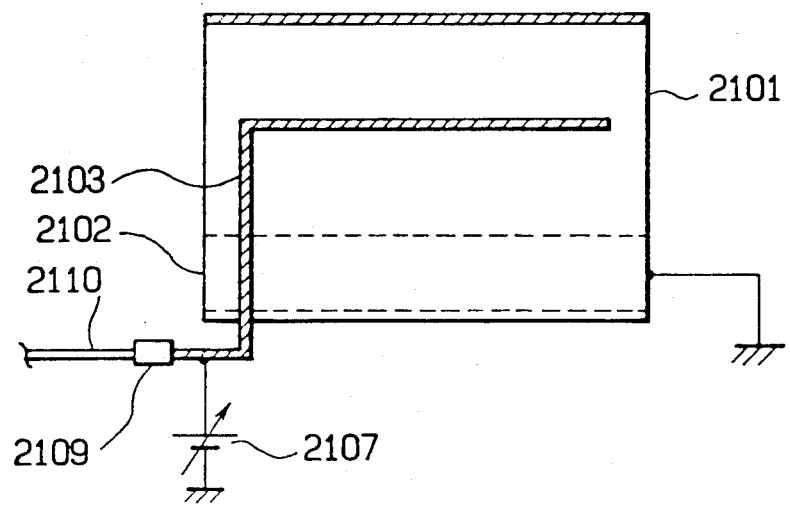
FIGS. 21(a) to 21(d) are schematic views showing a typical arrangement of a bias applicator means.

In this experiment, an apparatus shown in Apparatus Example 2 described hereinafter (FIG. 2) was used and provided with a bias applicator means having such an arrangement as shown in FIG. 21(a). The DC bias voltage applied to a nickel bias applicator tube 2103 serving also as a gas feed pipe was varied to determine the controllability of microwave plasma, and the influences on the plasma potential and the film quality.

The plasma was initiated under microwave plasma discharge conditions as shown in Table 1 except that the bias voltage was varied from $-300$ V to $+300$ V at intervals of 10 V. The inner diameter of the film-forming chamber was set at 80 mm$\phi$. The surface temperature of the band-shaped member was set at 250 C. and the transfer speed was 48 cm/minute.

The discharge was continued for 10 minutes after application of the respective bias voltages.

Figure 22:
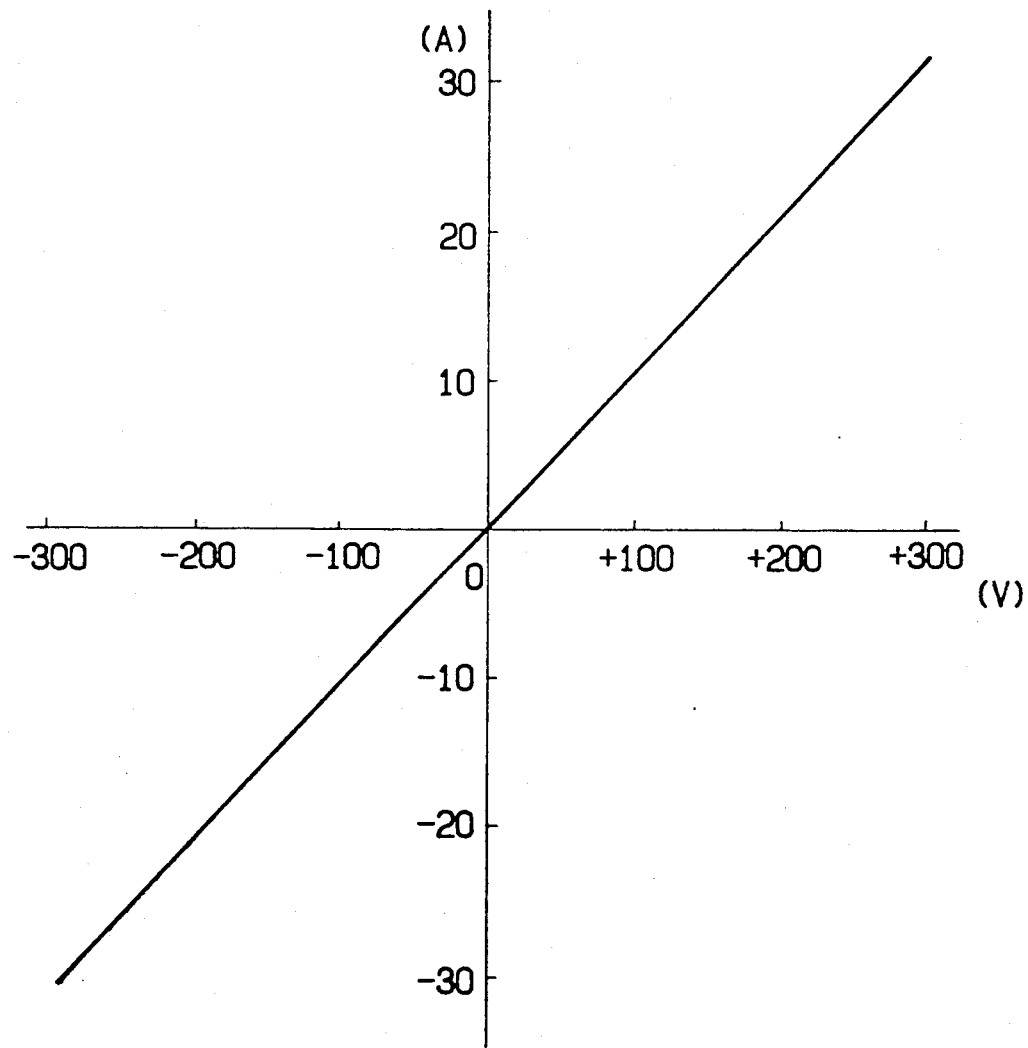
FIG. 22 is a current-voltage characteristic graph at the time of application of a bias voltage obtained in an experimental example of the invention.

FIG. 22 shows the results of a current-voltage characteristic between the bias applicator tube and the band-shaped member at the time of the application of the bias voltage wherein the X axis indicates a bias voltage and the Y axis indicates a bias current.

Figure 23:
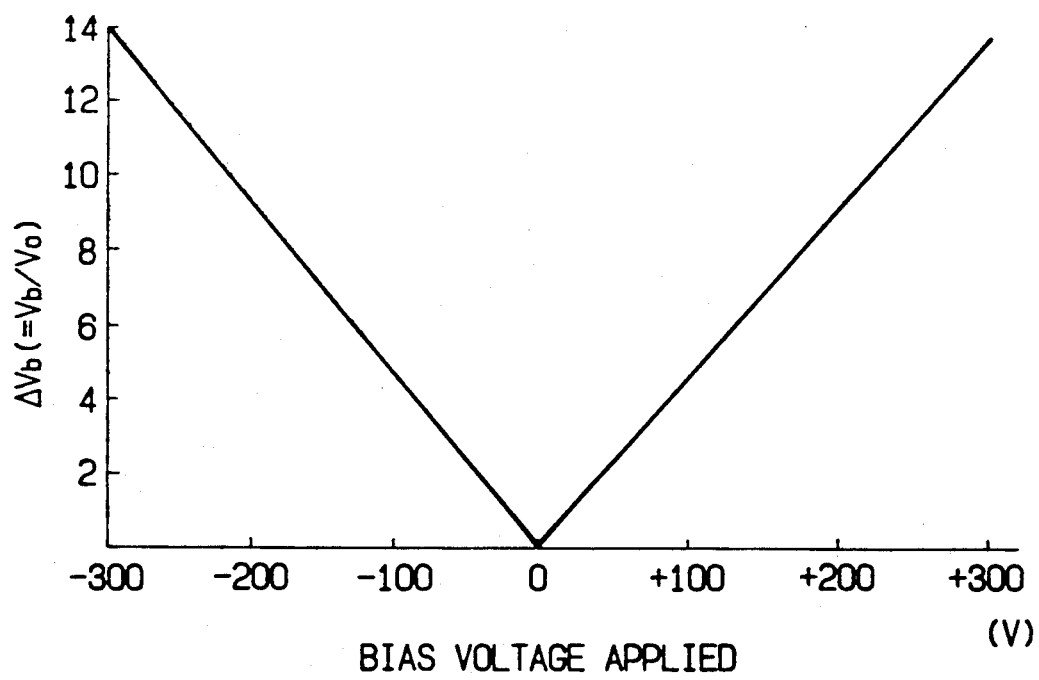
FIG. 23 is a graphical representation of the variation rate of a plasma potential in relation to the variation of a bias voltage obtained in an experimental example of the invention.

Simultaneously, according to a probe method using a single probe of a tungsten wire having a diameter of 0.3 mm and a length of 3 mm (exposed portion), plasma potential, $V_b$, at the time of the biasing was measured to determine a variation ratio, $\Delta V_b (=V_b/V_o)$, to a plasma potential $V_o$ determined without application of any bias voltage. The results are shown in FIG. 23. It will be noted that the single probe was provided substantially at a center of the curved portion of the band-shaped member and at a distance of approximately 5 cm from the inner surface.

These results revealed that although depending on the types and flow rate of starting gases for discharge, a bias voltage ranging from $-190$ V to $+190$ V would probably lead to occurrence of th anomalous discharge, such as sparking, in the film-forming chamber, resulting in a difficulty in maintaining a stable discharge state.

However, it was found that as the bias voltage was increased under constant discharging conditions of the microwave plasma, the current-voltage characteristic was substantially in the linear relation with an increasing tendency. In addition, the plasma potential was likely to increase with an increasing bias voltage. More particularly, the plasma potential could be readily, stably and reproducibly controlled by appropriate control of the bias voltage.

Subsequently, the films deposited on the SUS430BA thin sheet used as the band-shaped member were cut off into sample pieces with a size of 5 mm×5 mm. The surface state of the pieces was observed through ultrahigh resolving power, low acceleration FE-SEM (Model S-900, available from Hitachi Ltd.), revealing that the surface roughness of approximately several hundred angstroms to several thousand angstroms was found at a bias voltage ranging from −300 V to +10 V, but in the range of from +10 V to +170 V, there was a substantial tendency of the film surface to smooth as the bias voltage increased. In the range exceeding +170 V, the film surface again became roughened and especially, over +190 V at which the anomalous discharge frequently took place, pinholes were found to occur in the sample surface.

It was found that under constant conditions of the microwave power, when a flow ratio of a starting gas, such as SiH$_4$, having a large sectional area of ionization increased, the gradient of the current-voltage characteristic increased. On the other hand, an increase in the flow ratio of a starting gas, such as H$_2$, having a small sectional area of ionization resulted in a decreasing gradient of the current-voltage characteristic.

COMPARATIVE EXPERIMENT 1

The general procedure of Experiment 5 was repeated except that the bias applicator tube 2103 serving as the gas feed pipe was made of aluminium instead of nickel, thereby measuring the current-voltage characteristic. When the bias voltage was increased from 0 V to +55 V, the bias applicator tube 2103 started to deform and was finally melted down. A similar measurement was repeated using copper and brass bias applicator tubes 2103, with the result that a similar phenomenon was recognized to occur. Moreover, the above procedure was repeated using bias applicator tubes 2103 made of high melting metals such as stainless steel, titanium, vanadium, niobium, tantalum, molybdenum and tungsten and an alumina ceramic tube whose surface was subjected to nickel flame spray coating in a thickness of 800 μm. As a result, it was found that with the stainless steel tube, deformation was recognized at a bias voltage exceeding +115 V and the tube was finally melted down. With the tubes made of the other materials, similar measuring results as obtained in Experiment 5 were obtained without any phenomenon such as of deformation.

COMPARATIVE EXAMPLE 2

The general procedure of Experiment 5 was repeated for measuring the current-voltage characteristic except that the SUS430BA thin sheet used as the band-shaped member was replaced by a PET (polyethylene terephthalate) sheet (thickness 0.8 mm). When the bias voltage was applied either positively or negatively, the resultant current had substantially the same values as obtained in Experiment 5, but the voltage at which the anomalous discharge started in the film-forming chamber was approximately −95 V or 95 V. Visual observation revealed that sparks took place between the bias applicator tube and the support and transfer rollers for the band-shaped member. The sparks were found to result from the fact that the band-shaped member was insulating in nature and exhibited a charge-up phenomenon, so that an excess current was passed to the support and transfer rollers constituted of only one conductive material other than the bias applicator tube in the film-forming chamber.

The surface state of the deposited film was observed and evaluated in the same manner as in Experiment 6, demonstrating that the film surface was roughened at several hundred angstroms to several thousand angstroms irrespective of the bias voltage.

COMPARATIVE EXPERIMENT 3

Figure 6:
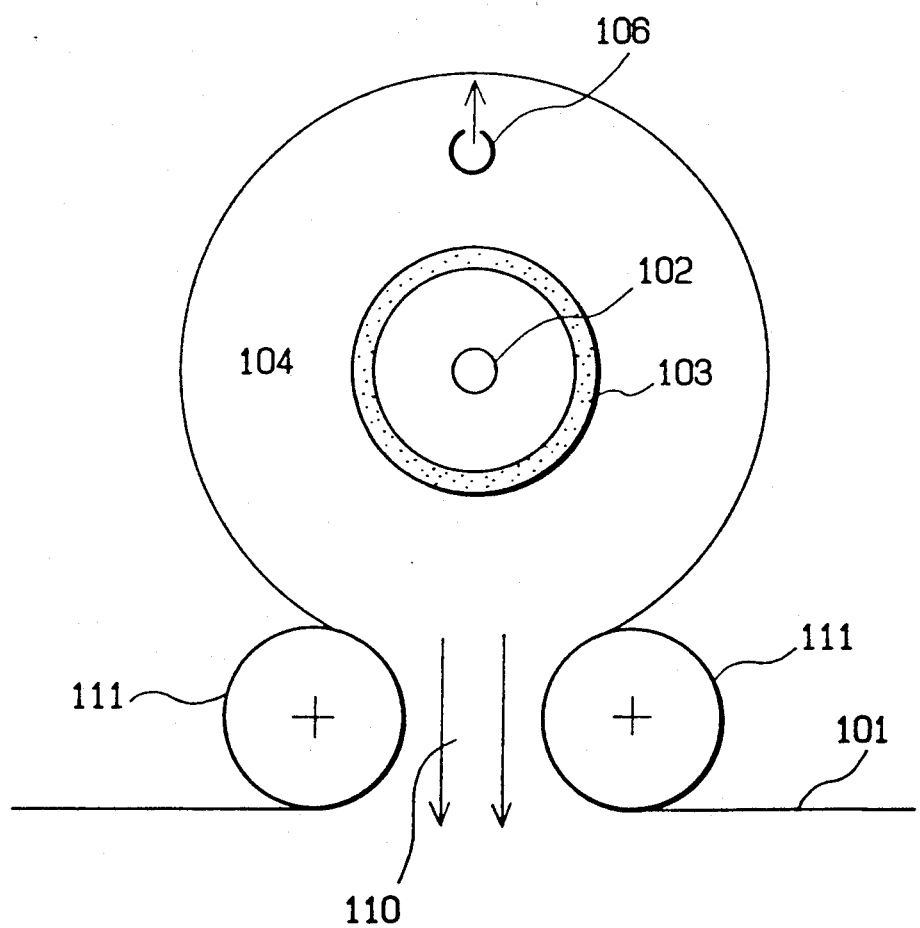
FIG. 6 is a sectional view taken along the line A—A' of FIG. 5.

The general procedure of Experiment 5 was repeated for measurement of the current-voltage characteristic except that the position of the bias applicator tube 2103 serving also as the gas feed pipe was changed from an almost upper portion of the central axis of film-forming chamber (position, O, in FIG. 6) to portions shifted to directions of 45°, 90° and 135° along the curved surface of the band-shaped member shown in FIG. 6. It will be noted that the measurement was also made when the position was shifted by 100 mm toward the OH' direction over the central axis.

As a result, the same results as in Experiment 5 were obtained when shifted toward the directions of 45°, 90° and 135°. On the other hand, with the case of the shiftings by 100 mm and 120 mm toward the OH' direction, any starting gas was sufficiently fed into the film-forming chamber, so that the plasma was not stably initiated and little bias current was passed by application of the bias voltage, making it difficult to control the plasma potential.

EXPERIMENT 6

In this experiment, the apparatus having such an arrangement as used in Experiment 5 was used wherein bias voltages with different waveforms and frequencies indicated in Table 6 were applied to the bias applicator tube 2103 to determine the controllability of the microwave plasma and the influences on the plasma potential and the film quality. The microwave plasma discharging conditions were similar to those of Experiment 5.

The bias voltages were those wherein different waveform outputs generated by a function generator (HP8116A, available from Hewlette-Packard Co., Ltd.) were amplified by a precise power amplifier (4500 Series and ordered articles, available from N. F. Circuit Block Co., Ltd.) and those which were outputted by rectifier circuit devices made by us. Those voltages were applied to the bias applicator tube 2103 through a coaxial cable.

The controllability of the plasma potential was evaluated from the discharging state, the variation rate of the plasma potential and the observation of the film surface. The results are shown in Table 6. From these results, it was found that the effect of the application of the bias voltage over a relatively wide frequency range was recognized.

When the maximum amplitude voltage was widely changed at a constant frequency for the bias voltage, a similar tendency as in Experiment 5 was recognized, i.e. a similar tendency as obtained by changing the DC voltage was found. Especially, an increase of the maximum amplitude voltage entailed an increase in the frequency of occurrence of anomalous discharges such as sparks.

These results revealed that in case where various bias voltages other than DC voltage were applied to the bias applicator tube, the plasma potential could be readily, stably and reproducibly controlled by changing the bias voltage.

EXPERIMENT 7

Figure 21B:
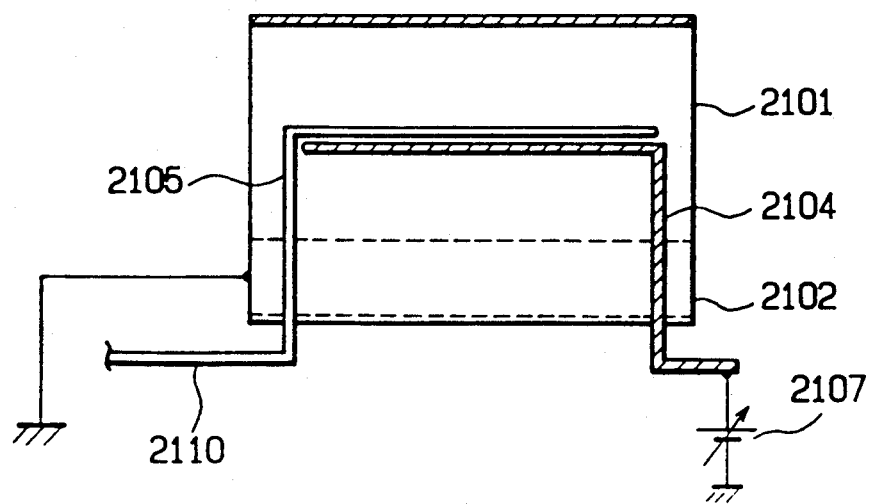

In this experiment, the current-voltage characteristic was measured under the same conditions as in Experiment 5 except that the bias applicator means was arranged as shown in FIG. 21(b).

Similar results as in Experiment 5 were obtained. It was found that when the gas feed pipe 2105 and the bias bar were separately provided, the change of the bias voltage would ensure easy, stable and reproducible control of the plasma potential.

EXPERIMENT 8

Figure 21C:
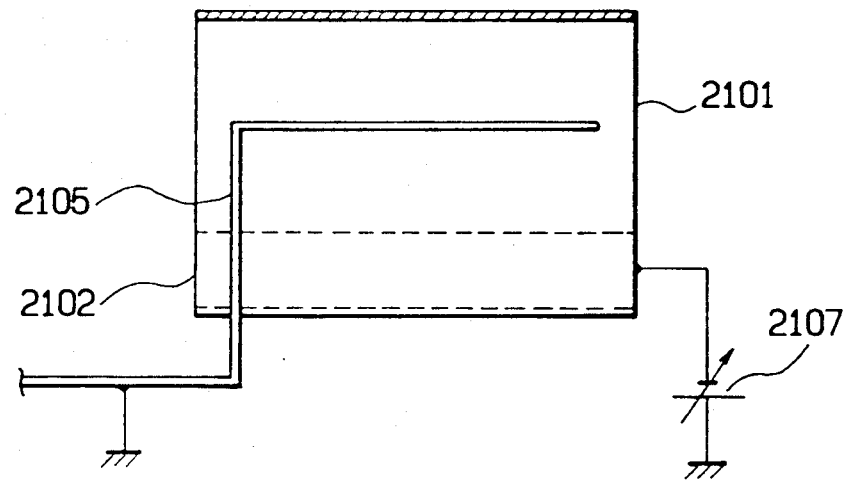

In this experiment, the current-voltage characteristic was measured under the same conditions as in Experiment 5 except that the bias applicator means was arranged as shown in FIG. 21(c).

Similar results as in Experiment 5 were obtained except that the initiating voltage for the anomalous discharges such as sparks was slightly changed whereupon the anomalous discharge took place at the contact portions between the support and transfer rings and the band-shaped member in the film-forming member. The bias voltage at which the film surface was smoothed was reversed in polarity as in Experiment 5 and was in the range of $-10$ V to $-170$ V. As a matter of course, the plasma was stable within the above voltage range.

Accordingly, it was found that when the bias voltage was applied to the band-shaped member and the earth bar 2105 serving also as the gas feed pipe was disposed in the film-forming chamber, the plasma potential could be controlled readily, stably and reproducibly.

EXPERIMENT 9

Figure 21D:
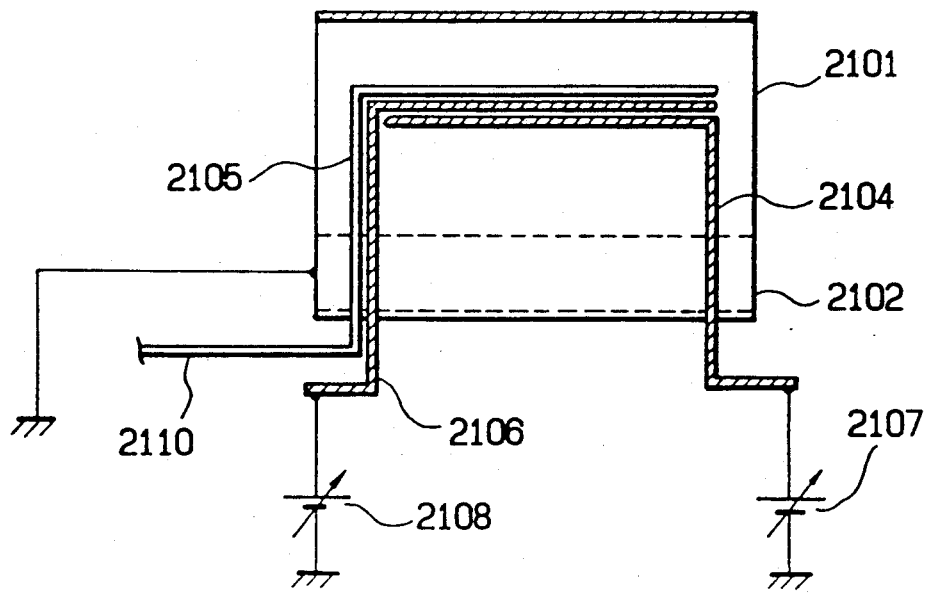

In this experiment, while the bias applicator means was arranged as shown in FIG. 21(d), a DC bias voltage was applied to the bias bar 2104 under the same conditions as in Experiment 7 and a voltage which was $\frac{1}{4}$ times the DC voltage applied to the bias bar 2104 was separately applied to the bias bar 2106, the controllability of the microwave plasma and the influences on the plasma potential and the film quality were checked. The microwave plasma discharging conditions were similar to those used in Experiment 5.

Similar results as in Experiment 5 were obtained except that the frequency of occurrence of anomalous discharges such as sparks was reduced and the stability of the plasma was improved.

When a plurality of bias bars were provided in the film-forming chamber and separately applied with bias voltages, the plasma potential could be controlled readily, stably and reproducibly.

EXPERIMENT 10

In this experiment, while the bias voltage applied to the bias bar 2104 as in Experiment 9 was changed to DC voltages using different waveforms and frequencies, the controllability of the microwave plasma and the influences on the plasma potential and the film quality were checked. The microwave plasma discharging conditions were similar to those used in Experiment 5.

Similar results as in Experiment 5 were obtained except that the frequency of occurrence of anomalous discharges such as sparks was reduced and the initiating voltage for the anomalous discharges was slightly lowered with an improved stability of the plasma.

When a plurality of bias bars were provided in the film-forming chamber and separately applied with bias voltages, the plasma potential could be controlled readily, stably and reproducibly.

EXPERIMENTS 11 AND 12

In Experiments 11 and 12, a test of applying bias voltages as carried out in Experiment 6 was made, with the result that similar results as obtained in Experiments 8 and 9 were obtained.

SUMMARY OF THE RESULTS OF THE EXPERIMENTS

In the method and apparatus of the invention, the stability and uniformity of the microwave plasma depend on complicated combinations of various parameters such as, for example, the type and shape of microwave applicator, the pressure in the film-forming chamber at the time of film formation, the microwave power, the degree of confinement of the microwave plasma, and the volume and shape of the discharge space. It is difficult to determine optimum conditions from a single parameter. In this connection, the results of the above experiments reveal the following tendencies and ranges of several parameters.

In the method of the invention, the inner diameter of the film-forming space should preferably be in the range of from 60 mm $\phi$ to 120 mm $\phi$. When a deposited film is formed on a concave side of the curved surface of the band-shaped member which has been heated to a desired temperature and cylindrically curved and is subsequently cooled after development into a flat sheet, the stress accumulated in the deposited film can be relaxed.

When the gap or opening width of the slit is varied so that the pressure differential between the inside and outside of the film-forming space is not less than 9 mTorr, the leakage of the plasma from the film-forming space can be prevented. It has also been found that when the pressure at the outside of the film-forming space is not larger than 6 mTorr, the lowering in quality of the deposited film owing to the anomalous discharge can be prevented.

Moreover, in the method and apparatus of the invention, for the control of the plasma potential of the microwave plasma, it is preferred that the bias voltage applicator means or bias applicator means is provided in the film-forming chamber, wherein the plasma is confined, and is applied with various DC bias voltages or pulsating or AC bias voltages of various waveforms, frequencies and maximum amplitude voltages. The bias voltage applicator means may serve also as a gas feed means or may be a bias bar which is provided separately from the gas feed tube. It has also been found that when a bias voltage is applied to the band-shaped member, the plasma potential can be similarly controlled. Where the bias voltage is a DC voltage, it is preferable that the voltage should be in the range of from $+10$ V to $+200$ V in order to improve the film characteristics.

Based on the facts ascertained according to the aforedescribed experiments, the method and apparatus of the invention are described in more detail.

The features of the method of the invention which are objectively distinguishable from known deposited film formation methods reside in that the film-forming space is in the form of a column and its side wall is continuously moved while functioning as a structural material and acts as a support for deposited film formation.

The function are the structural material is such as to physically and chemically isolate an atmospheric space for film formation, i.e. the film-forming space, from an atmospheric space taking no part in the film formation.

More particularly, the function is intended to to form an atmosphere which is different in gas composition and its state, to limit the direction of a gas being flown or to form an atmosphere having a different pressure differential.

It is thus possible to curve the band-shaped member thereby forming a side wall of the pillar-shaped film-forming space, supplying a starting gas for the formation of deposited film and microwave power or energy into the film-forming space from one of opposite end faces of the side wall, and exhausting the space from a gap left at part of the side wall thereby confining a plasma in the film-forming space, so that a functional deposited film is formed on the band-shaped member provided as the side wall. The band-shaped member performs an important function as a structural material for separation of the film-forming space from the outer atmospheric space which does not take part in the film formation and may also be used as a support for the formation of the deposited film.

Accordingly, the atmosphere at the outside of the film-forming space established by the side wall made of the band-shaped member is completely different from the film-forming space with respect to the gas composition and its state, the pressure and the like.

On the other hand, in the known deposited film formation methods, a support on which a deposited film is to be formed is disposed within a film-forming space wherein the deposited film is formed, and functions only as a member on which a precursor for the deposited film produced in the film-forming space is deposited. Unlike the method of the invention, the support does not act as a structural material constituting the film-forming space.

In the known RF plasma CVD method and sputtering method, the support on which the deposited film is formed may also be used as an electrode for initiating and sustaining the discharge but is not satisfactory for confining the plasma and also for isolation from an outer atmospheric space which does not take part in the film formation. Thus, such a support cannot function as a structural material.

In short, the method of the invention makes use of a band-shaped member, which is capable of functioning as a support for forming a functional deposited film thereon, as a side wall for the film-forming space, so that the member shows the function as the structural material, with the possibility that the functional deposited film can be continuously formed on the band-shaped member.

The results of the experiments conducted by us reveal that in any commercially available plasma CVD apparatus using either RF or microwave, the yield of the deposited film from starting gases which are deposited on a substrate in the film-forming chamber to give a deposited film which can stand practical use is, at most, approximately 15%. Thus, the recovery rate as the deposited film is very low.

We made extensive studies on the assumption that such a low recovery rate would depend greatly on the configuration and structure of the film-forming space. As a result, it was found that when the surrounding wall for the film-forming space was constituted of a substrate and a deposited film was formed on the inner surface of the surrounding wall, the recovery rate was significantly improved. As stated before, the band-shaped member is used as a substrate and is continuously moved or traveled so that the the side wall of the film-forming chamber is established by the use of the band-shaped member. A gap or space is provided at part of the side wall, from which the film-forming chamber is exhausted. The configuration of the film-forming chamber should preferably be in a pillar-shaped form, more preferably in the form of a cylinder or column. In order to improve the recovery rate as the deposited film, it is preferred to increase a ratio of the area of a side wall portion constituted of the band-shaped member to the total area of the walls forming the film-forming space. A specific form of the columnar film-forming space formed of the band-shaped member should preferably have a ratio of the length of the side wall (i.e. the width of the band-shaped member) to the inner diameter of opposite end faces which is as large as possible. By this, it is possible to form a desired functional deposited film on the inner surface of the side wall at a high recovery rate.

In the method of the invention, in order to avoid the separation of the deposited film from the substrate by the influences of the temperature difference with the film-forming temperature and the humidity when the deposited film formed on the substrate is taken out in air, the method of the invention should preferably be conducted according to the following procedure. The band-shaped member is curved substantially in a columnar or pillar-shaped form and is preliminarily applied with mechanical compression stress. Subsequently, a deposited film is formed on a concave side of the curved surface of the columnarly curved band-shaped member at a desired temperature and then, the thus formed band-shaped member is developed as flat or is so developed that the side on which the deposited film has been formed is curved convexly. In this condition, while the preliminarily applied mechanical compression stress is converted into a mechanical tensile stress, the substrate is gradually cooled down to room temperature, during which the thermal compression stress caused by the difference in expansion coefficient between the band-shaped member and the deposited film is relaxed by the mechanical tensile stress.

When the material used as the band-shaped member has a linear expansion coefficient that that of the deposited film, the above stress relaxation procedure becomes possible.

In order to avoid the separation of the deposited film, usual practice is to increase the adhesion force between the substrate and the deposited film. This practice is limited only to the substrate whose strength is higher than a certain level. If relatively soft or flexible materials such as polyimide and PET (polyethylene terephthalate) are used as the substrate, the above-described practice is always not satisfactory because of the formation of wrinkles on the substrate. Accordingly, in addition to the improved adhesion force, the stress relaxation is an important factor for the avoidance.

Especially, with solar cell devices fabricated by building up a plurality of deposited films, the compression stress may be increased by the build-up of the deposited films. In this sense, the above procedure of the invention is important.

In the method of the invention, for efficiently initiating and sustaining a plasma, an outer diameter of the microwave transmitting member is preliminarily so controlled and selected that while the impedance of a microwave depends on the complex dielectric constant of a plasma, the inner diameter of an equivalent outer conductor of the coaxial line including the plasma in the inside of the film-forming space becomes equal to an inner diameter of the outer conductor of the coaxial line at the outside of the film-forming space.

The term "equivalent" is used herein is for the following reason. As a result of a discharge test, it has been found that the inner diameter of the outer conductor including the plasma varies depending on the type and flow rate of starting gas, the pressure of the film-forming chamber, the microwave power and the like conditions, thus influencing not only the real number portion of the dielectric constant of the plasma, but also the imaginary portion, i.e. absorptivity to cause a phase inversion. Thus, the value of the outer diameter is theoretically difficult to estimate. Accordingly, the inner diameter of the outer conductor formed by the plasma should be experimentally confirmed as will be described hereinafter.

In known microwave apparatus having a mismatch of impedance or having an intense reflection surface, a reflected wave which has the same intensity as a reflected wave generated at the reflection surface and is inverted in the phase as the second-mentioned reflected wave is generated by a tuner. These two reflected waves are offset by interference, thereby having the impedance matched. Where the reflected waves are apparently offset for matching, a great stationary wave is generated between the reflection surface and the tuner, resulting frequently in a great loss of the Joule heat.

In order to remove the loss of the Joule heat, the distance between the reflection surface and the tuner comes as close as possible and should preferably be zero. In the microwave antenna means used in the present invention, the dielectric constants of both the inside and outside of the film-forming chambers are both a value of 1 prior to commencement of discharge, and the inner diameter of the outer conductor of the coaxial line is larger in the inside. Accordingly, it is difficult to match the impedance at the boundary of the film-forming chamber. In a condition after commencement of the discharge, the inside of the film-forming chamber is filled with a plasma whose dielectric constant is less than 1, and the equivalent inner diameter becomes smaller. If the outer diameter of the microwave transmitting member is properly selected, the inner diameters of the outer conductors of the coaxial line at the inside and outside of the film-forming chamber will coincide with each other, thus bringing about a matchable situation. Thus, it becomes possible to match the impedance in the state after the discharge.

In the method of the invention, in order that the deposited film is formed only within the film-forming space established by the band-shaped member, the gas composition and its state at the outside of the film-forming space should be set under conditions different from those at the inside of the film-forming space. For instance, the gas composition at the outside of the film-forming space may be a gas atmosphere which does not directly take part in the formation of the deposited film, or may be an atmosphere containing the starting gas discharged from the film-forming space. Although it is a matter of course that the plasma is confined within the film-forming space, it is advantageous from the standpoint of improving the stability and reproducibility of the plasma and preventing the film from being deposited on unnecessary portions that the plasma and microwave are inhibited from leakage to outside of the film-forming space and anomalous discharge is suppressed.

Figure 2:
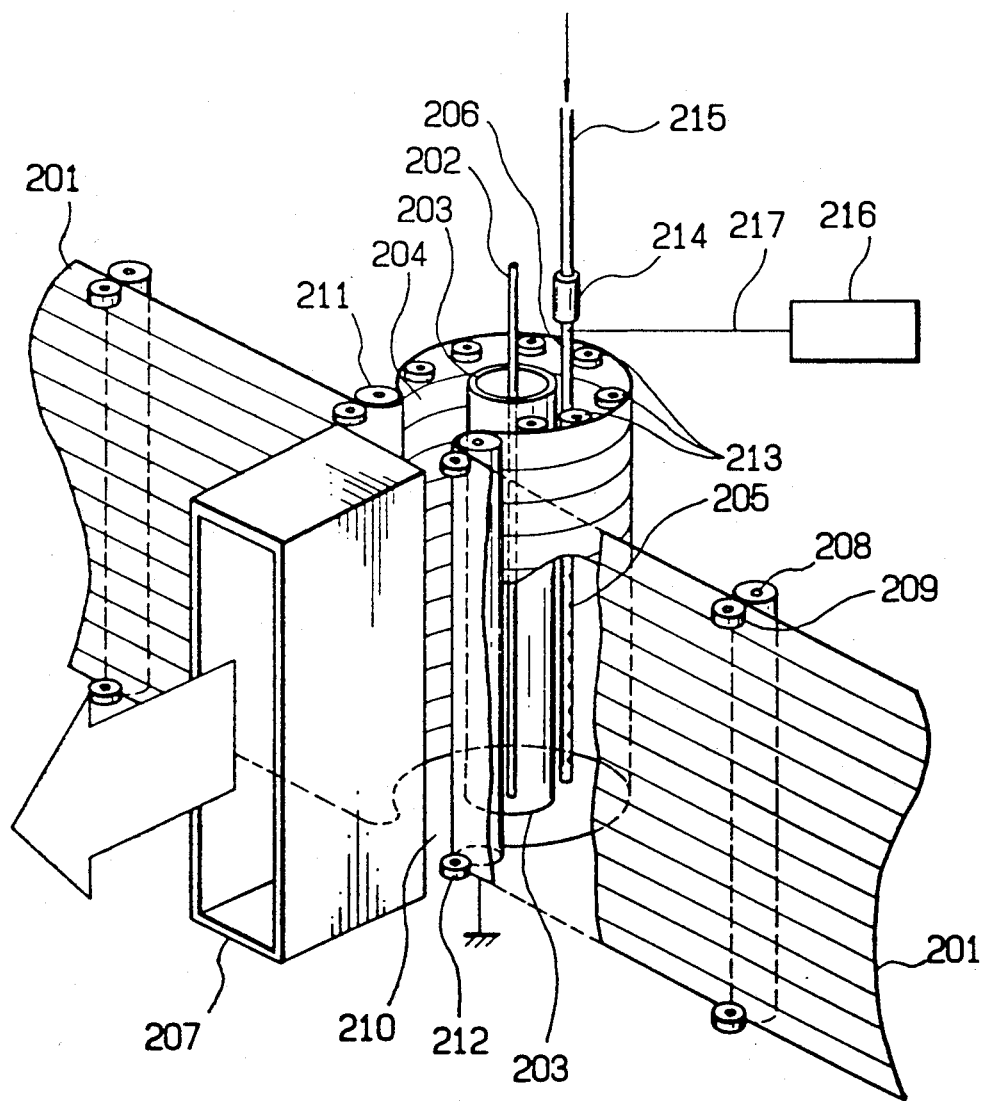
Figure 8B:
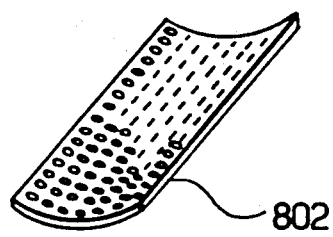

With the apparatus shown in FIGS. 1 and 2, the microwave power of the TEM mode is supplied, so that the leakage of the microwave is automatically suppressed for the mode when the width of the opening is narrow. If, however, the width of the opening reaches approximately half the wavelength of the microwave, it is necessary to provide a leakage preventing means for the microwave. More particularly, the gap formed along the length of the band-shaped member should be provided with a conductive punched board, as shown in FIG. 8(b), having through-holes with a size which is approximately 1/20 times the wavelength of the microwave.

In the method of the invention, although the anomalous discharge may be suppressed or inhibited by maintaining the pressure at the outside of the film-forming space at 6 mTorr or below, passage of a gas having a small ionization sectional area (He, $H_2$ or the like) to the outside of the film-forming space will bring about similar results. Needless to say, while the pressure at the outside of the film-forming space is kept at a level of not higher than 6 mTorr, the gas having a small ionization sectional area may be simultaneously passed.

When the plasma is confined within the film-forming space and the anomalous discharge at the outside of the film-forming space is suppressed according to the invention, the recovery rate of starting gases can be improved and the film-forming speed can be remarkably increased, ensuring mass production of solar cells on an industrial scale.

In order to form a deposited film with uniform thickness and quality over a large area according to the method of the invention, the microwave antenna means is extended into the film-forming space in parallel to the band-shaped member of which the side wall of the film-forming space is formed. The microwave power or energy is supplied to the film-forming space through the microwave antenna means, such as a coaxial line or a rigitano coil, capable of radiating a microwave in all directions vertical to the direction of movement of the microwave, thereby initiating a plasma. In order to continue the discharge wherein a constant plasma density is sustained over a long term, the microwave antenna means should be surrounded with the microwave transmitting member to completely separate the means from the plasma.

It is preferred that the microwave antenna means should be juxtaposed to the band-shaped member so that the they are in a relatively short spaced relation with each other and that the spacing between the microwave antenna means and the band-shaped member should be substantially equal along the lengthwise direction of the antenna. By this, the antenna means is so disposed that the microwave power can be substantially uniformly or supplied or discharged along the width of the side wall made of the band-shaped member, thus making a uniform distribution of the plasma density.

Especially, with the coaxial line or cable whose central conductor is separated from the plasma by means of the microwave transmitting member, when the microwave power discharged into the film-forming space through the coaxial line is increased, there appears a threshold value at which there is saturated the microwave power absorbed into a plasma, depending on the type of gas and the flow rate of the gas which is introduced into the inside of the film-forming space where it is converted into a plasma by application of the microwave power. Accordingly, greater microwave power which is discharged into the inside of the film-forming space results in a wider saturation range of the absorbed power. The power corresponding to the threshold value at which the absorbed power is saturated is discharged into the inside of the film-forming space from the respective portions along the length of the antenna. This entails uniformity of the plasma density, thus leading to uniformity in the film thickness and quality over a large area.

However, the discharge of such a great microwave power into the film-forming space sometimes causes the electric characteristics of the deposited film to be worsened, the microwave transmitting member to be generated with heat in the inside thereof or the microwave transmitting member to be broken due to the heat rise produced by exposure to the plasma. This may place limitations on the microwave power dischargeable into the inside of the film-forming space.

Because of the limitation of the microwave power discharged into the film-forming space, any saturation of the absorbed power does not take place, thus not leading to uniformity of the plasma density. More particularly, the microwave power discharged into the inside of the film-forming space from the antenna means disposed in the space gradually decreases along the direction of movement of the microwave, resulting in a non-uniform, spacial distribution of the plasma density.

In order to from a deposited film with uniform thickness and quality over a large area while overcoming the disadvantages stated above, it is necessary to compensate the gradual decrease, along the direction of movement of the microwave, of the microwave powder discharged into the inside of the film-forming space. To this end, a microwave transmitting member of a truncated conical or conical form is provided so that the distance between the band-shaped substrate and the microwave antenna means becomes converged along the direction of movement of the microwave.

As stated above, according to the method of the invention, it is possible to form a deposited film with uniform thickness and quality over a large area irrespective of the magnitude of the microwave power.

The inner wall surface of the film-forming space should preferably have conductivity necessary for permitting a bias current with a desired current density to be passed. For this purpose, the band-shaped member should preferably be made of a conductive material. Alternatively, at least a side facing to the film-forming space should be subjected to conduction treatment.

In the method of the invention, the potential of the microwave plasma should preferably be controlled by providing the bias applicator means so that at least a part of the means contacts the plasma initiated in the film-forming space. The bias applicator means may serve also as a gas feed means for seeding starting gases into the film-forming space. Alternatively, the bias applicator means may be made of a single bias bar or a plurality of bias bars provided separately from the gas feed means.

In the former case, a bias voltage is applied through the gas feed means to a so-called gas feed system including a bomb for starting gas, a flow rate controller and pipes. For preventing the occurrence of troubles such as electric shocks or breakage of the controller, the gas feed system and the gas feed means to which the bias voltage is applied should preferably be insulatively separated from each other on the way of these systems. The position where the insulative separation is made should preferably be close to the film-forming space.

The at least a part of the bias applicator means serving also as the gas feed means should preferably be subjected to conduction treatment so that the bias voltage can be applied thereto. In this connection, however, care should be taken to choose materials which do not suffer deformation, breakage and melting-down when applied with the heat of the plasma. More particularly, it is preferred to use high melting metals or high melting ceramics coated with high melting metals.

The position where the bias applicator means serving also as the gas feed means is provided at the film-forming space is not critical unless it is not contacted with the microwave plasma. This is because the microwave plasma acts substantially uniformly as a conductor. In order to suppress the occurrence of anomalous discharge, it is preferred to dispose the applicator means at a distance of not smaller than 10 mm, more preferably not smaller than 20 mm, from the inner surface of the band-shaped member.

In the latter case, on the other hand, care should also be taken with respect to the type of material for the bias bar and the position where the bar is provided, like the case wherein the bias applicator means is also used as the gas feed means. The gas feed means should preferably be constituted of dielectric materials so as to suppress the anomalous discharge and to form a uniform plasma potential within the film-forming space. If, however, the bias voltage is relatively low, the material is not critical.

If a single bias bar is used or the bias applicator means used also as th gas feed means is single in number, DC, pulsating and AC voltages are applied as the bias voltage singly or after superposition. On the contrary, when a plurality of bias bars are used, DC voltages at the same potential or different potentials may be applied to the respective bars. Alternatively, DC, pulsating and AC voltages may be applied singly or after superposition. The application of a plurality of bias voltages not only will extend a range of controlling the plasma potential, but also will contribute to the stability and reproducibility of the plasma, an improvement of film characteristics and suppression of occurrence of defects.

The alternating voltage should preferably have waveforms such as a sine waveform, a rectangular waveform, a triangular waveform, a pulse waveform and superposed waveforms thereof. The pulsating voltages should preferably have half-wave rectified or full-wave rectified waveforms of the alternating voltages, and lamp waveforms. Although the DC voltage or maximum amplitude voltage of the bias voltage should appropriately set while taking into account the balance of the characteristics of the deposited film and the occurrence rate of defects. Although the DC current or the maximum amplitude voltage may be maintained at a constant level during the time of from the commencement of initiation of the plasma till the commencement and completion of formation of the deposited film, it should preferably be varied continuously or at appropriate intervals in view of the ease in controlling the characteristics of the deposited film and suppressing the occurrence of defects. Especially, when anomalous discharges such as sparks take place, an abrupt variation of the bias voltage occurs. In this case, it is preferred that the variation is electrically detected, whereupon the bias voltage is immediately lowered or is transiently interrupted, followed by returning to a predetermined level of the bias voltage. By this, formation of defects in the deposited film can be prevented. As a matter of course, the above procedure may be manually carried and it is preferred from the standpoint of improving the yield of the deposited film that an automatic control circuit is assembled in the control circuit of the bias applicator means.

In the method of the invention, the bias applicator means may serve also as the band-shaped member. In this case, the earth electrode should be provided in the film-forming space. This earth electrode may serve as the gas feed means.

When the bias voltage is applied in the practice of the invention, it is effective that the band-shaped member is made of conductive materials or those materials wherein insulating materials are subjected to conduction treatment on the surface thereof. The band-shaped member should be constituted of materials having such a conductivity as to ensure a satisfactory current density at least at temperatures at which the band-shaped member is heated and maintained for the formation of the deposited film. Examples of such materials include metals, semiconductors and the like. For the purpose of facilitating the element separation step, the band-shaped may have regions constituted of insulating materials thereon. If the area of the regions of the insulating materials is large, any deposited film is formed on the regions at a controlled plasma potential. On the contrary, when the area is small, a film having substantially the same characteristics as the film formed on the conductive member is formed.

According to the method of the invention, there is provided a microwave applicator means capable of radiating or transmitting a microwave energy uniformly along the width of the band-shaped member used to constitute the film-forming space. By optimumly controlling the initiating and sustaining conditions of the microwave plasma and the bias applicator means, a functional deposited film with high quality can be continuously formed uniformly and reproducibly over a large area.

Moreover, an appropriate control of the plasma potential ensures continuous formation of the functional deposited film having desired characteristics and a reduced number of defects at high yield.

In order to uniformly and stably initiate and sustain a plasma within the film-forming space of a pillar-shaped form, there are optimum conditions for the respective parameters including the shape and capacity of the film-forming space, the type and flow rate of starting gas introduced into the film-forming space, the pressure in the film-forming space, the electric energy for the microwave supplied to the film-forming space, and matching of the microwave. These parameters are organically combined with one another and cannot be defined generally, and favorable conditions for these parameters should be appropriately set.

The apparatus of the invention is now described in more detail.

In the apparatus of the invention, in order that the band-shaped member functions as a structural material, the outside of the film-forming chamber may be atmospheric. If the characteristics of functional deposited films are adversely influenced by the flow of the air in the film-forming chamber, an appropriate air flow-preventing means is provided. Preferably, there is provided a mechanical sealing structure using an O-ring, gasket, helicoflex or magnetic fluid, or there is provided around the chamber an atmosphere of a diluent gas giving little influence or favorable effects on the characteristics of the deposited film or an isolated container for forming an atmosphere with a substantial degree of vacuum. With the mechanical sealing structure, specific care should be paid so that the sealed condition can be maintained while the band-shaped member is continuously being moved. If the apparatus of the invention and other types of deposited form formation apparatus are combined to continuously build up a plurality of deposited films on the band-shaped member, it is preferred to connect the respective apparatus by the use of gas gate means. Moreover, where a plurality of the apparatus of the invention are connected, the film-forming chambers in the respective apparatus each consists of an independent film-forming atmosphere, so that the isolated container may be provided singly and may be provided for the respective apparatus.

In the apparatus of the invention, the outside of the film-forming chamber may be under reduced pressure or under pressure. If, however, the band-shaped member is greatly deformed owing to the pressure differential with the inside of the film-forming chamber, an appropriate auxiliary structural member may be provided.

The auxiliary structural member should preferably have substantially the same shape as the side wall of the film-forming chamber and should be formed of wires or thin plates or sheets of metals, ceramics or reinforced resins having appropriate strength. The band-shaped member contacts and supports the auxiliary structural member at the side not exposed to the microwave plasma and the contacted portions of the band-shaped member are shaded substantially with the auxiliary structural member, so that little deposited film is formed. It should preferably be designed that the projected area of the auxiliary structural member on the band-shaped member is as small as possible.

If the auxiliary structural member intimately contacts the band-shaped member and is rotated or moved synchronously with the moving speed of the band-shaped member, a mesh pattern formed on the auxiliary structural member may be formed on the band-shaped member.

The materials for the band-shaped member used in the apparatus of the invention should preferably have such flexibility as to allow continuous curve formation of the band-shaped member, thereby smoothly following the shapes at the curve-commencing end, the curve-completing end and the intermediate curved portion. When the band-shaped member is continuously passed, it should preferably have strength enough to stand deflection or torsion. When a bias voltage is applied, specific care should be drawn to the conductivity at the side of the band-shaped member exposed to a plasma.

Examples of the materials used when a bias voltage is applied include thin sheets or composite sheets of metals such as stainless steels, aluminium and its alloys, iron and its alloys, and copper and its alloys with or without being surface coated with thin films of other metals by sputtering, vacuum deposition, plating and the like. Moreover, there are also mentioned heat-resistant resin sheets, such as polyimides, polyamides, polyethylene terephthalate and epoxy resins, and composite materials of these resins with glass fibers, carbon fibers, boron fibers and metallic fibers, which are treated on the surface thereof with metal elements or alloys thereof or transparent conductive oxides (TCO) by plating, vacuum deposition, sputtering or coating. There may also be used the band-shaped member having such arrangements as mentioned above, which is partially formed on the conduction-treated surface thereof with insulating thin films such as of $SiO_2$, $Si_3N_4$, $Al_2O_3$, AlN and the above-indicated heat-resistant resins.

Where any bias voltage is not applied, there are used thin sheets or composite materials of metals such as stainless steels, aluminium and its alloys, iron and its alloys, and copper and its alloys, sheets of heat-resistant resins such as polyimides, polyamides, polyethylene terephthalate and epoxy resins and composite materials of these resins with glass fibers, carbon fibers, boron fibers, metallic fibers and the like, those metal thin sheets and resin sheets whose surface is coated with a thin film of other metals and/or an insulating thin film of $SiO_2$, $Si_3N_4$, $Al_2O_3$, AlN and the like, such as by plating, vacuum deposition or sputtering.

The band-shaped member should preferably be as thin as possible in view of costs and an accommodation space provided that it has such strength as to keep the curved shape formed by a transfer means.

Figure 5:
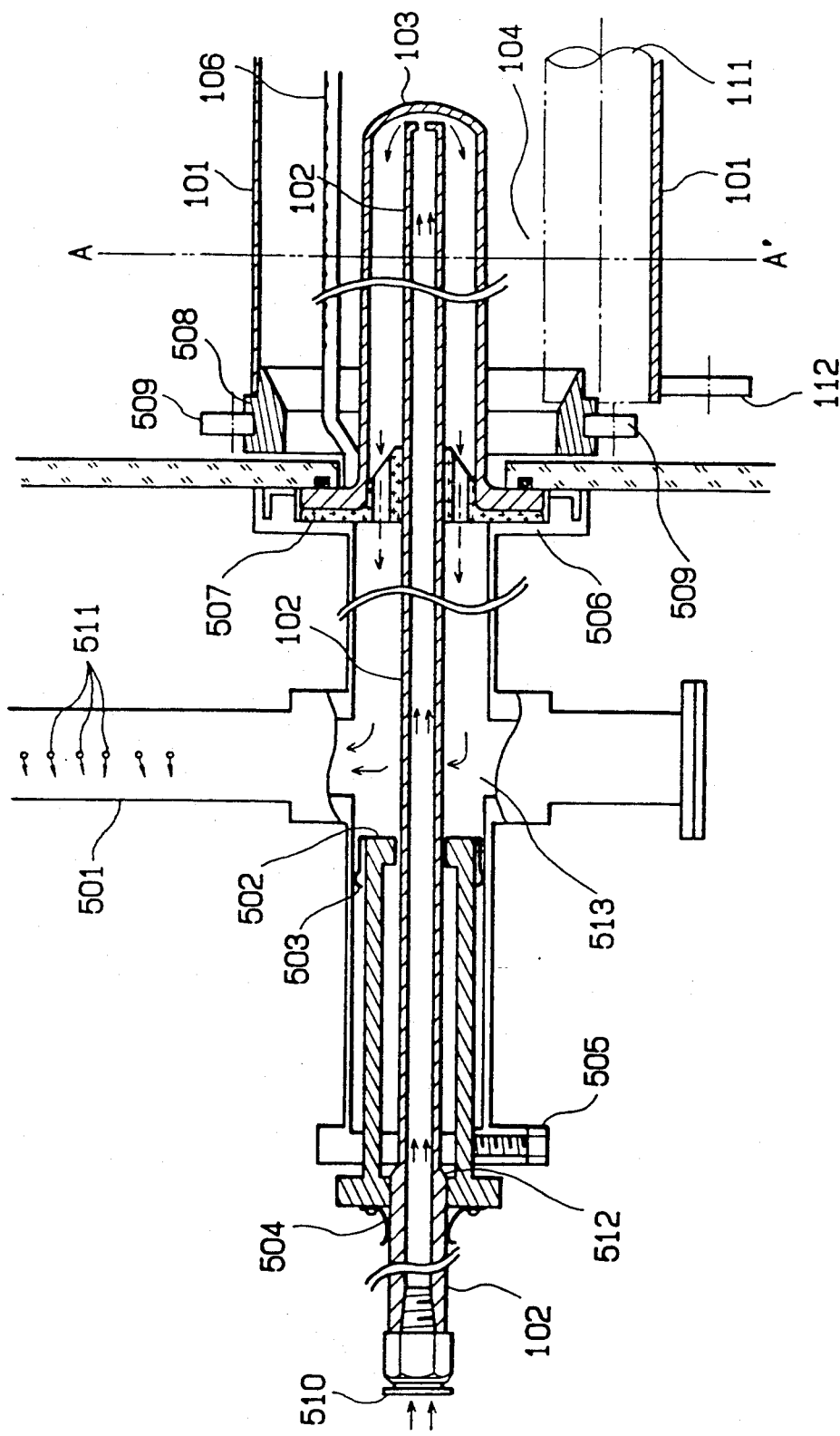
FIG. 5 is a detail illustration of a microwave coaxial line.

On the other hand, in order to increase the recovery rate of the deposited film, one curved portion end face support ring 508 in FIG. 5 is provided at each peripheral portion of the band-shaped member. The band-shaped member is transferred by contact only at the peripheral portion. The band-shaped member should have such strength that it does not become loosened between a pair of facing curved portion support rings. Accordingly, the band-shaped member should preferably have an appropriate thickness. With regard to the stress relaxation of the deposited film discussed before, a thicker band-shaped member is better. Thus, the thickness of the band-shaped member is suitably determined taking those factors set out above into consideration and may, more or less, vary depending on the type of material for the member and the curvature of the curved portion. For instance, when the band-shaped member is made of stainless steel, its thickness is appropriately in the range of from 0.03 to 0.3 mm. Similarly, with aluminium or copper, its thickness is in the range of from 0.05 to 0.5 mm and with synthetic resins, its thickness is in the range of from 0.1 to 3 mm.

When the band-shaped member is used as a substrate for solar cells and is made of an electrically conductive material such as a metal, it may be directly used as an electrode for current passage. If the member is made of an insulating material such as a synthetic resin, the side of the member on which the deposited film is formed should preferably be formed with an electrode for current passage. The electrode is formed by plating, vacuum deposition or sputtering of metals elements, alloys and transparent conductive oxides (TCO) such as Al, Ag, Pt, Au, Ni, Ti, Mo, W, Fe, V, Cr Cu, stainless steels, brass, nichrome, $SnO_2$, $In_2O_3$, ZnO, $SnO_2$-$In_2O_3$ (ITO) and the like. For the purpose of facilitating the element separation, an insulating film may be partially formed.

As a matter of course, when the band-shaped member is made of an electrically conductive material such as a metal, other metal layer may be formed on the substrate at the side where the deposited film is to be formed. By this, the reflectance of light with a long wavelength on the substrate surface can be improved or the mutual diffusion of constituent elements between the substrate material and the deposited film can be prevented, or such a metal layer can be used as an interference layer for preventing short-circuiting. Where the band-shaped member is relatively transparent and is used as a solar cell having a layer arrangement wherein light is passed from the side of the band-shaped member, it is preferred that a conductive thin film such as a transparent conductive oxide or metal thin film as mentioned above has been preliminarily formed.

With regard to the surface properties, the band-shaped member may have a smooth surface or a fine irregular surface. With the fine irregular surface, its shape may be spherical, conical or pyramidic and the maximum height ($R_{max}$) should preferably be from 500 to 5000 angstroms. By this, the light reflection on the surface becomes dispersed, bringing about an increasing light path length of the reflected light on the surface.

In the apparatus of the invention, the thickness of the deposited film in the film-forming chamber should preferably be controlled by inserting a cover for the substrate so that part of the side wall is covered therewith.

The central conductor used in the apparatus of the invention should preferably be made of metals whose ohmic loss is small. Specifically, the conductor may be constituted of silver, copper, aluminium or the like or may be made of other materials after which it is plated with those metals indicated above. A silver-plated stainless steel is preferably used in the apparatus of the invention.

The central conductor extended into the film-forming chamber is separated from the plasma through the microwave transmitting member provided therearound, so that a deposited film is prevented from being formed on the central conductor. Otherwise, the deposited film would serve as an absorber for the microwave with a lowering of the microwave powder efficiency.

In the film-forming chamber, the wall face which stands opposite to the surface through which the central conductor extends is constituted of a microwave reflector member. On the other hand, the face through which the central conductor extends is constituted of a member capable of transmitting the microwave and keeping air tightness between the inside and the outside of the film-forming chamber and also of a microwave reflector member. Since the side wall of the film-forming chamber is made of a conductive band-shaped member, proper selection of the width of the band-shaped member will result in a resonator structure.

As is well known in the art, at the boundary and short-circuiting faces where the line impedance abruptly varies, the electromagnetic wave is intensely reflected. Since the opposite end faces of the film-forming chamber, respectively, correspond to the boundary and short-circuit faces, the microwave is intensely reflected thereat. When an electromagnetic wave is passed into a cavity wherein two intense reflected faces are properly arranged, a resonator structure having a high Q value can be constituted.

In the apparatus of the invention, opposite end faces of the film-forming chamber may be movable to give a resonator structure. Alternatively, a semi-coaxial resonator structure having better operability may be assembled by the use of the central conductor insertion length controlling mechanism set out before. Still alternatively, a microwave transmitting member having a high dielectric constant may be inserted in position thereby obtaining an equivalently variable resonator length or controlling the impedance.

As stated above, if the film-forming chamber is so controlled as to give a resonator structure prior to discharge, the initiation of the discharge becomes easy by the effect of power accumulation of the resonator structure. Further, if the impedance is matched after the discharge by means of the insertion length controlling mechanism, a constant discharge state can be stationarily continued within a wide film-forming pressure range over a long time.

As the microwave transmitting member used in the apparatus of the invention, there may be mentioned a dielectric tube, for example, as shown at 103 in FIG. 1.

The materials for the dielectric tube may be ones which have a small dielectric loss, tan δ, in the range of microwaves used. Those materials having a high thermal conductivity and a high thermal shock resistance are better because the film deposited on the dielectric tube is prevented from changing in quality and increasing the reflection and absorption of the microwave power. In addition, the dielectric tube is also prevented from breakage by application of heat. Materials for optimumly meeting the above requirement include beryllia, alumina ceramics, boron nitride, quartz and the like, of which alumina ceramics are most preferred.

In order to initiate a microwave glow discharge and stably and stationarily sustain the discharge, it is required that the dielectric tube has functions to transmit the microwave and to keep air tightness. To this end, the tube should be optimumly arranged in the following two manners. The tube may be an open end cylindrical tube having one perforated flange welded at each end, or may be a closed end cylindrical tube wherein a cylindrical tube closed at one end and opened at the other end has a perforated flange welded at the open end side. The flange portion is brought into intimate contact with one wall of the opposite end faces of the film-forming chamber through an O-ring so that air tightness is kept. In view of the maintenance and check, the latter closed end cylindrical tube is better.

The microwave transmitting member with a high dielectric constant used in the apparatus of the invention is made of materials such as alumina ceramics, beryllia, boron nitride and the like. We have confirmed that when this member is disposed in the inside or end portion of a semi-coaxial resonator structure constituted of the central conductor insertion control mechanism, by which the resonator length can be equivalently varied. We have also found that an optimum dimension of the microwave transmitting member with high dielectric constant has interrelation with the insertion length of the central conductor. Accordingly, while the insertion length of the central conductor is fixed and the Scala Network Analyzer HP8757A (Hewlette-Packard Co., Ltd.) is used, the microwave transmitting member with high dielectric constant is so shaped that the resonance frequency is 2.45 GHz.

With regard to the support and transfer means for the band-shaped member used in the apparatus of the invention, the band-shaped member (substrate) is used to form the side wall of the film-forming chamber, so that when the band-shaped member suffers distortion, deflection or zigzag movement, the discharge becomes unstable. This makes sit difficult to form a film of uniform quality reproducibly in large amounts. Deposition of dirt or dust on the surface of the support and transfer means for the band-shaped member will often cause defects on a deposited film and is thus one of problems to solve. It has been found that the support and transfer means for the band-shaped member has two important facets including (1) prevention of the deformation of the film-forming chamber and (2) suppressing, to a minimum, of the support and transfer means from contacting the surface of the band-shaped member on which a deposited film is formed (hereinafter referred to simply as "film-forming surface").

For the deformation prevention of the film-forming chamber as in (1), a known crown mechanism is built in the support and transfer means to prevent the distortion and zigzag movement of the band-shaped member and a known tension control mechanism is used to prevent the deflection.

The suppression of the contact of the support and transfer means with the film-forming surface to a minimum as in (2) can be realized in such a way that the film-forming surface of the band-shaped member is supported only at the peripheral portions of the band-shaped member and the opposite side of the band-shaped member is supported over the entire width of the band-shaped member.

In other words, in case where the curved portion-forming means for the band-shaped member is provided in the inside of the film-forming chamber, there are used curved portion end support rings which contact and support only the peripheral portions of the band-shaped member. Where the curved portion-forming means is provided in the outside of the film-forming chamber, there are used rollers for contacting and supporting the band-shaped member substantially over the entire width. For supporting and transferring the band-shaped member at the inner side thereof with the support rings, a number of curved portion support inside rings as shown at 113 in FIG. 1 may be used. Alternatively, there may be used a pair of curved portion support inside rings, as shown at 508 in FIG. 5, which are substantially the same shape or size as opposite end faces of the columnar film-forming chamber.

In order to form a space or gap in the columnar film-forming chamber using the curved band-shaped member as the side wall along the lengthwise direction of the band-shaped member, the continuously transferring band-shaped member is gently changed with respect to the direction of the transfer by means of the curve-initiating end formation roller arrangement having a pair of an opening support inner roller and an opening support outer roller. Subsequently, the band-shaped member is so curved as to form the side wall of the film-forming chamber by means of the curve end face support rings. Thereafter, the transfer direction of the curved band-shaped member is gently changed by means of a curve-completing end formation roller arrangement having another pair of an opening support inner roller and an opening support outer roller.

If the opening support outer rollers have too large a diameter, the distance of from the central conductor to the band-shaped member differs depending on the direction, undesirably causing the plasma density to become non-uniform in many portions. On the other hand, when the diameter is too small, strain may be left in the band-shaped member owing to the flexture stress or separation of the film may occur. In particular, with a metal band-shaped member with a thickness of 0.15 mm, the roller with a diameter of 60 mmφ to 100 mmφ is preferred and for a thickness of 0.05 mm, the roller with a diameter of approximately 25 mmφ is preferred. In order to quickly complete the vacuum drawing after maintenance, it is recommended to arrange the curve initiating end formation roller and the curve completing end formation roller so that the distance therebetween is variable. For supporting and transferring the band-shaped member with the curve end face support rings, mere sliding friction may be utilized. Alternatively, the band-shaped member is subjected to processing such aperture making for sprockets, in which case the curve end face support rings may be sprockets.

In the apparatus of the invention, the surface temperature of the band-shaped member is an important parameter influencing the quality of the deposited film. The surface temperature of the band-shaped member can be controlled by heating the band-shaped member from the opposite side relative to the film-forming side by radiation from a lamp as is particularly shown in FIGS. 3 or 4. When, however, the transfer speed of the band-shaped member is slow or when the making power for the microwave is large, the band-shaped member is heated excessively. The temperature control only by the radiation heating by a lamp may not be possible in some case. In such a case, aside from the curved portion support inside rings indicated by 508 in FIG. 8, a curved portion support outer roller (not shown) is provided wherein a heat exchange medium is contained in the inside of the outer roller. This outer roller is brought into press contact with the opposite side, relative to the film-forming side, of the band-shaped member over the entire width, so that the band-shaped member may be either cooled or heated, ensuring the temperature control.

We have made studies on means for feeding starting gases for film formation and exhaust means for the film-forming chamber in order to impart to these means functions to preliminarily cope with problems (i) to (iii) described below.

(i) Occurrence of defects in the film-formed surface owing to the separation of the film.

(ii) Film deposition on the means for feeding starting gases.

(iii) Non-uniformity of the starting gases in a spacial distribution.

As a result, the following facts have been found.

Figure 7:
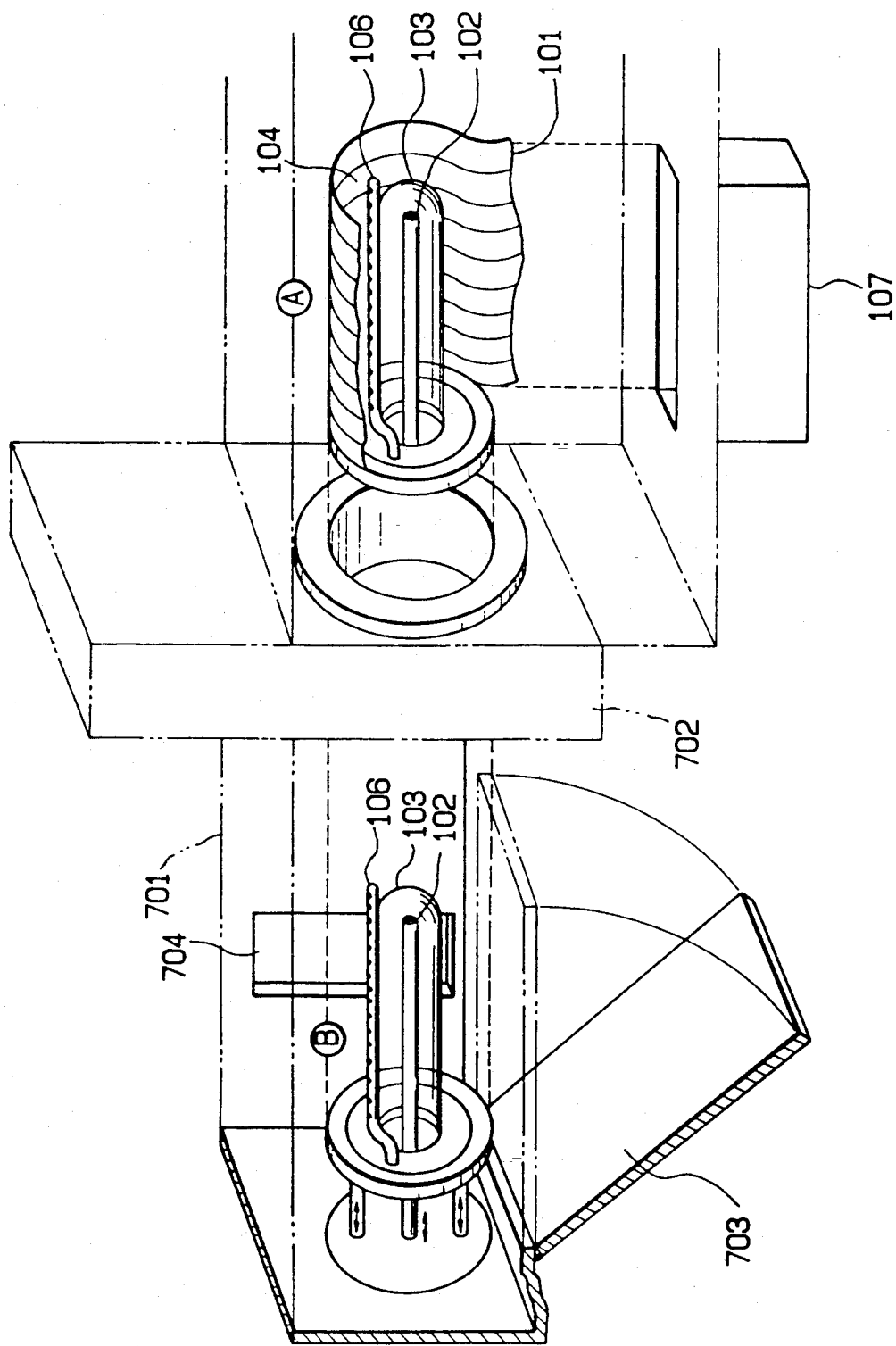
FIG. 7 is an illustrative view of a dielectric tube and an exchange mechanism for a starting gas feed pipe.

As for the problem (i), a load lock mechanism is provided as shown in FIG. 7. If the deposited film starts to frequently separate during the deposition operation, the deposition operation is stopped. The fixing members in the inside of the film-forming chamber, e.g. the starting gas feed pipe or the dielectric tube, are exchanged to suppress the separation of the film.

As for (ii), when the starting gas feed means becomes high in temperature, the starting gas is thermally decomposed thereby depositing on the feed means. To avoid this, a metal material such as nickel or stainless steels is favorably used.

On the other hand, as for (iii), a plurality of small apertures provided in the surface of the starting gas feed tube 106 are turned in a direction opposite to a slit opening 110 as shown in FIG. 6. As is known in the art, the intervals of the small apertures are made longer at the upstream side and shorter at the downstream side.

In the apparatus of the invention, the bias applicator means provided to control the plasma potential is so disposed that at least a part thereof is contacted with the plasma initiated in the film-forming chamber. With reference to the accompanying drawings, typical arrangements are particularly described and it should be noted that the bias applicator means is not limited to these embodiment.

In FIGS. 21(a) to 21(b), there are, respectively, shown schematic side sectional views of the apparatus of the invention shown in FIG. 2, taken along the line H-H' in the sectional view of FIG. 6. In these figures, main constituent members alone are shown.

An embodiment of FIG. 21(a) is a typical one wherein the bias applicator means serves also as a gas feed means. A band shaped member 2101 is grounded. While the curved shape is being held by means of a support and transfer roller 2101, the member is is transferred. Reference numeral 2103 indicates a bias applicator tube serving also as a gas introduction pipe and is connected with a gas feed pipe 2110 through an insulating joint 2109. The bias applicator tube 2103 serving as the gas introduction pipe is applied with a bias voltage generated from a power supply 2107 for bias application. The power supply 2107 for bias application include commercially available direct current regulated power supplies, alternating current power supplies, high frequency power supplies and the like. Aside from the above, there may be used self-assembled power supply systems for application of bias voltages having various waveforms and frequencies wherein a waveform output generated, for example, from a function generator is amplified by a precise power amplifier. The bias voltage and current should preferably be inevitably monitored by means of recorders. The thus monitored data should preferably be inputted in a control circuit in order to improve the stability and reproducibility of the plasma and to suppress occurrence of anomalous discharge.

The position where the bias applicator tube 2103 is provided in the film-forming chamber is not critical provided that the applicator tube 2103 is disposed in contact with the microwave plasma. For suppressing the occurrence of anomalous discharge, the tube 2103 should preferably be provided at a distance of not smaller than 10 mm, more preferably not smaller than 20 mm, from the inner surface of the band-shaped member 2101.

Since the bias applicator tube 2103 serves as the gas introduction pipe, the tube should preferably be provided, therearound or along the lengthwise direction, with apertures or slits from which a starting gas is uniformly discharged. The tube is so designed with respect to the diameter and length that a desired current density is ensured. The surface area should preferably be as small as possible on the condition that the desired current density is obtained. This is effective in preventing a lowering of the utilization efficiency of the starting gas due to the formation of the deposited film on the surface of the tube and an increasing occurrence rate of defects in the deposited film formed on the band-shaped member owing to the separation of the deposited film and flying off. By this arrangement, the decomposition efficiency of the starting gas can be more improved.

Embodiments shown in FIGS. 21(b) and 21(d) are typical ones wherein the gas feed means and the bias applicator means are separately provided. In FIG. 21(b), a single bias bar 2104 is used and in FIG. 21(d), two bias bars including the bias bar 2104 and a second bias bar 2106 are used. If desired, further bias bars may be additionally provided.

Reference numerals 2107, 2108 are, respectively, power supplies for bias application, which may have the same specification or may have a different specification so that independent bias voltages can be applied. The starting gas is introduced into the film-forming chamber through a gas introduction pipe 2105. The bias bar 2104 and the second bias bar should preferably take a form of a bar or a tube made of heat-resistant metals such as, for example, stainless steels, nickel, titanium, vanadium, niobium, tantalum, molybdenum, tungsten and the like, respectively. If a tubular structure is formed, it is possible to pass a coolant medium therethrough thereby suppressing the bias bar from undergoing abnormal generation of heat. The position where these bars are provided is similar to the case of the bias applicator tube 2103.

Preferably, the gas introduction tube 2105 is constituted of a dielectric material in order to suppress occurrence of anomalous discharge and to form a uniform plasma potential. If grounded, a conductive tube may likewise used without any trouble.

An embodiment shown in FIG. 21(c) is a typical example where a bias voltage is applied to the band-shaped member. The power supply 2107 for bias application is connected to the band-shaped member 2101. The gas introduction pipe 2105 is constituted of a conductive material and grounded. Alternatively, the gas introduction tube 2105 may be constituted of an dielectric material and a ground electrode may be separately provided. The position where the gas introduction pipe 2105 is provided is not critical provided that it contacts a plasma.

According to the apparatus of the invention, bias voltages are appropriately applied to the bias applicator means singly or after superposition, by which the plasma potential can be controlled at a desired level. This leads to continuous and reproducible formation of a functional deposited film of high quality with a reduced number of defects in high efficiency and high yield.

The functional deposited films continuously formed according to the method and apparatus of the invention may be either amorphous or crystalline in nature and include thin films of semiconductors of group IV such as Si, Ge, C and the like, thin films of semiconductive alloys of group IV such as SiGe, SiC, SiSn and the like, thin films of semiconductor compounds of groups III-V such as GaAs, GaP, GaSb, InP, InAs and the like, and thin films of semiconductor compounds of groups II-VI such as ZnSe, ZnS, ZnTe, CdS, CdSe, CdTe and the like.

The starting gases used to form the functional deposited films according to the method and apparatus of the invention are preferably those which are able to be introduced into the film-forming chamber in the form of gases and include, for example, hydrides, halides and organometallic compounds of constituent elements of the above-mentioned semiconductors.

As a matter of course, these starting compounds may be used not only singly, but also in combination of two or more. These starting compounds may be introduced by mixing with inert gases such as He, Ne, Ar, Kr, Xe, Rn and the like or also with diluent gases such as $H_2$, HF, HCl and the like.

The continuously formed semiconductor thin films may be subjected to valence control and forbidden band control. More particularly, starting compounds containing an element serving to control the valence or forbidden band are introduced into the film-forming chamber singly or by mixing with the starting gas for the deposited film formation or the diluent gas.

The present invention is more particularly described with reference to the accompanying drawing by way of apparatus examples, which should not be construed as limiting the invention thereto.

APPARATUS EXAMPLE 1

FIG. 1 is a schematic perspective view showing a typical example of a film-forming chamber using a moving band-shaped member as a side wall and its peripheral mechanisms.

In FIG. 1, indicated by 101 is a band-shaped member, by 102 is a central conductor of a coaxial line or cable to which a microwave is applied, by 103 is a dielectric tube used as a microwave transmitting member, by 104 is a film-forming chamber, by 105 are small apertures, by 106 is a starting gas introduction pipe, by 107 is a vacuum exhaust port, by 108 is an outer roller for supporting the band-shaped member, by 109 is an inner roller for supporting the band-shaped member, by 110 is a slit-like opening of the film-forming chamber, by 111 is an outer roller for supporting the opening, by 112 is an inner roller for supporting the opening, and by 113 are inside rings for keeping or supporting a curved portion.

Two arrows shown in FIG. 1 indicate the flow of the starting gas.

In FIG. 1, the film-forming chamber 104 constituted of the band-shaped member 101 is in the form of a column wherein the central conductor 102 of the coaxial line is disposed on the axis of rotation of the film-forming chamber. Within the inside of the film-forming chamber 104 is provided the dielectric tube 103, used as the microwave transmitting member, coaxially with the central conductor 102. The film-forming chamber 104 is formed as a column in such a way that while the band-shaped member 101 is sandwiched between the outer roller 111 and the inner roller 112, the direction of the transfer is changed so that the band-shaped member 101 which is outwardly curved is supported and transferred through a plurality of curved portion support inside rings 113 provided along the inner periphery of the curved band-shaped member 101, thereby forming a columnar side wall. Again, the band-shaped member 101 is changed with respect to the transfer direction while sandwiching between the opening support outer roller 111 and the opening support inner roller 112 to complete the column. As stated before, in order to prevent distortion and deflection of the band-shaped member 101 during the course of the transfer, the band-shaped member 101 is supported at portions other than the curved portions of the member 101, by means of the outer roller 108 and the inner roller 101 both for supporting the band-shaped member.

In FIG. 1, the slit-like opening 110 established by the band-shaped member 101 is maintained by supporting the band-shaped member 101 with the opening support outer roller 111 and and opening support inner roller 112. The inner roller 112 is in contact only with the peripheral portion of the band-shaped member 101 as shown, and the band-shaped member 101 is driven from outside of the film-forming chamber by a separately provided drive mechanism (not shown). If a tension control means is provided in the drive mechanism, the band-shaped member can be transferred without deflection.

The starting gas introduction pipe 106 is extended into the inside of the film-forming chamber 104 and is located at a side opposite to the slit-like opening 110 of the film-forming chamber 104 relative to the dielectric tube 103. In addition, a multitude of small apertures 105 formed in the starting gas introduction pipe 106 should be directed toward the band-shaped member 101.

A mechanism for introducing microwave power into the film-forming chamber shown in FIG. 1 is illustrated with reference to FIG. 5.

In FIG. 5, a coaxial line or cable is described as an example of a microwave antenna means, but an antenna means such as a rigitano coil may be used.

In FIG. 5, indicated by 501 is a rectangular waveguide, by 502 is a coaxial plunger (movable end), by 503, 504 are electromagnetic shield members, by 505 is a fixing means for the coaxial plunger, by 506 is a circular choke flange, by 507 is a microwave transmitting, high dielectric constant member, by 508 is a curved portion support inside ring, by 509 is a roller or bearing, by 510 is a central conductor cooling gas introduction port, by 511 are apertures, by 512 is a stopper, and by 513 is a waveguide coaxial converter.

As shown in FIG. 5, the central conductor 102 has a hollow structure and extends into the interior of the film-forming chamber at one end thereof to outside of the coaxial line through the waveguide coaxial converter 513. The other end connects to the central conductor cooling gas introduction port 510. The central conductor 102 is held in good electric contact by means of the electromagnetic shield members 503, 504 made of spring members and a fixing member for the central conductor, not shown. The fixing member may have, for example, the same structure as the coaxial plunger fixing member 505 wherein its attachment position is rotated by 90° about the axis of the central conductor. In FIG. 5, the fixing member used is a bolt. When the portion of the central conductor 102 in the vicinity of contacting with the electromagnetic shield member 504 is moved, the insertion length of the central conductor 102 into the interior of the film-forming chamber 104 can be controlled from outside of the coaxial line.

As will be seen from FIG. 5, the coaxial plunger 502 has such a structure that it can be operated from outside of the coaxial line. The coaxial plunger 502 is connected or fixed, by spot welding, with the electromagnetic shield member 503 for ensuring good electric contact by a spring member. At the center of the coaxial plunger 502, there is a through-hole through which the central conductor 102 is passed. Another electromagnetic shield member 503 made of a spring member is provided at the contact portion between the coaxial plunger 502 and the central conductor 102 so that the plunger 502 can smoothly slide along the central conductor 102.

It is actually beneficial to provide a stepped portion on the central conductor 102 at a given position whereby when the stopper 512 is provided, it can be prevented that the contact of the microwave transmitting, dielectric tube 103 and the central conductor 102 at the end face thereof eventually causes the dielectric tube 103 to be broken. A similar stopper may be provided at the other end of the coaxial plunger 502, by which the end face of the coaxial plunger 502 forces out to the waveguide coaxial converter 513. If the end face forces out, anomalous discharge is apt to occur in the electromagnetic shield member 503 allowing good contact between the coaxial plunger 502 and the outer conductor. In worse cases, the member may be burnt out, thus bringing about practical obstacles.

In FIG. 5, the waveguide coaxial converter 513 is formed of the coaxial line having the central conductor 102 which is inserted into the interior of the rectangular waveguide 501.

In FIG. 5, the rectangular 501 is connected to a microwave oscillator with 2.45 GHz, not shown, available from Evik Co., Ltd.

In FIG. 5, the microwave transmitting, high dielectric constant member 507 has substantially a truncated conical form and have a plurality of apertures on the conical surface through which a cooling or coolant gas is discharged. The coolant gas for the central conductor passes from the port 510 through the center of the hollow central conductor 102 via the end face opening of the central conductor 102 and continues to pass along the inner surface of the microwave transmitting, dielectric tube 103 through the discharge ports in the conical surface of the high dielectric constant member 507 and is discharged from a plurality of small apertures 511 provided at the side wall of the rectangular waveguide 501.

The band-shaped member 101 is transferred by being supported only at the peripheral portions thereof with a pair of the curved portion support inside rings 508. The inside rings 508 is rotatably supported by rollers (or bearings 509 provided therearound. The inside rings may be a plurality of small rings arranged along the peripheries of and in face-to-face relation with the band-shaped member substrate 101 as shown in FIG. 1.

In FIG. 5, the central conductor 102 is isolated from the plasma generated in the film-forming chamber 104 by means of the dielectric tube 103. The dielectric tube 103 is semi-spherical and closed at one end and has a vacuum flange at the other end with an intermediate cylindrical form, and has a structure capable of being vacuum sealed by means of the vacuum flange.

The circular choke flange 506 is connected in intimate contact with the vacuum flange of the dielectric tube 103. Where the electric contact of the metal faces is not good owing to the vacuum sealing between the circular choke flange 506 and the dielectric tube 103, any leakage of microwave does not occur from the structural viewpoint.

The apparatus of the invention comprises, aside from the main mechanisms for use as the microwave plasma CVD apparatus, a load lock mechanism as an auxiliary means.

The load lock mechanism of FIG. 7 is attached to the apparatus, by which not only defects are reduced in number, but also maintenance performance is remarkably improved. The load lock mechanism is described in detail.

In FIG. 7, indicated by 701 is a load lock chamber for exchange, by 702 is a gate valve, by 703 is an exchange door, by 704 is a vacuum exhaust port, by (A) is a state where the dielectric tube and the starting gas introduction pipe are in position at the time of the formation of the deposited film, and by (B) is a state where the mechanism is withdrawn from the position for exchange.

In FIG. 7, the central conductor 102, the dielectric window 103 and the starting gas introduction pipe 106 are provided as an exchangeable unit. These can be fixed at the position indicated by (A) or (B), respectively, with the aid of fixing members, not shown, which are preliminarily provided at the respective positions (A) and (B). The load lock chamber 701 is provided therein with an arm, not shown, for moving the unit from position (A) to position (B). In the vacuum exhaust port 704, a vacuum pump, not shown, is connected by which the load lock chamber 701 can be drawn to a vacuum. Moreover, the central conductor 102 and the starting gas introduction pipe 106 should both have a detachable structure in the neighbourhood of the gate valve 702.

The load lock mechanism shown in FIG. 7 should be located adjacent to the film-forming chamber 104 shown in FIG. 1 through the gate valve 702.

In operation of the microwave plasma CVD apparatus according to the invention, the apparatus should be so controlled as to meet the following requirements: ease in initiating initial discharge; and preliminary control and selection of an outer diameter of the dielectric tube 103 for impedance matching between the portion of the coaxial line not extending into the film-forming chamber 104 and the portion of the coaxial line extending into the interior of the film-forming chamber 104, according to the discharge state for carrying out the formation of a desired deposited film. Of course, if not controlled as set forth above, the apparatus may be free of any trouble involved in the operation. In order that the function of the apparatus is optimumly shown, the above requirements should be satisfied.

The likelihood to initiate the initial discharge which is the first requirement is feasible by many known procedures including an increase in pressure of the film-forming chamber, an increase of the microwave power being applied, occurrence of spark discharge such as by the Tesla coil, and the like. It has been found that in the apparatus of the invention, the construction of the film-forming chamber 104 as a semi-coaxial resonator ensures a continued discharge which is stationary and constant over a wider range of film-forming pressure for a longer time than in the known procedures of initiating the initial discharge. For constructing the semi-coaxial resonator, while confirming the resonance state by the use of Scala Network Analyzer HP8757A (Hewlette-Packard Co., Ltd.), the insertion length of the central conductor 102 into the interior of the film-forming chamber 104 should be so controlled that the dielectric tube 103 acts as a semi-coaxial resonator when set in position.

The control and selection of the outer diameter of the dielectric tube which is the second requirement are made such that the impedances of the portion of the coaxial line extending into the film-forming chamber 104 and the portion of the coaxial line not extending into the interior of the film-forming chamber are matched. In the inside of the film-forming chamber 104 where discharge is initiated, an equivalent coaxial line is formed in correspondence with the plasma density. The plasma density or the complex dielectric constant of the plasma varies mainly depending on the gas mixing ratio, the gas pressure, the applied microwave power or the size of the dielectric tube. These four variables are interrelated with one another, so that it is difficult to theoretically predict an optimum diameter of the dielectric tube 103 creating the matching state between the extending portion of the coaxial line into the film-forming chamber and the non-extending portion of the coaxial line into the film-forming chamber as stated above. Accordingly, the matching state should be experimentally confirmed by proper selection of the outer diameter of the dielectric tube 103 and the control of the insertion length of the central conductor 102 into the interior makes use of a band-shaped member, which is capable of functioning as a support for forming a functional deposited film thereon, as a side wall as shown below. With the film-forming chamber with an inner diameter of 40 mm$\phi$, it is preferred that the coaxial line has a central conductor of 6 mm$\phi$ and an outer conductor of 20 mm$\phi$, the dielectric tube has an outer diameter of 1.8 mm$\phi$, and the insertion length of the central conductor is 452 mm. Alternatively, when the film-forming chamber has an inner diameter of 105 mm$\phi$, it is preferred that the coaxial line has a central conductor of 15 mm$\phi$ and an outer conductor of 30 mm$\phi$, the dielectric tube has an outer diameter of about 23 mm$\phi$, and the insertion length of the central conductor is 455 mm.

The microwave plasma CVD apparatus of the invention described hereinabove is operated in the following manner.

The film-forming chamber 104 of FIG. 104 is drawn to a vacuum through the slit-like opening 110 and the vacuum exhaust port 107 by means of a vacuum pump not shown. After the pressure in the inside of the film-forming chamber has reached $1 \times 10^{-6}$ Torr, a starting gas for film formation whose flow rate is controlled by means of a mass flow controller not shown is injected from the aperture 105 through the introduction pipe 106 and introduced into the film-forming chamber 104. In this state, after the interior of the film-forming chamber has reached a predetermined pressure level, a microwave energy or power initiated by a microwave oscillator (available, for example, from Evik Co. Ltd.) of 2.45 GHz, not shown, is discharged into the film-forming chamber via the rectangular waveguide 501, the waveguide coaxial converter 513, the central conductor 102 and the microwave transmitting, dielectric tube as shown in FIG. 5. In order to effectively utilize the microwave power, the microwaves should preferably be matched in impedance as is known in the art. In the apparatus of the invention, the insertion length control mechanism for the central conductor 102 and the coaxial plunger 502 shown in FIG. 5 are built in as the microwave impedance matching mechanism. Of these microwave impedance matching mechanisms, the former central conductor insertion length controller has a wider matching range. Accordingly, it is preferred that the insertion controller is initially used so that the reflected power is minimized while monitoring the reflected power in the inside of the coaxial line or waveguide by means of a reflection watt-meter. Subsequently, it is finely adjusted by means of the coaxial plunger 502 to allow impedance matching. As a result, a desired functional deposited film is formed on the band-shaped member 101 by the action of the plasma initiated in the inside of the film-forming chamber 104.

Next, the procedure of operating the load lock mechanism shown in FIG. 7 and used as an auxiliary mechanism is described. The central conductor 102 and the starting gas introduction pipe 106 are removed in the vicinity of the gate valve 702, after which the microwave transmitting, dielectric tube 103 and the starting gas introduction pipe 106 are withdrawn from the position (A) to the position (B) in the figure, followed by closing the gate valve 702. Subsequently, the load lock chamber 701 is returned to an atmospheric pressure using an inert gas such as $N_2$ or Ar and the exchange door 703 is opened, followed by exchange of the dielectric tube 103 and th starting gas introduction pipe 106 with fresh ones. The exchange door 703 is closed and the chamber is evacuated from the exhaust port 704 through an exhaust pump not shown. When the pressures in the load lock chamber 701 and the film-forming chamber are equal to each other, the gate valve 702 is opened, followed by returning the dielectric tube 103 and the starting gas introduction pipe 106 to the position (A). The central conductor 102 and the introduction pipe 106 are again connected in the vicinity of the gate valve 702. The formation of the deposited film is again commenced.

As will be apparent from the above, the load lock mechanism plays an important role in enhancing the operating efficiency. Besides, if a conductance control mechanism is provided at the position of the exhaust port 107 shown in FIG. 1, the operating efficiency of the apparatus can be further improved, thus facilitating depreciation of the apparatus.

As shown in FIG. 8, the conductance control mechanism makes use of a structure provided with a rotatable conductance control plate 801 or a microwave reflection plate 802 having a mesh structure. At the initial vacuum drawing, the mechanism is rotated for opening to a full extent and, after arriving at a predetermined pressure, the position of the rotation is determined to attain a desired conductance, after which the starting gas is passed.

Other conductance control mechanism includes a pair of face-to-face rollers 111 and 112 shown in FIG. 8, which are shifted horizontally to eventually vary the area of the slit-like opening 110. By this, the conductance is controlled.

APPARATUS EXAMPLE 2

Figure 3:
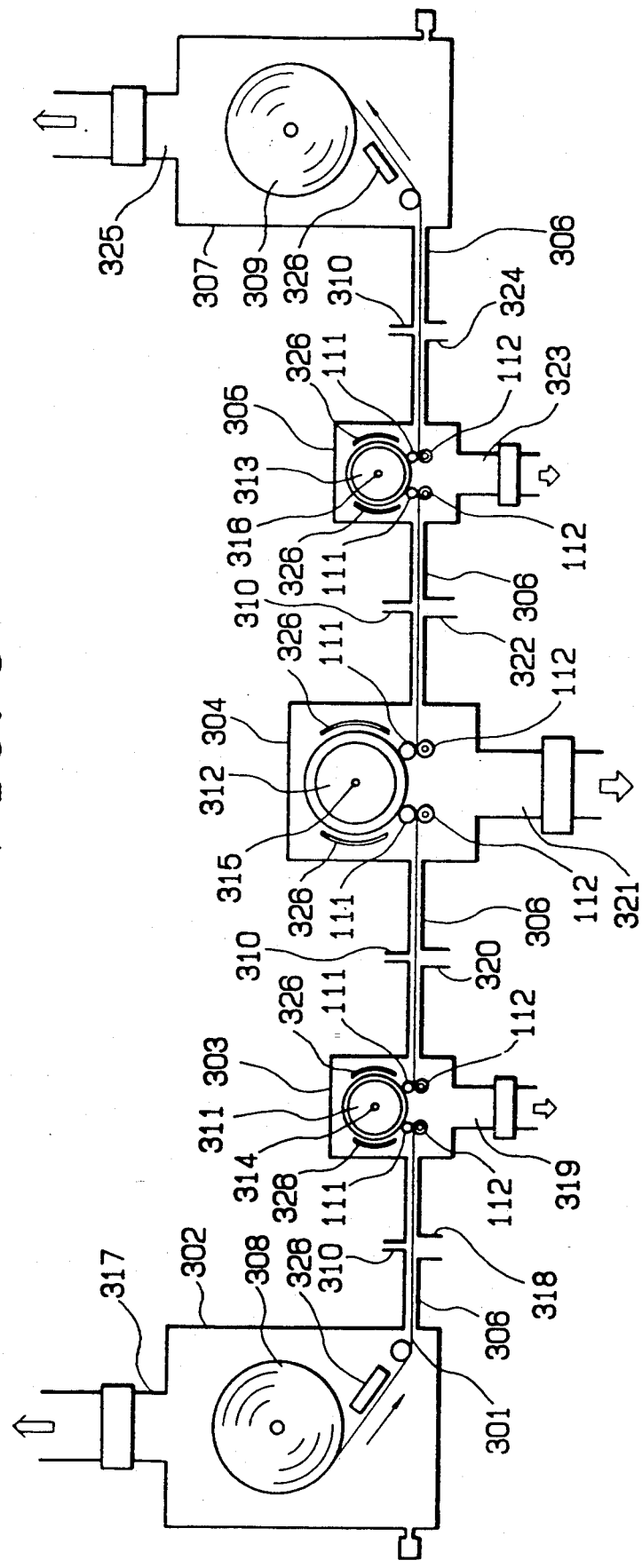
FIGS. 3 and 4 are, respectively, schematic views showing an arrangement of an apparatus for forming p, i and n-type semiconductor layers for solar cells.

This Apparatus Example deals with a microwave plasma CVD apparatus for suitably fabricating a p-i-n photovoltaic device wherein three film-forming chambers as shown in FIG. 1 are connected and an n-type semiconductor layer, an i-type semiconductor layer and a p-type semiconductor layer are successively deposited and built-up on a continuously moving band-shaped member. FIG. 3 is a schematic sectional view of the apparatus of the type mentioned above.

In FIG. 3, indicated by 301 is a band-shaped member, by 302 is a band-shaped member carrying-in chamber, by 303 to 305 are, respectively, isolated containers, by 306 is a gas isolation passage, by 307 is a band-shaped member carrying-out chamber, by 308 is a band-shaped member feed roller, by 309 is a band-shaped member take-off roller, by 310 is a scavenging gas introduction port, by 311 to 313 are, respectively, film-forming chambers, by 314 to 316 are, respectively, microwave coaxial line introduction units, by 317 to 325 are, respectively, exhaust ports, and by 326 is a temperature controller for the band-shaped member.

In FIG. 3, the isolated containers 303 to 305 may be each provided with a load lock mechanism, as illustrated in Apparatus Example 1, through a gate valve not shown. The carrying-in chamber 302 and the carrying-out chamber 307 may similarly be provided with such a load lock mechanism as set out above.

In FIG. 3, the apparatus of the invention may further comprise a heating chamber adjacent to the band-shaped member carrying-in chamber 302, a cooling chamber ahead of the carrying-out chamber 307, or a cooling or heating chamber appropriately provided in correspondence with the flow or amount of heat from the plasma in the inside of the film-forming chamber.

Moreover, the inner diameter of the film-forming chambers 311 to 313 is so controlled that even if the thicknesses of desired deposited films may differ from each other, the transfer speed of the band-shaped member 301 is kept constant.

In FIG. 3, the gas isolation passages 306 are provided between any adjacent isolated containers, in which a scavenging gas is introduced thereinto through the scavenging gas introduction port 310.

The gas isolation passages 306 should have a function of not diffusing starting gases mutually used in any adjacent isolated containers. The fundamental concept therefor may follow the means disclosed in U.S. Pat. No. 4,438,723. In the practice of the invention, the capability of the means has to be further improved. The reason for this is that it is preferred that in at least one of the film-forming chambers used in the present invention, the deposited film should be formed at a pressure of approximately $10^{-2}$ to $10^{-3}$ Torr and the film-forming pressure disclosed in the United States Patent is lower that the film-forming pressure used in the present invention, leading to a more likelihood of the starting gas being diffused. More particularly, the apparatus should withstand a pressure differential of approximately $10^6$ times greater in a maximum. For this purpose, the exhaust pump used should preferably be an oil diffusion pump, a turbo molecular pump, a mechanical booster pump or combinations thereof.

The gas isolation passage 317 is designed to have a sectional form which has substantially the same size as the section of the band-shaped member in order to make a small conductance and enhance the isolation function. By changing the overall length of the gas isolation passage, the isolation ability can be changed. In order to further enhance the isolation ability, it is preferable to use a scavenging gas in combination. Examples of the gas include rare gases which are likely to be exhausted by the turbo molecular pump, e.g. Ar, Ne, Kr, Xe and the like, or gases, such as $H_2$, which are likely to be exhausted by the oil diffusion pump. The optimum flow rate of the scavenging gas to be introduced into the gas isolation passage is substantially determined depending on the shape of the gas isolation passage and the mutual diffusion coefficient of the scavenging gas and the starting gas used to form the deposited film. In practice, the amounts of the gases which are mutually diffused are measured by the use of a mass spectrometer, from which optimum conditions should preferably be determined.

Prior to the operation of the apparatus, a pretreated band-shaped member 101 is set on the feed roller 308. In order to connect the feed roller 308 and the wind-up roller 309 with the band-shaped member 101, the member 101 is passed through the respective film-forming chambers 302 to 306 in position. Thereafter, the covers of the respective film-forming chambers are closed to make air tightness, followed by drawing a vacuum to an extent of approximately $1 \times 10^{-6}$ Torr., thereby completing the preparation. The vacuum pump used for this purpose may be combinations of a rotary pump, a mechanical booster pump and, an oil diffusion pump.

In operation, the band-shaped member 101 is transferred at a given transfer speed from the band-shaped member carrying-in chamber 301 to the pre-heating chamber 302 wherein it is heated to a given temperature, followed by forming a deposited film in the respective isolated containers to obtain a built-up layer made of the three films and cooling in the cooling chamber to a predetermined temperature. Finally, the deposited member is wound up with the wind-up roller 309. Thereafter, the rolled band-shaped member on which the built-up layer made of the three deposited film has been formed is withdrawn from the carrying-put chamber 307.

The wind-up and removal of the band-shaped member are described in detail.

The wind-up mechanism for the band-shaped member is initially described. The wind-up mechanism used in the apparatus of the invention should preferably have the following functions.

iv) To protect the deposited film at the time of the wind-up.

v) To make a roll which does not cause separation of the film.

It is preferred that when the band-shaped member is wound up with the wind-up roller 309, the band-shaped member is wound up along with a polyimide glass wool (so-called synthetic paper) placed on the member.

The synthetic paper should preferably have a heat resistance and is resistant to a temperature of approximately 150° C. and have good flexibility. To avoid the film separation, the roller should preferably have an outer diameter of not smaller than 100 mm$\phi$, more preferably approximately 300 mm$\phi$.

The removing or detaching (detaching and attaching) mechanism for the band-shaped member is described.

FIGS. 9(i) to 9(v) and FIGS. 10(i) to 10(v) are, respectively, schematic views illustrating a band-shaped member processing chamber and the film-forming operations such as of the band-shaped member.

Figure 9I:
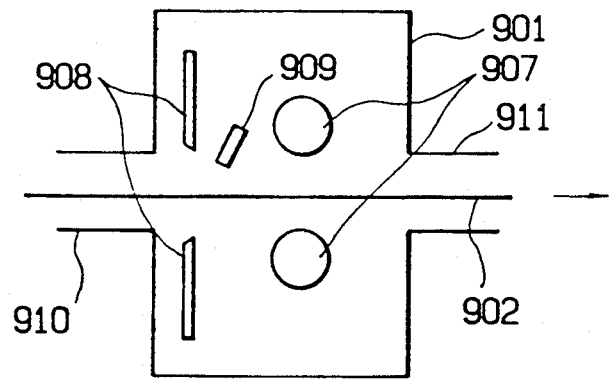
Figure 9:
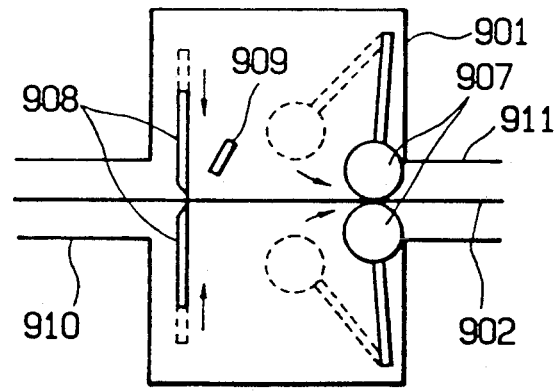
Figure 9:
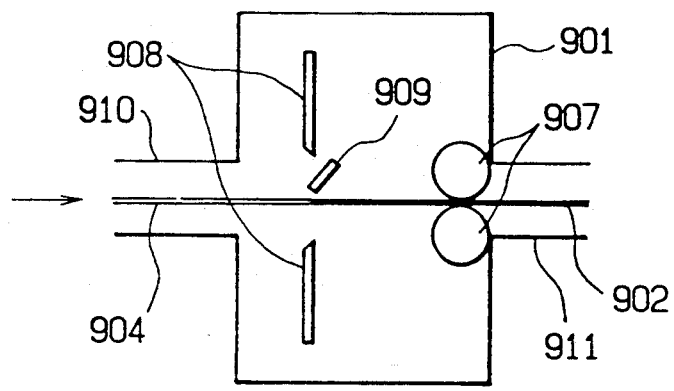

In FIGS. 9 and 10, indicated by 901 is a band-shaped member processing chamber provided at a side of feeding the band-shaped member and by 1001 is a band-shaped member processing chamber provided at a side of winding up the band-shaped member, within which there are, respectively, provided fluorine-containing resin rollers 907, 1007, and cutting blades 980 1008 and welding tools 909, 1009.

FIG. 9(i) shows an ordinary film-forming state, wherein the band-shaped member 902 is moved along the direction of the arrow in the figure without contacting the roller 907, the cutting blade 908 and welding tool 909. Reference numeral 910 indicates a connection pipe with a band-shaped member accommodation container (not shown) and reference numeral 911 indicates a connection pipe with a film-forming chamber (not shown).

FIG. 9(i) shows a first step of exchange with a fresh band-shaped member after completion of the film-forming step of the first band-shaped member. The band-shaped member 902 is stopped and the roller 907 is moved from the position indicated by the dotted line toward the direction of the arrow, thereby causing it to be intimately contacted with the band-shaped member 902 and the wall of the processing chamber 901. In this state, the band-shaped member accommodating container and the film-forming chamber are separated under air-tight conditions. Next, the cutting blade 908 is moved along the direction of the arrow to cut the band-shaped member 902. The cutting blade 908 may be one which is able to cut the band-shaped member 902 mechanically, electrically or thermally.

FIG. 9(iii) shows the state where the cut band-shaped member 903 is moved for winding up toward the side provided with the band-shaped member accommodating container.

The cutting and winding-up steps may be carried out in vacuum or in an atmospheric leaky condition in the band-shaped member accommodating container.

FIG. 9(iv) shows a step wherein a fresh band-shaped member 904 is fed and connected to the band-shaped member 902. The band-shaped members 904 and 902 are contacted at end portions thereof and welded by means of the welding tool 909.

Figure 9V:
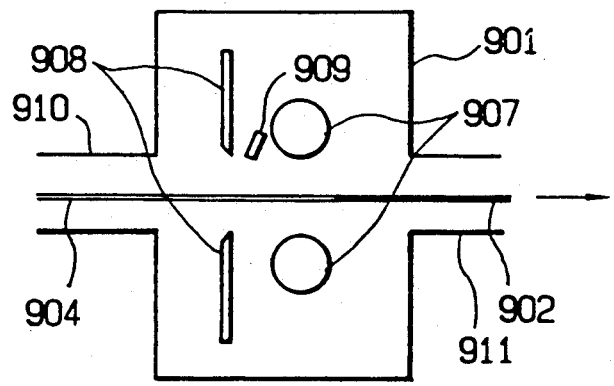

FIG. 9(v) shows a state wherein the accommodating container (not shown) is evacuated to a vacuum until little pressure differential with the film-forming chamber is attained, after which the roller 907 is removed from the band-shaped member 902 and the wall of the processing chamber 901 and the band-shaped members 902 and 904 are being wound up.

The wind-up operation of the band-shaped member is described.

FIG. 10(i) is an ordinary film-forming state wherein the respective members or tools are provided substantially symmetrically with respect to those of FIG. 9(i).

FIG. 10(ii) shows a step wherein after completion of the film formation on one batch of the band-shaped member, this member is removed for exchange with a fresh bobbin for winding up another band-shaped member to be subjected to a subsequent film-forming treatment.

Initially, the band-shaped member 1002 is stopped and the roller 1007 is moved from the position indicated by the dotted line toward the direction of the arrow until it is in intimate contact with the band-shaped member 1002 and the wall of the band-shaped member processing chamber 1001. In this condition, the band-shaped member accommodating chamber and the film-forming chamber are air-tightly separated from each other. Next, the cutting blade is moved in the direction of the arrow indicated in the figure to cut the band-shaped member 1002. The cutting blade 1008 may be one which is able to cut the band-shaped member 1002 mechanically, electrically or thermally.

FIG. 10(iii) shows a state where after completion of the film forming step of cutting and separating the film, the band-shaped member 1005 is wound up at the side of the band-shaped member accommodating container.

The cutting and winding-up steps may be carried out in vacuum or in an atmospheric leaky condition in the band-shaped member accommodating container.

FIG. 10(iv) shows a step where a fresh band-shaped member 1006 wound up about a fresh wind-up bobbin is provided and combined with the band-shaped member 1002. The band-shaped members 1006 and 1002 are brought into contact with each other at ends thereof and welded by means of a welding tool 1009.

FIG. 10(v) shows a state wherein the band-shaped member accommodating container (not shown) is exhausted in vacuum until little pressure differential with the film-forming chamber is attained, after which the roller 1007 is removed from the band-shaped member 1002 and the wall of the processing chamber 1001 and the band-shaped members 1002, 1006 are being wound up.

As is shown in FIGS. 9 and 10, while keeping the film-forming chamber in vacuum, the band-shaped member can readily be exchanged with a fresh one, leading to an improved operating efficiency. In addition, the film-forming chamber is not exposed to an atmospheric pressure and is substantially free from any water adsorption on the wall surfaces, thereby entailing stable formation of semiconductor devices with high quality.

In the practice of the invention, the film-forming chamber can be cleansed by dry etching, if necessary, while keeping a vacuum.

APPARATUS EXAMPLE 3

In this example, an arrangement of the apparatus shown in FIG. 1 to which a bias voltage applicator means is added is described.

In FIG. 2, indicated by 201 is a band-shaped member, by 202 is a central conductor of a coaxial line for applying a microwave, by 203 is a dielectric tube which is a microwave transmitting member, by 204 is a film-forming chamber, by 205 are small apertures, by 206 is a bias applicator tube serving also as a starting gas, by 207 is a vacuum exhaust port, by 208 is an outer roller for supporting the band-shaped member, by 109 is an inner roller for supporting the band-shaped member, by 210 is a slit-like opening of the film-forming chamber, by 211 is an outer roller for supporting the opening, by 212 is an inner roller for supporting the opening, by 213 are inside rings for supporting a curved portion, by 214 is an insulating joint, by 215 is a gas feed pipe, by 216 is a power supply for bias application, and by 217 is a conductive wire.

Two arrows shown in FIG. 2 indicate the flow of the starting gas.

In FIG. 2, the bias applicator means 206 serving as the starting gas introduction pipe extends into the interior of the film-forming chamber 204 and is located in the same manner as in FIG. 6 illustrated with respect to Apparatus Example 1.

The bias applicator tube 206 serving also as the starting gas introduction pipe is applied with a bias voltage generated from the power supply 216 through the conductive wire 217. The bias applicator tube 206 serving as the gas introduction pipe is insulated and separated from the gas feed pipe 215 through the insulating joint 214.

The band-shaped member 201 is grounded and is preferably uniformly grounded substantially over the entire surface of the side wall portions of the columnar film-forming chamber. Preferably, the member is grounded through a electric brush which contacts the outer roller 211, the inner roller 212, the inside rings 213 and the side wall of the band-shaped member 201.

The mechanism of introducing a microwave power or energy into the interior of the film-forming chamber 203 shown in FIG. 2 may be the same as illustrated with reference to FIG. 5 in Apparatus Example 5.

In this Apparatus Example, the bias applicator means has such an arrangement as shown in FIG. 21(a), but other types of bias applicator means having such arrangements as shown in FIGS. 21(b) to 21(d) may also be used.

APPARATUS EXAMPLE 4

Figure 4:
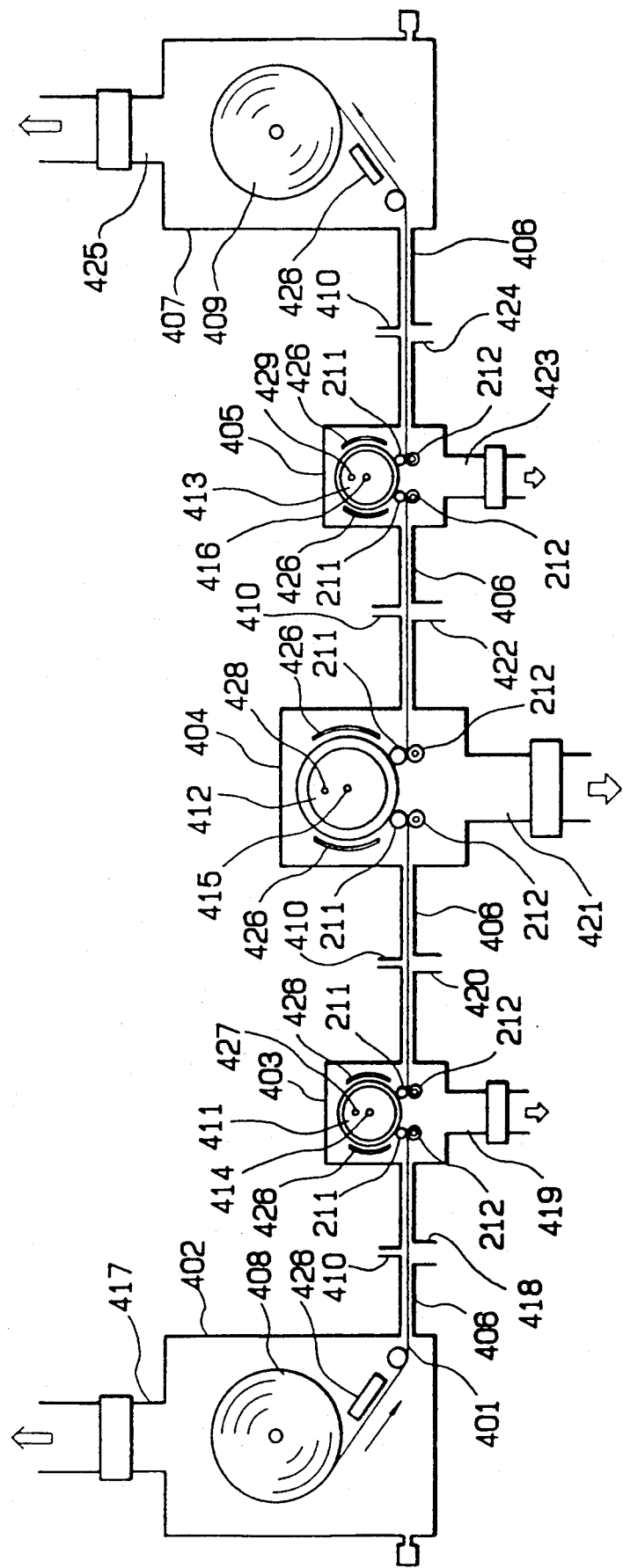

This Apparatus Example deals with a microwave plasma CVD apparatus for suitably fabricating a p-i-n photovoltaic device wherein three film-forming chambers as shown in FIG. 2 are connected and an n-type semiconductor layer, an i-type semiconductor layer and a p-type semiconductor layer are successively deposited and built-up on a continuously moving band-shaped member. FIG. 4 is a schematic sectional view of the apparatus of the type mentioned above.

In FIG. 4, indicated by 401 is a band-shaped member, by 402 is a band-shaped member carrying-in chamber, by 403 to 405 are, respectively, isolated containers, by 406 is a gas isolation passage, by 407 is a band-shaped member carrying-out chamber, by 408 is a band-shaped member feed roller, by 409 is a band-shaped member take-off roller, by 410 is a scavenging gas introduction port, by 411 to 413 are, respectively, film-forming chambers, by 414 to 416 are, respectively, microwave coaxial line introduction units, by 417 to 425 are, respectively, exhaust ports, by 426 is a temperature controller for the band-shaped member, and by 427 to 429 are bias applicator means serving also as a starting gas introduction pipe.

In FIG. 4, the isolated containers 403 to 405 may be each provided adjacently with a load lock mechanism, as illustrated in Apparatus Example 1, through a gate valve not shown. The carrying-in chamber 402 and the carrying-out chamber 407 may similarly be provided with such a load lock mechanism as set out above.

In FIG. 4, the apparatus of the invention may further comprise a heating chamber adjacent to the band-shaped member carrying-in chamber 402, a cooling chamber ahead of the carrying-out chamber 407, or a cooling or heating chamber appropriately provided in correspondence with the flow or amount of heat generated from the plasma in the inside of the film-forming chamber.

In FIG. 4, the inner diameter of the film-forming chambers 411 to 413 is so controlled that even if the thicknesses of desired deposited films may differ from each other, the transfer speed of the band-shaped member 301 is kept constant.

In FIG. 4, the gas isolation passages 306 are provided between any adjacent isolated containers, in which a scavenging gas is introduced thereinto through the scavenge gas introduction port. This is performed in the same manner as illustrated with respect to Apparatus Example 2.

In this Apparatus Example, the isolated containers 403 to 405 are provided with the bias applicator means having such an arrangement as shown in FIG. 21(a), but other types of bias applicator means having such arrangements as shown in FIGS. 21(b) to 21(d) may also be used in th respective isolated containers.

One example of semiconductor devices favorably fabricated according to the method and apparatus of the invention includes a solar cell. Typical layer constructions are schematically shown in FIGS. 14 to 17.

Figure 14:
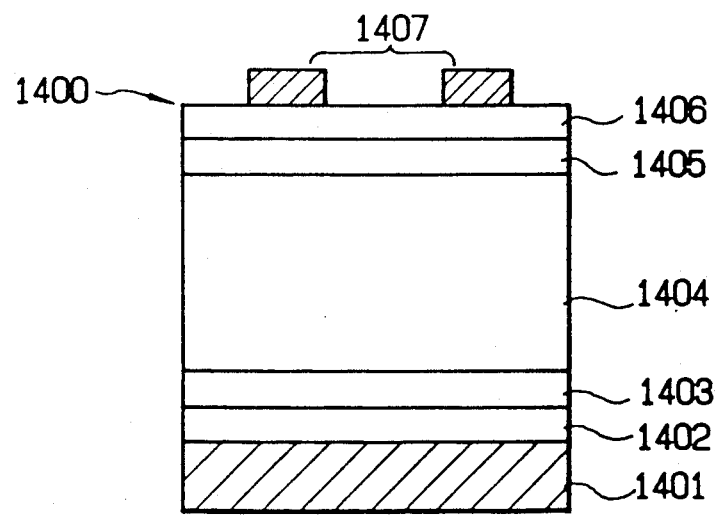

The device shown in FIG. 14 is a photovoltaic device 1400 which comprises a support 1401 on which there are formed a lower electrode 1402, an n-type semiconductor layer 1403, an i-type semiconductor layer 1404, a p-type semiconductor layer, a transparent electrode 1406 and a current collector electrode 1407 in this order. This photovoltaic device is fabricated on the assumption that light is passed from the side of the transparent electrode 1406.

The device shown in FIG. 15 is a photovoltaic device 1500 which includes, on a transparent support 1501, a transparent electrode 1506, a p-type semiconductor layer 1505, an i-type semiconductor layer 1504, an n-type semiconductor layer 1503 and a lower electrode 1502 formed in this order. This device is fabricated on the assumption that light is passed from the side of the transparent substrate 1501.

The device shown in FIG. 16 is a so-called tandem-type photovoltaic device 1613 having a two element-assembled arrangement including p-i-n junction-type photovoltaic elements 1611, 1612 wherein two semiconductor layers having different band gaps or layer thicknesses are used as the i-type layer. Indicated by 1601 is a support, on which a lower electrode 1602, an n-type semiconductor layer 1603, an i-type semiconductor 1604, a p-type semiconductor layer 1605, an n-type semiconductor layer 1608, an i-type semiconductor layer 1609, a p-type semiconductor layer 1610, a transparent electrode 1606 and a current collector electrode 1607 are formed in this order. This photovoltaic device is fabricated on the assumption that light is passed from the side of the transparent electrode 1606.

Figure 17:
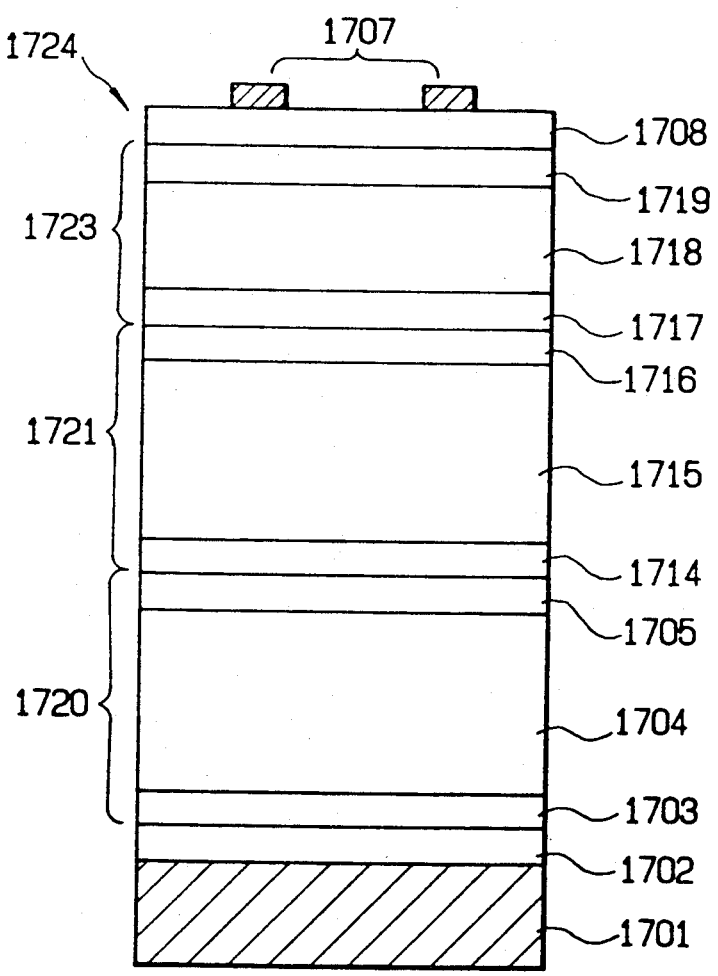
Figure 18:
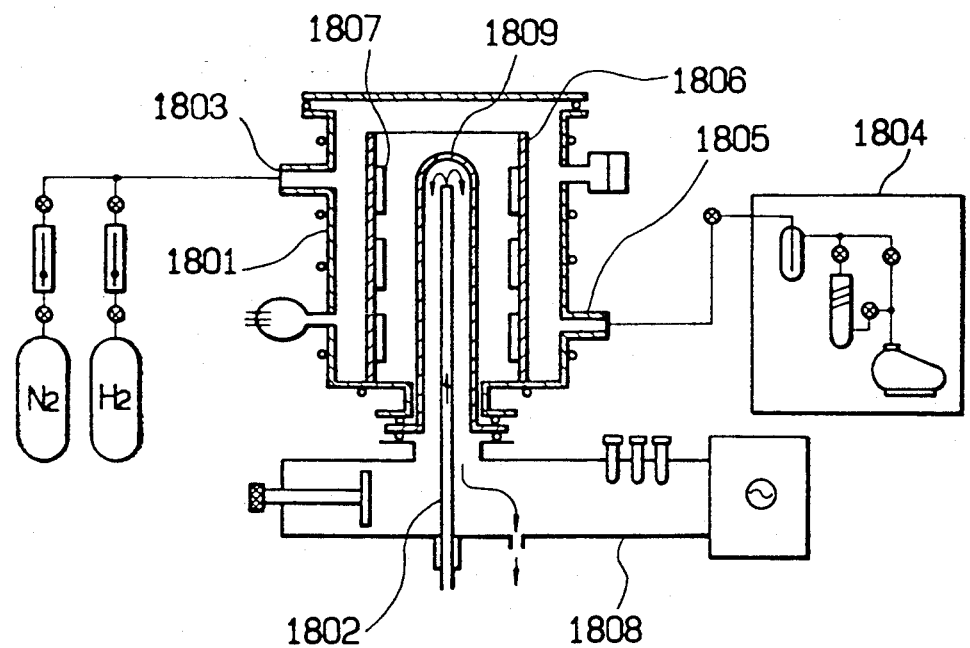
FIGS. 18 and 19 are, respectively, illustrative views of known microwave antenna systems.
Figure 19:
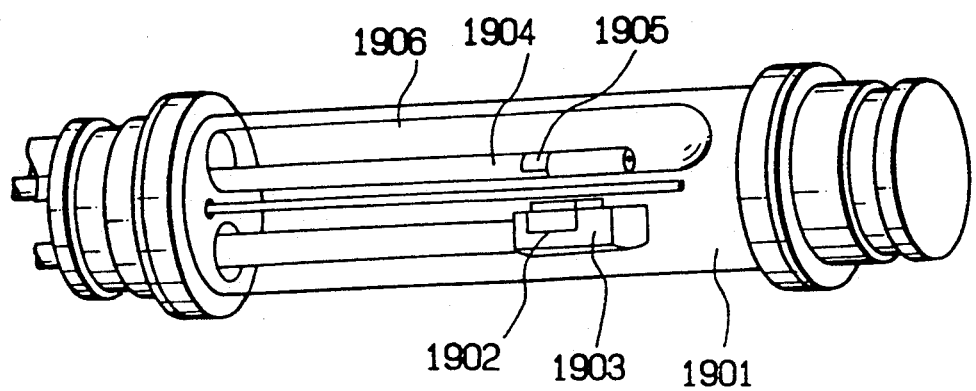

The device shown in FIG. 17 is a so-called triple photovoltaic device 1724 having a three element built-up arrangement including p-i-n junction photovoltaic elements 1720, 1721 and 1722 wherein three semiconductor layers having different band gaps and/or layer thicknesses. On a support 1701 are formed, in the following order, a lower electrode 1702, an n-type semiconductor layer 1703, an i-type semiconductor layer 1704, a p-type semiconductor layer 1705, an n-type semiconductor layer 1714, an i-type semiconductor layer 1715, a p-type semiconductor layer 1716, an n-type semiconductor layer 1717, an i-type semiconductor layer 1718, a p-type semiconductor layer 1719, a transparent electrode 1706 and a current collector electrode 1707. This photovoltaic device is fabricated on the assumption that light is passed from the side of the transparent electrode 1706.

In all the photovoltaic devices, the n-type semiconductor layer and the p-type semiconductor layer may be reversed depending on the purpose.

The respective constituents of these photovoltaic devices are described.

SUPPORT

The supports 1401, 1501, 1601 and 1701 used in the present invention should preferably be made of materials which are flexible and are able to be shaped as curved and should also be electrically conductive. These supports may be optically transparent or opaque. However, if light is passed from the side of the support 1401, 1501, 1601 or 1701, it should be transparent.

In particular, the materials for the band-shaped member used in the present invention are mentioned. The solar cell using the substrate results in light weight, an improvement in strength and savings of a transport space.

ELECTRODE

In the photovoltaic devices of the invention, an appropriate electrode is selected depending on the shape or configuration of the device. These electrodes include a lower electrode, an upper electrode (transparent electrode) and a current collector electrode and the like. It will be noted that the term "upper electrode" is intended to mean one which is provided at a light incident side and the term "lower electrode" means one which is provided at opposite side relative to the upper electrode via semiconductor layers.

These electrodes are described in more detail.

(i) Lower Electrode

The lower electrodes 1402, 1502, 1602 and 1702 used in the present invention are formed in different ways since the side of irradiating light for generation of photovoltaic force differs depending on whether or not the material for the support 1401, 1501, 1601 or 1701 is optically transparent. For instance, when the support 1401 is made of a non-transparent material such as a metal, light is irradiated from the side of the transparent electrode 1406 as shown in FIG. 14.

More particularly, when the layer construction as shown in FIG. 14 is used, the lower electrode 1402 is provided between the support 1401 and the n-type semiconductor 1403. On the contrary, when the support 1401 is conductive, the support may serves also as the lower electrode. If, however, the support is conductive but has a high sheet resistance, the electrode 1402 may be provided as a low resistance electrode through which the current is passed or for the purpose of increasing the reflectance at the support surface and effectively utilizing incident light. This true of the cases of FIGS. 16 and 17.

With the case of FIG. 15, the optically transparent support 1501 is used, light is passed from the side of the support 1501, the lower electrode 1502 is provided at a side opposite to the support 1501 by intervening the semiconductor layers therebetween for the purposes of current passage and light reflection at the electrode.

When the support 1501 is made of an insulating material, the lower electrode 1502 may be provided between the support 1501 and the n-type semiconductor layer 1503 for use as an electrode for current passage.

The electrode materials include, for example, metals such as Ag, Au, Pt, Ni, Cr, Cu, Al, Ti, Zn, Mo, W and the like or alloys thereof. The thin film of the metal or alloy is formed by vacuum deposition, electron beam deposition, sputtering or the like. Care should be taken to the formed metallic thin film in order that the film does not act as resistance component against th output of the photovoltaic device. The thin film should preferably have a sheet resistance of not larger than $50\Omega$, more preferably not larger than $10\Omega$.

Although not shown in the figures, a diffusion preventive layer such as of conductive zinc oxide may be provided between the lower electrode 1402, 1502, 1602 or 1702 and the n-type semiconductor layer 1403, 1503, 1603 or 1703. The diffusion preventive layer has not only an effect of preventing the metal element constituting the electrode 1402, 1502, 1602 or 1702 from diffusion into the n-type semiconductor layer, but also an effect of preventing short-circuiting caused by defects, such as pinholes, between the lower electrode 14028 1502, 1602 or 1702 and the transparent electrode 1406, 1506, 1606 or 1706. These electrodes are provided to sandwich the semiconductor layers therebetween in order to impart a slight resistance. Further, the diffusion preventive layer has an additional effect of producing a multiple interference by the thin film thereby confining the incident light within the photovoltaic device.

(ii) Upper Electrode (Transparent Electrode)

The transparent electrode 1406, 1506, 1606 or 1706 used in the present invention should preferably have a light transmittance of not less than 85% in order to cause light from sun or white fluorescent lamps to be absorbed in the semiconductor layers. Moreover, the electrode should not be a resistance component against the output of the photovoltaic device and should preferably have a sheet resistance of not larger than $100\Omega$. Materials having such characteristics as set forth above include, for example, metal oxides such s $SnO_2$, $In_2O_3$, ZnO, CdO, $Cd_2SnO_4$, ITO ($In_2O_3 + SnO_2$) and the like, and metals such as Au, Al, Cu and the like. Very thin, semi-transparent films of these materials are used as the electrode. In FIGS. 14, 16 and 17, the transparent electrode is built up on the p-type semiconductor layer 1405, 1605 or 1705 and is deposited on the substrate 1501 in FIG. 15. Accordingly, choice of the material should depend on the adhesion to such a layer or substrate as mentioned above. The deposition techniques include vacuum deposition by resistance heating, vaccum deposition by electron beam heating, sputtering, spraying and the like. If desired, these may be used in combination.

(iii) Current Collector Electrode

The current collector electrode 1407, 1507, 1607 or 1707 used in the present invention is formed on the transparent electrode 1406, 1506, 1606 or 1706 so as to reduce the surface resistance of the transparent electrode 1406, 1506, 1606 or 1706. The electrodes are thin films of metals such as Ag, Cr,Ni, Al, Ag, Au, Ti, Pt, Cu, Mo, W and the like, and alloys thereof. The shape and area are suitably designed to allow a satisfactory amount of light incidence into the semiconductor layers.

For instance, it is preferred that the shape is uniformly spread relative to the light-receiving face of the photovoltaic device and that the area relative to the light-receiving area is not larger than 15%, more preferably not larger than 10%.

The sheet resistance should preferably be not larger than 50Ω, more preferably not larger than 10Ω.

I-TYPE SEMICONDUCTOR LAYER

Favorable semiconductor materials used to form the i-type semiconductor layer in the photovoltaic device of the invention include, for example, semiconductors of group IV and alloy semiconductors of group IV such as a-Si:H, a-Si:F, a-SiGe:H:F, poly-Si:H, poly-Si:F, poly-Si:H:F and the like, and compound semiconductos of groups II-VI and groups III-V.

P-TYPE SEMICONDUCTOR LAYER AND N-TYPE SEMICONDUCTOR LAYER

Semiconductor materials for constituting the p-type and n-type semiconductor layers used favorably in the photovolatic devices of the invention are those semiconductor materials for the i-type semiconductor layer in which valence controlling agents are doped.

FILM-FORMING EXAMPLES

Specific film-forming examples using the microwave plasma CVD apparatus of the invention are described, which should not be construed as limiting the invention thereto.

FILM-FORMING EXAMPLE 1

An amorphous silicon film was continuously deposited by the use of a continuous microwave plasma apparatus (FIG. 3) illustrated in Apparatus Example 2.

A band-shaped member feed roller 308 about which a sufficiently defatted and washed SUS430BA band-shaped member (46 cm wide×100 m long×0.2 mm thick) was wound was set in the band-shaped member carrying-in chamber 302 having a feed mechanism. The band-shaped member 301 was passed to the member carrying-out chamber 307 having the band-shaped member take-off roller 309 via the gas isolation passage 306 and the opening support outer roller 111, the opening support inner roller 112 and the curved portion support inner rings 113 in the respective isolated containers 303 to 305 while controlling the tension so that little deflection took place. The conditions such as of curving of the band-shaped member are shown in Table 7.

The carrying-in chamber 301, the carrying-out chamber 307 and the isolated containers 303 to 305 were roughly evacuated by means of a rotary pump, not shown. Subsequently, a mechanical booster pump not shown was started, followed by drawing a vacuum to about $10^{-3}$ Torr. Thereafter, the temperature control mechanism 326 alone mounted in the isolated container 304 was operated, by which the surface temperature of the substrate was maintained at 250° C. under which an oil diffusion pump (HS-32, made by Barian), not shown, was used for evacuation to a vacuum of not higher than $5\times10^{-6}$ Torr.

At the time when the gas was sufficiently evacuated, 1200 sccm of $SiH_4$, 2 sccm of $SiF_4$ and 100 sccm of $H_2$ were introduced from the gas introduction pipe 106, and the pressure within the film-forming chamber 312 was maintained at 25 mTorr while controlling an opening of the throttle valve attached to the oil diffusion pump. At this time, the pressure in the isolated container 304 was found to be 8 mTorr. When the pressure was stabilized, a microwave with an effective power of 1.5 kW was radiated from the central conductor 102 by the use of a microwave power supply not shown. Immediately, the introduced gases were converted into plasmas to form a plasma region in the film-forming chamber 312.

The opening support outer roller 111, the opening support inner roller 112 and the curved portion support inner rings 113 (drive mechanisms therefor not shown) were started so that the transfer speed of the band-shaped member was controlled at 45 cm/minute.

It will be noted that $H_2$ gas used as a scavenging gas was passed from the scavenging gas introduction port 310 to the gas isolation passage 306 at 50 sccm. For 30 minutes after commencement of the transfer, a deposited film was continuously formed. Since the elongated band-shaped member was used, further deposited films were subsequently formed after completion of this film-forming procedure. After completion of all depositions, the band-shaped member was cooled and withdrawn. The distribution in thickness of the deposited film formed on the band-shaped member in this Film-forming Example was measured along its width and length, revealing the distribution within 5% and an average deposition rate of 100 angstroms/second. Part of the deposited film was cut off and subjected to the measurement of IR absorption spectrum by a reflection method using FT-IR (1720X, available from Perkin-Elmer Inc.), with the result that there were recognized absorptions at 2000 $cm^{-1}$ and 630 $cm^{-1}$ with an absorption pattern inherent to the a-Si:H:F film. Moreover, the crystallinity of the film was evaluated using RHEED (JEM-100SX, available from Nippon Denshi K.K.), with a result of a halo phenomenon from which the film was found to be amorphous. The amount of hydrogen in the film was quantitatively determined by the use of a hydrogen-in-metal analyzer (EMGA-1100, available from Horiba Seishakusho K.K.), revealing that the amount was 20±2 atomic %.

FILM-FORMING EXAMPLE 2

Following the deposited film-forming step carried out in Film-forming Example 1, the introduction of the starting gases used was stopped. Thereafter, an amorphous silicon germanium film was continuously deposited under the same film-forming conditions as in Film-forming Example 1 except that the isolated container 304 was evacuated to an inner pressure of $5\times10^{-6}$ Torr, followed by introducing 25 sccm of $SiH_4$, 22 sccm of $GeH_4$, 1.5 sccm of $SiF_4$ and 55 sccm of $H_2$ from the gas introduction pipe 106 and that the inner pressure of the film-forming chamber 312 was maintained at 22 mTorr and the microwave power was 0.8 kW.

After completion of the film formation in this Film-forming Example and other film formation, the band-shaped member was cooled and withdrawn. The distribution in thickness of the deposited film formed according to this Film-forming Example was measured along its width and length, revealing the distribution within 5% and an average deposition rate of 40 angstroms/second.

Part of the deposited film was cut off and subjected to the measurement of IR absorption spectrum by a reflection method using FT-IR (1720X, available from Perkin-Elmer Inc.), with the result that there were recognized absorptions at 2000 cm$^{-1}$, 1880 cm$^{-1}$ and 630 cm$^{-1}$ with an absorption pattern inherent to the a-SiGe:H:F film. Moreover, the crystallinity of the film was evaluated using RHEED (JEM-100SX, available from Nippon Denshi K.K.), with a result of a halo phenomenon from which the film was found to be amorphous. The amount of hydrogen in the film was quantitatively determined by the use of a hydrogen-in-metal analyzer (EMGA-1100, available from Horiba Seishakusho K.K.), revealing that the amount was $14\pm2$ atomic %.

FILM-FORMING EXAMPLE 3

Following the deposited film-forming step carried out in Film-forming Example 1, the introduction of the starting gases used was stopped. Thereafter, an amorphous silicon carbide film was continuously deposited under the same film-forming conditions as in Film-forming Example 1 except that the isolated container 304 was evacuated to an inner pressure of $5\times10^{-6}$ Torr, followed by introducing 55 sccm of SiH$_4$, 8 sccm of CH$_4$, 2 sccm of SiF$_4$ and 200 sccm of H$_2$ from the gas introduction pipe 106 and that the inner pressure of the film-forming chamber 312 was maintained at 27 mTorr.

After completion of the procedures of this Film-forming Example and other film formation, the band-shaped member was cooled and withdrawn. The distribution in thickness of the deposited film formed according to this Film-forming Example was measured along its width and length, revealing the distribution with 5% and an average deposition rate of 51 angstroms/second.

Part of the deposited film was cut off and subjected to the measurement of IR absorption spectrum by a reflection method using FT-IR (172X, available from Perkin-Elmer Inc.), with the result that there were recognized absorptions at 2080 cm$^{-1}$, 1250 cm$^{-1}$, 960 cm$^{-1}$, 777 cm$^{-1}$ and 660 cm$^{-1}$ with an absorption pattern inherent to the a-SiC:H:F film. Moreover, the crystallinity of the film was evaluated using RHEED (JEM-100SX, available from Nippon Denshi K.K.), with a result of a halo phenomenon from which the film was found to be amorphous. The amount of hydrogen in the film was quantitatively determined by the use of a hydrogen-in-metal analyzer (EMGA-1100, available from Horiba Seishakusho K.K.), revealing that the amount was $13\pm2$ atomic %.

FILM-FORMING EXAMPLE 4

Following the deposited film-forming step carried out in Film-forming Example 1, the introduction of the starting gases used was stopped. Thereafter, a p-type microcrystalline silicon film was continuously deposited under the same film-forming conditions as in Film-forming Example 1 except that the isolated container 304 was evacuated to an inner pressure of $5\times10^{-6}$ Torr, followed by introducing 50 sccm of SiH$_4$, 12 sccm of BF$_3$ (diluted with 3000 ppm of H$_2$), 3 sccm of SiF$_4$ and 200 sccm of H$_2$ from the gas introduction pipe 106 and that the inner pressure of the film-forming chambeer 312 was maintained at 35 mTorr and the microwave power was 1.8 kW.

After completion of the procedures of this Film-forming Example and other film formation, the band-shaped member was cooled and withdrawn. The distribution in thickness of the deposited film formed according to this Film-forming Example was measured along its width and length, revealing the distribution within 5% and an average deposition rate of 39 angstroms/second.

Part of the deposited film was cut off and subjected to the measurement of IR absorption spectrum by a reflection method using FT-IR (1720X, available from Perkin-Elmer Inc.), with the result that there were recognized absorptions at 2100 cm$^{-1}$ and 630 cm$^{-1}$ with an absorption pattern inherent to the $\mu$ C-Si:H:F film. Moreover, the crystallinity of the film was evaluated using RHEED (JEM-100SX, available from Nippon Denshi K.K.), revealing a ring form, from which the film was found to be non-oriented and polycrystalline. The amount of hydrogen in the film was quantitatively determined by the use of a hydrogen-in-metal analyzer (EMGA-1100, available from Horiba Seishakusho K.K.), revealing that the amount was $6\pm1$ atomic %.

FILM-FORMING EXAMPLE 5

Following the deposited film-forming step carried out in Film-forming Example 1, the introduction of the starting gases used was stopped. Thereafter, an n-type amorphous silicon film was continuously deposited under the same film-forming conditions as in Film-forming Example 1 except that the isolated container 304 was evacuated to an inner pressure of $5\times10^{-6}$ Torr, followed by introducing 85 sccm of SiH$_4$, 10 sccm of PH$_3$ (diluted with 1% of H$_2$), 3 sccm of SiF$_4$ and 30 sccm of H$_2$ from the gas introduction pipe 106 and that the inner pressure of the film-forming chamber 312 was maintained at 40 mTorr and the microwave powder was 1.1 kW.

After completion of the procedures of this Film-forming Example and Other film formation, the band-shaped member was cooled and withdrawn. The distribution in thickness of the deposited film formed according to this Film-forming Example was measured along its width and length, revealing the distribution within 5% and an average deposition rate of 68 angstroms/second.

Part of the deposited film was cut off and subjected to the measurement of IR absorption spectrum by a reflection method using FT-IR (1720X, available from Perkin-Elmer Inc.), with the result that there were recognized absorptions at 2100 cm$^{-1}$ and 630 cm$^{-1}$ with an absorption pattern inherent to the a-Si:H:F film. Moreover, the crystallinity of the film was evaluated using RHEED (JEM-100SX, available from Nippon Denshi K.K.), revealing a halo, from which the film was found to be amorphous. The amount of hydrogen in the film was quantitatively determined by the use of a hydrogen-in-metal analyzer (EMGA-1100, available from Horiba Seishakusho K.K.), revealing that the amount was $21\pm2$ atomic %.

FILM-FORMING EXAMPLE 6

The general procedure of Film-forming example 1 was repeated except that there was used, instead of the SUS430BA band-shaped member, a PET (polyethylene terephthalate band-shaped member 301 (46 cm wide × 100 m long × 0.8 mm thick) and the substrate surface temperature was 210° C., thereby continuously depositing an amorphous silicon film.

The band-shaped member was cooled and withdrawn. The distribution the film thickness was measured along its width and length, revealing the distribution within 5% and an average deposition rate of 98 angstroms/second. Part of the deposited film was cut off and subjected to the measurement of IR absorption spectrum by a reference transmission method using FT-IR (1720X, available from Perkin-Elmer Inc.), with the result that there were recognized absorptions at 2000 cm$^{-1}$ and 630 cm$^{-1}$ with an absorption pattern inherent to the a-Si:H:F film. The amount of hydrogen in the film was quantitatively determined from the absorption attributed to the Si-H in the vicinity of 2000 cm$^{-1}$, revealing that the amount was 25±2 atomic %.

Moreover, the crystallinity of the film was evaluated using RHEED (JEM-100SX, available from Nippon Denshi K.K.), revealing a halo, from which the film was found to be amorphous.

Twenty portions of the film were randomly cut off and were each subjected to vacuum deposition with an Al comb-type gap electrode (250 μm in width, 5 mm in length) by a vacuum deposition method using resistance heating, followed by measurement of a photocurrent under irradiation with AM-1 light (100 mW/cm$^2$) and a dark current in the dark by the use of HP4140B to determine a photoconductivity, $\sigma_p$ (S/cm), and the dark conductivity, $\sigma_d$ (S/cm). These conductivities were, respectively, within ranges of $5.0\pm0.5)\times10^{-5}$ S/cm and $(1.5\pm0.5)\times10^{-11}$ S/cm.

FILM-FORMING EXAMPLE 7

Figure 13:
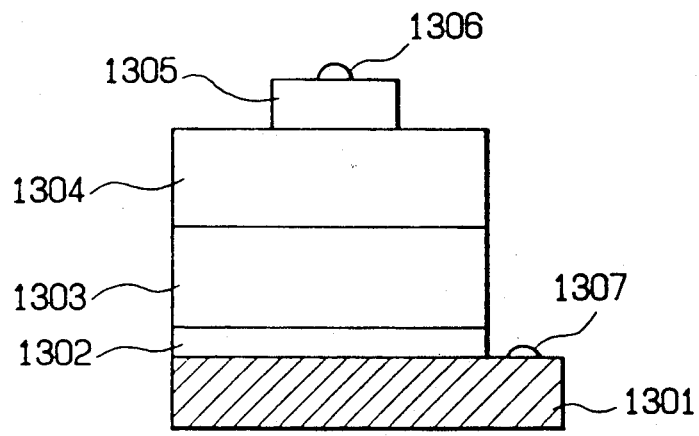

In this example, a band-shaped member was transferred by means of the apparatus of FIG. 3 at a rate of 48 cm/minute to fabricate a Schottky diode having a layer structure as shown in FIG. 13. In FIG. 13, indicated by 1301 is a stainless steel band-shaped member, by 1302 is a Cr deposited layer (0.2 μm in thickness, hereinafter referred to simply as n$^+$-Si layer), by 1304 is a non-doped a-Si:H layer (0.4 μm in thickness, hereinafter referred to simply as i-Si layer), by 1305 is a gold deposited layer (100 angstroms in thickness), and by 1306 and 1307 are electric connection terminals.

The fabrication procedure is described below.

A 1000 angstrom thick Cr layer 1302 was formed on the band-shaped member 1301, which had been washed in the same manner as in Film-forming Example 1, by the use of a continuous vacuum deposition apparatus. Subsequently, the band-shaped member 1301 was set in the microwave plasma CVD apparatus of the invention shown in FIG. 3 so that the side on which the Cr layer had been formed was turned downward as viewed in the figure, followed by the same operations as in Film-forming Example 1 under film-forming conditions indicated in Table 8, thereby forming an n$^+$-Si layer 1303.

After the continuous film formation over 20 minutes, the formation of the n$^+$-Si layer 1303 was completed, followed by stopping the application of the microwave power and the introduction of the SiH$_4$ and H$_2$-diluted PH$_3$. Thereafter, the isolated container 303 was evacuated to a pressure of $1\times10^{-6}$ Torr.

Thereafter, the band-shaped member 301 wound up on the take-off roller 308 was transferred reversely from the right side toward the left side as viewed in the figure, under which the i-Si layer 1304 was continuously formed for 20 minutes according to the procedure described above under film-forming conditions indicated in Table 8. The transfer rate was 48 cm/minute.

After completion of the formation of the i-Si layer 1304, the band-shaped substrate 301 was withdrawn from the carrying-out chamber 302 according to the procedure described hereinbefore.

The average of the total thickness of the n$^-$-Si layer and the i-Si layer was about 0.6 μm and the uniformity within the plane was as good as ±4%.

Sample pieces were optionally cut off from twenty portions of the band-shaped member 301 and each set in a vacuum deposition apparatus, followed by forming a gold deposited film 1305 with a diameter of 5 mmφ and a thickness of 100 angstroms on the i-Si layer 1304.

The gold deposited film and the Cr deposited film were, respectively, subjected to pressure welding with electric connection terminals 1306, 1307 to determine the characteristics of the Schottky diode. As a result, it was found that it had a good diode characteristic of a diode factor, n=1.14±0.05. The uniformity in the characteristic in the plane was also good.

FILM-FORMING EXAMPLE 8

Using the continuous microwave plasma CVD apparatus of the invention shown in FIG. 3, a p-i-n type a-Si solar cell having a layer structure shown in FIG. 14 was continuously fabricated.

In FIG. 14, indicated by 1401 is a stainless steel (SUS430BA) band-shaped member, by 1402 is a lower electrode made of two layers of Al and Cr, by 1403 is an n-type a-Si layer (n-Si), by 1404 is an i-type a-Si layer (i-Si), by 1405 is a p-type microcrystalline Si layer (hereinafter referred to simply as p-type μ x-Si layer), by 1406 is a transparent electrode and by 1407 is an aluminium current collector electrode.

The stainless steel (SUS430BA) band-shaped member was sufficiently washed and defatted, after which Al and Cr were continuously vacuum deposited by the use of a continuous vacuum deposition apparatus, not shown, thereby forming the lower electrode 1402. The band-shaped member 301 on which the lower electrode 1402 had been formed was set in the apparatus of FIG. 3 so that the side on which the lower electrode 1402 had been formed was turned downward as viewed in the figure. According to the procedure described hereinbefore, deposited films of n-Si (300 angstroms), i-Si (4000 angstroms) and p-type μ x-Si (100 angstroms) were continuously formed in this order under conditions indicated in Table 9.

The film-forming rates of the respective layers were 20 angstroms/second for the n-Si layer, 100 angstroms/second for the i-Si layer and 6 angstroms/second for the p-Si layer.

The indium tin oxide film 1406 (ITO) was vacuum deposited on the p-type μ x-Si layer as a transparent electrode, followed by vacuum deposition of the Al electrode 1407 as a current collector electrode and coating of a resin as a surface protective layer, thereby fabricating a solar cell having the layer structure of FIG. 14. The thus fabricated solar cell was subjected to measurement with a solar simulator with AM of 1.5

(100 mW/cm$^2$), with the result that the photoelectric conversion efficiency was 8.3% on average and, thus, a good characteristic was obtained.

COMPARATIVE FILM-FORMING EXAMPLE 1

Figure 20:
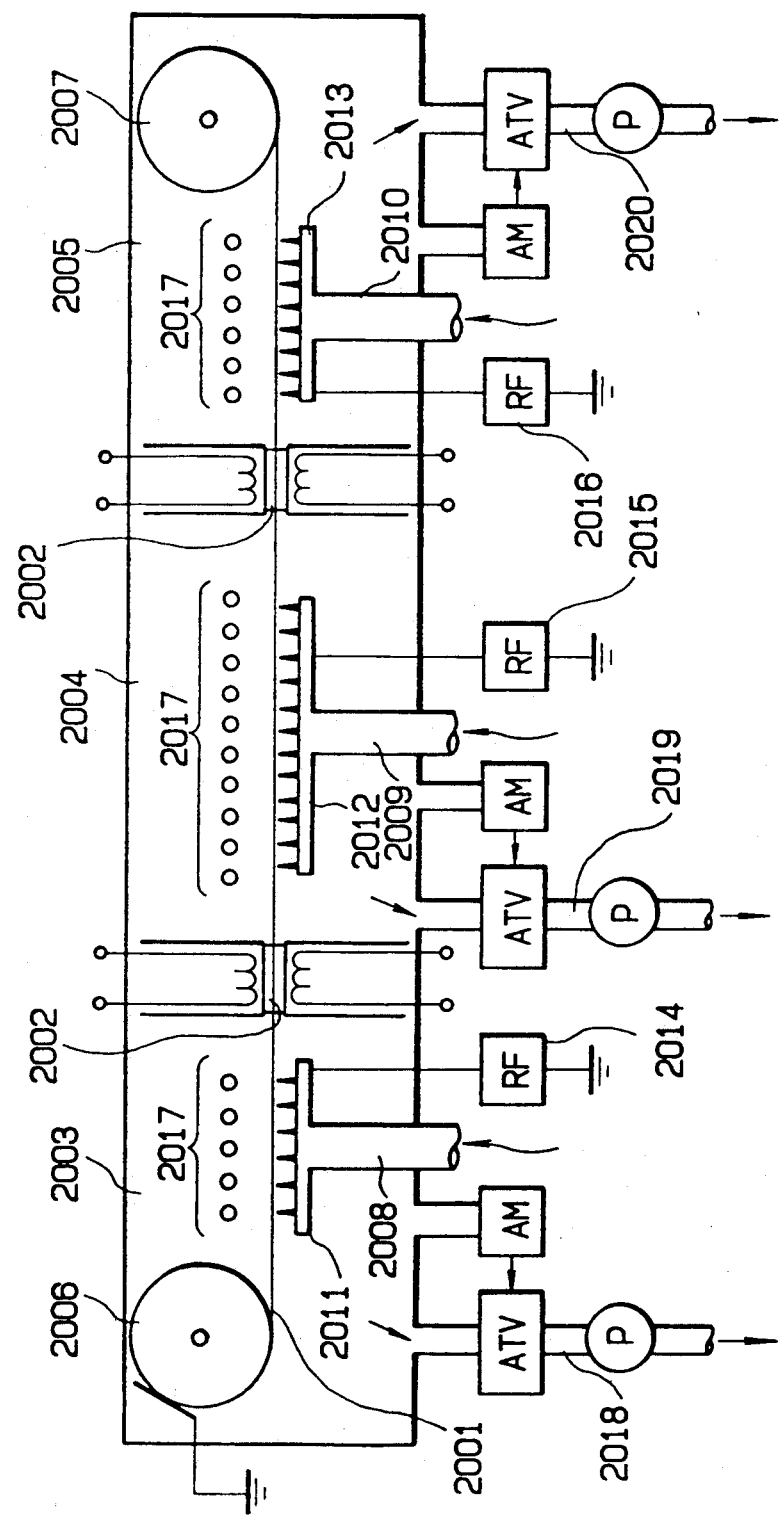
FIG. 20 is an illustrative view of a known roll-to-roll continuous film formation apparatus.

In this comparative example, a solar cell having a layer structure shown in FIG. 14 was continuously fabricated by the use of the known roll-to-roll continuous film-forming apparatus of the RF system shown in FIG. 20 and described in Japanese Laid-open Patent Application No. 58-70524.

In FIG. 20, indicated by 2001 is a band-shaped member, by 2002 is a gas isolation passage, by 2003 to 2005 are film-forming chambers, by 2006 and 2007 are stainless steel band-shaped member rolls, by 2008 to 2010 are starting gas introduction pipes, by 2011 to 2013 are juxtaposed flat plate RF electrodes, by 2014 to 2016 are RF power supplies, by 2017 is an IR lamp heater, and by 2018 to 2020 are gas exhaust ports.

The roll-to-roll continuous film-forming apparatus utilizing the RF glow discharge decomposition method of FIG. 20 and the deposited film forming apparatus of the invention shown in FIG. 3 and illustrated in Film-forming Example 8 can be both operated in the same procedure using either the microwave or the RF device. Accordingly, the operation procedure is not described herein.

The results of the fabrication of the solar cell by the roll-to-roll continuous film-forming apparatus of FIG. 20 are shown in Table 10 in comparison with the results of Film-forming Example 8.

As will become apparent from Table 10, the deposition rate attained by the microwave CVD apparatus of the invention is higher by three times than that of the RF glow discharge decomposition method, so that the transfer rate or production rate can be increased to three times greater. In addition, the utilization efficiency of the gases can be increased to about four times greater.

FILM-FORMING EXAMPLE 9

A p-i-n type a-Si/a-SiC solar cell having a layer structure shown in FIG. 14 was continuously fabricated by the use of the continuous microwave CVD apparatus of the invention shown in FIG. 3. In FIG. 14, reference numeral 1404 is changed to indicate an i-SiC layer and reference numeral is changed to indicate a p-type $\mu$ x-SiC layer. The general procedure of Film-forming Example 8 was repeated under film-forming conditions indicated in Table 11 except for the above changes, thereby forming deposited films of n-Si (300 angstroms), i-SiC (2000 angstroms) and p- $\mu$ x-SiC (100 angstroms) in this order.

As a result, the deposition rate of the respective semiconductor layers were found to be 13 angstroms/second for the n-Si layer, 75 angstroms/second for the i-Si layer and 4 angstroms/second for the p- $\mu$ x-SiC layer, respectively.

The utilization efficiency of the starting gases at the time of the formation of the i-Si layer was 50%. The results of the evaluation by measurement with a solar simulator as used in Film-forming Example 8 revealed that the photoelectric conversion efficiency was 6.0% on average.

The variation of the photoelectric conversion efficiency after continuous irradiation of AM 1.5 (100 mW/cm$^2$) light over 500 hours relative to the initial value was found to be within 9%.

FILM-FORMING EXAMPLE 10

A tandem-type solar cell having a layer structure shown in FIG. 16 was continuously fabricated by the use of an apparatus (not shown) wherein three further film-forming chambers are connected between the film-forming chamber 305 of the continuous microwave CVD apparatus shown in FIG. 3 and the band-shaped member carrying-out chamber 307.

In FIG. 16, indicated by 1601 is a stainless steel band-shaped member, by 1602 is a lower electrode constituted of a two-layer structure of an Al electrode and an Ag reflection layer, by 1603 is a first n-type a-Si layer, by 1604 is a first i-type amorphous silicon germanium (i-a-SiGe) layer, by 1605 is a first p-type $\mu$ x-Si layer, by 1608 is a second n-type a-Si layer, by 1609 is a second i-a-Si layer, by 1610 is a second p-type $\mu$ x-Si layer, by 1606 is a transparent conductive film, and by 1607 is a pattern of an Al current collector.

The solar cell was continuously fabricated under film-forming conditions indicated in Table 12 and in the same manner as described in Apparatus Example 2.

As a result, the deposition rates for the respective layers were found to be 13 angstroms/second for the n$^+$-Si layer, 75 angstroms/second for the i-SiGe layer, 4 angstroms/second for the p$^+$- $\mu$ x-Si layer, aa angstroms/second for the n$^+$-Si layer, 125 angstroms/second for the i-Si layer, and 4 angstroms/second for the p$^+$- $\mu$ x-Si layer. The utilization efficiencies of the starting gases for the i-SiGe layer and the i-Si layer were, respectively, 65% and 55%. The results of the measurement with a solar simulator as used in Film-forming Example 8 revealed that the photoelectric conversion efficiency was 6.3% on average.

The variation of the photoelectric conversion efficiency after continuous irradiation of AM 1.5 (100 mW/cm$^2$) light over 500 hours relative to the initial value was found to be within 9%.

FILM-FORMING EXAMPLE 11

An amorphous silicon film was continuously formed by the use of a continuous microwave plasma CVD apparatus (FIG. 4) illustrated in Apparatus Example 4.

A band-shaped member feed roller 408 about which a sufficiently defatted and washed SUS430BA band-shaped member (46 cm wide × 100 m long × 0.2 mm thick) was wound was set in the band-shaped member carrying-in chamber 402 having a feed mechanism. The band-shaped member 401 was passed to the member carrying-out chamber 407 having the band-shaped member take-off roller 409 via the gas isolation passage 406 and the opening support outer roller 211, the opening support inner roller 212 and the curved portion support inner rings 213 in the respective isolated containers 403 to 405 while controlling the tension so that little deflection took place. The conditions such as of curving of the band-shaped member are similar to those shown in Table 7.

The carrying-in chamber 401, the carrying-out chamber 407 and the isolated containers 403 to 405 were roughly evacuated by means of a rotary pump, not shown. Subsequently, a mechanical booster pump not shown was started, followed by drawing a vacuum to about 10$^{-3}$ Torr. Thereafter, the temperature control mechanism 426 alone mounted in the isolated container 404 was operated, by which the surface temperature of the substrate was maintained at 250° C. under which an oil diffusion pump (HS-32, made by Barian), not shown, was used for evacuation to a vacuum of not higher than $5 \times 10^{-6}$ Torr.

At the time when the gas was sufficiently evacuated, 140 sccm of SiH$_4$, 2 sccm of SiF$_4$ and 80 sccm of H$_2$ were introduced from the bias applicator tube 428 serving also as a gas introduction pipe, and the pressure within the film-forming chamber 412 was maintained at 24 mTorr while controlling an opening of the throttle valve attached to the oil diffusion pump. At this time, the pressure in the isolated container 404 was found to be 8 mTorr. When the pressure was stabilized, a microwave with an effective power of 1.4 kW was radiated from the central conductor 102 by the use of a microwave power supply not shown. Immediately, the introduced gases were converted into plasmas to form a plasma region in the film-forming chamber 412.

When a DC voltage of +70 V was applied from the power supply 216 for bias application through the conductive wire 217 to the bias applicator tube 428 serving as the gas introduction pipe, a bias current of 6.7 A passed. Visual observation revealed that the luminance of the plasma slightly increased.

The opening support outer roller 211, the opening support inner roller 212 and the curved portion support inner rings 213 (drive mechanisms therefor not shown) were started so that the transfer speed of the band-shaped member was controlled at 45 cm/minute. After commencement of the transfer, the plasma remained stable without any changes in the bias voltage and current.

It will be noted that H$_2$ gas used as a scavenging gas was passed from the scavenging gas introduction port 410 to the gas isolation passage 4306 at 50 sccm. For 30 minutes after commencement of the transfer, a deposited film was continuously formed. Since the elongated band-shaped member was used, further deposited films were subsequently formed after completion of this film-forming procedure. After completion of all depositions, the band-shaped member was cooled and withdrawn. The distribution in thickness of the deposited film formed on the band-shaped member in this Film-forming Example was measured along its width and length, revealing the distribution within 5% and an average deposition rate of 115 angstroms/second. Part of the deposited film was cut off and subjected to the measurement of IR absorption spectrum by a reflection method using FT-IR (1720X, available from Perkin-Elmer Inc.), with the result that there were recognized absorptions at 2000 cm$^{-1}$ and 630 cm$^{-1}$ with an absorption pattern inherent to the a-Si:H:F film. Moreover, the crystallinity of the film was evaluated using RHEED (JEM-100SX, available from Nippon Denshi K.K.), with a result of a halo phenomenon, from which the film was found to be amorphous. The amount of hydrogen in the film was quantitatively determined by the use of a hydrogen-in-metal analyzer (EMGA-1100, available from Horiba Seishakusho K.K.), revealing that the amount was 21±2 atomic %.

The amorphous silicon film formed by deposition on the band-shaped member was mechanically removed over a region of about 5 cm$^2$ to measure its volume. Subsequently, a spin density was measured by the use of the ESR apparatus (JES-RE2X, available from Nippon Denshi K.K.), from which it was found that the density was $3.5 \times 10^{15}$ spins/cm$^3$ and thus, the defects in the film were small in number.

Five sample pieces having a size of 1 cm × 1 cm were arbitrarily taken out from the other portion of the band-shaped member and set in a reactive sputtering apparatus (product of our company), followed by deposition of a 1500 angstrom thick ITO (In$_2$O$_3$+SnO$_2$) film on the amorphous silicon film. The respective sample pieces were mounted in a CPM (constant photocurrent method) apparatus (apparatus of our company) and light was passed from the ITO film side to measure an inclination of the urbach tail with a result of 50±1 meV, from which the defects in the film was found to be small in number.

FILM-FORMING EXAMPLE 12

Following the deposited film-forming step carried out in Film-forming Example 11, the introduction of the starting gases used was stopped. Thereafter, an amorphous silicon germanium film was continuously deposited under the same film-forming conditions as in Film-forming Example 11 except that the isolated container 404 was evacuated to an inner pressure of $5 \times 10^{-6}$ Torr, followed by introducing 22 sccm of SiH$_4$, 18 sccm of GeH$_4$, 1.5 sccm of SiF$_4$ and 50 sccm of H$_2$ from the bias applicator tube 428 serving as a gas introduction pipe and that the inner pressure of the film-forming chamber 412 was maintained at 21 mTorr and the microwave power was 0.75 kW.

When a DC voltage of +40 V was applied from the power supply 216 for bias application through the conductive wire 217 to the bias applicator tube 428 serving as the gas introduction pipe, a bias current of 6.7 A passed. Visual observation revealed that the luminance of the plasma slightly increased.

After completion of the film formation in this Film-forming Example and other film formation, the band-shaped member was cooled and withdrawn. The distribution in thickness of the deposited film formed according to this Film-forming Example was measured along its width and length, revealing the distribution within 5% and an average deposition rate of 34 angstroms/second.

Part of the deposited film was cut off and subjected to the measurement of IR absorption spectrum by a reflection method using FT-IR (1720X, available from Perkin-Elmer Inc.), with the result that there were recognized absorptions at 2000 cm$^{-1}$, 1880 cm$^{-1}$ and 630 cm$^{-1}$ with an absorption pattern inherent to the a-SiGe:H:F film. Moreover, the crystallinity of the film was evaluated using RHEED (JEM-100SX, available from Nippon Denshi K.K.), with a result of a halo phenomenon from which the film was found to be amorphous. The amount of hydrogen in the film was quantitatively determined by the use of a hydrogen-in-metal analyzer (EMGA-1100, available from Horiba Seishakusho K.K.), revealing that the amount was 15±2 atomic %.

The amorphous silicon germanium film formed by deposition on the band-shaped member was mechanically removed over a region of about 5 cm$^2$ to measure its volume. Subsequently, a spin density was measured by the use of the ESR apparatus (JES-RE2X, available from Nippon Denshi K.K.), from which it was found that the density was $4.8 \times 10^{15}$ spins/cm$^3$ and thus, the defects in the film were small in number.

Five sample pieces having a size of 1 cm × 1 cm were arbitrarily taken out from the other portion of the band-shaped member and set in a reactive sputtering apparatus (product of our company), followed by deposition of a 1500 angstrom thick ITO (In$_2$O$_3$+SnO$_2$) film on the amorphous silicon germanium film. The respective sample pieces were mounted in a CPM (constant photocurrent method) apparatus (apparatus of our company) and light was passed from the ITO film side to measure an inclination of the urbach tail with a result of $55\pm1$ meV, from which the defects in the film was found to be small in number.

FILM-FORMING EXAMPLE 13

Following the deposited film-forming step carried out in Film-forming Example 11, the introduction of the starting gases used was stopped. Thereafter, an amorphous silicon carbide film was continuously deposited under the same film-forming conditions as in Film-forming Example 11 except that the isolated container 404 was evacuated to an inner pressure of $5\times10^{-6}$ Torr, followed by introducing 58 sccm of $SiH_4$, 9 sccm of $CH_4$, 2 sccm of $SiF_4$ and 180 sccm of $H_2$ from the bias applicator tube 428 serving also as a gas introduction pipe and that the inner pressure of the film-forming chamber 312 was maintained at 25 mTorr.

When a DC voltage of $+60$ V was applied from the power supply 216 for bias application through the conductive wire 217 to the bias applicator tube 428 serving as the gas introduction pipe, a bias current of 6.8 A passed. Visual observation revealed that the luminance of the plasma slightly increased.

After completion of the procedures of this Film-forming Example and other film formation, the band-shaped member was cooled and withdrawn. The distribution in thickness of the deposited film formed according to this Film-forming Example was measured along its width and length, revealing the distribution within 5% and an average deposition rate of 54 angstroms/second.

Part of the deposited film was cut off and subjected to the measurement of IR absorption spectrum by a reflection method using FT-IR (1720X, available from Perkin-Elmer Inc.), with the result that there were recognized absorptions at 2080 cm$^{-1}$, 1250 cm$^{-1}$, 960 cm$^{-1}$, 777 cm$^{-1}$ and 660 cm$^{-1}$ with an absorption pattern inherent to the a-SiC:H:F film. Moreover, the crystallinity of the film was evaluated using RHEED (JEM-100SX, available from Nippon Denshi K.K.), with a result of a halo phenomenon from which the film was found to be amorphous. The amount of hydrogen in the film was quantitatively determined by the use of a hydrogen-in-metal analyzer (EMGA-1100, available from Horiba Seishakusho K.K.), revealing that the amount was $13\pm2$ atomic %.

The amorphous silicon carbide film formed by deposition on the band-shaped member was mechanically removed over a region of about 5 cm$^2$ to measure its volume. Subsequently, a spin density was measured by the use of the ESR apparatus (JES-RE2X, available from Nippon Denshi K.K.), from which it was found that the density was $8.5\times10^{15}$ spins/cm$^3$ and thus, the defects in the film were small in number.

Five sample pieces having a size of 1 cm$\times$1 cm were arbitrarily taken out from the other portion of the band-shaped member and set in a reactive sputtering apparatus (product of our company), followed by deposition of a 1500 angstrom thick ITO (In$_2$O$_3$+SnO$_2$) film on the amorphous silicon carbide film of the respective sample pieces were mounted in a CPM (constant photocurrent method) apparatus (apparatus of our company) and light was passed from the ITO film side to measure an inclination of the urbach tail with a result of $57\pm1$ meV, from which the defects in the film was found to be small in number.

FILM-FORMING EXAMPLE 14

Following the deposited film-forming step carried out in Film-forming Example 11, the introduction of the starting gases used was stopped. Thereafter, a p-type microcrystalline silicon film was continuously deposited under the same film-forming conditions as in Film-forming Example 11 except that the isolated container 404 was evacuated to an inner pressure of $5\times10^{-6}$ Torr, followed by introducing 60 sccm of $SiH_4$, 14 sccm of $BF_3$ (diluted with 3000 ppm of $H_2$), 3 sccm of $SiF_4$ and 180 sccm of $H_2$ from the bias applicator tube 428 serving also as a gas introduction pipe and that the inner pressure of the film-forming chamber 412 was maintained at 33 mTorr and the microwave power was 1.7 kW.

When a DC voltage of $+70$ V was applied from the power supply 216 for bias application through the conductive wire 217 to the bias applicator tube 428 serving as the gas introduction pipe, a bias current of 6.6 A passed. Visual observation revealed that the luminance of the plasma slightly increased.

After completion of the procedures of this Film-forming Example and other film formation, the band-shaped member was cooled and withdrawn. The distribution in thickness of the deposited film formed according to this Film-forming Example was measured along its width and length, revealing the distribution within 5% and an average deposition rate of 46 angstroms/second.

Part of the deposited film was cut off and subjected to the measurement of IR absorption spectrum by a reflection method using FT-IR (1720X, available from Perkin-Elmer Inc.), with the result that there were recognized absorptions at 2100 cm$^{-1}$ and 630 cm$^{-1}$ with an absorption pattern inherent to the $\mu$ C-Si:H:F flim. Moreover, the crystallinity of the film was evaluated using RHEED (JEM-100SX, available from Nippon Denshi K.K.), revealing a ring form, from which the film was found to be non-oriented and polycrystalline. The amount of hydrogen in the film was quantitatively determined by the use of a hydrogen-in-metal analyzer (EMGA-1100, available from Horiba Seishakusho K.K.), revealing that the amount was $4\pm1$ atomic %.

Five sample pieces having a size of 5 mm$\times$5 mm were arbitrarily taken out from deposited film on the band-shaped member and subjected to observation of the surface state through a low acceleration FE-SEM with ultrahigh resolving power (S-900, available from Hitachi Ltd.), revealing that the film surface was smooth with little abnormal projections being recognized.

FILM-FORMING EXAMPLE 15

Following the deposited film-forming step carried out in Film-forming Example 11, the introduction of the starting gases used was stopped. Thereafter, an n-type amorphous silicon film was continuously deposited under the same film-forming conditions as in Film-forming Example 11 except that the isolated container 404 was evacuated to an inner pressure of $5\times10^{-6}$ Torr, followed by introducing 88 sccm of $SiH_4$, 11 sccm of $PH_3$ (diluted with 1% of $H_2$), 5 sccm of $SiF_4$ and 25 sccm of $H_2$ from the bias applicator tube 428 serving also as an introduction pipe and that the inner pressure of the film-forming chamber 412 was maintained at 38 mTorr and the microwave powder was 1.05 kW.

When a DC voltage or +65 V was applied from the power supply 216 for bias application through the conductive wire 217 to the bias applicator tube 428 serving as the gas introduction pipe, a bias current of 6.4 A passed. Visual observation revealed that the luminance of the plasma slightly increased.

After completion of the procedures of this Flm-forming Example and Other film formation, the band-shaped member was cooled and withdrawn. The distribution in thickness of the deposited film formed according to this Film-forming Example was measured along its width and length, revealing the distribution within 5% and an average deposition rate of 70 angstroms/second.

Part of the deposited film was cut off and subjected to the measurement of IR absorption spectrum by a reflection method using FT-IR (1720X, available from Perkin-Elmer Inc.), with the result that there were recognized absorptions at 2100 cm$^{-1}$ and 630 cm$^{-1}$ with an absorption pattern inherent to the a-Si:H:F film. Moreover, the crystallinity of the film was evaluated using RHEED (JEM-100SX, available from Nippon Denshi K.K.), revealing a halo, from which the film was found to be amorphous. The amount of hydrogen in the film was quantitatively determined by the use of a hydrogen-in-metal analyzer (EMGA-1100, available from Horiba Seishakusho K.K.), revealing that the amount was 22±2 atomic %.

Five sample pieces having a size of 5 mm×5 mm were arbitrarily taken out from deposited film on the band-shaped member and subjected to observation of the surface state through a low acceleration FE-SEM with ultrahigh resolving power (S-900, available from Hitachi Ltd.), revealing that the film surface was smooth with little abnormal projections being recognized.

FILM-FORMING EXAMPLE 16

The general procedure of Film-forming Example 11 was repeated except that there was used, instead of the SUS430BA band-shaped member, a PET (polyethylene terephthalate band-shaped member (46 cm wide×100 m long×0.8 mm thick) which had been vacuum deposited with a 2μ thick Al film at a side where the deposited film was to be formed (but a comb-type gap having a with of 70 μm and a length of 10 mm was formed at intervals of 20 cm along the directions of the width and length at part of the side) and the substrate surface temperature was 210° C., thereby continuously depositing an amorphous silicon film.

When a DC voltage of +70 V was applied from the power supply 216 for bias application through the conductive wire 217 to the bias applicator tube 428 serving also as the gas introduction pipe, a bias current of 6.6 A passed. Visual observation revealed that the luminance of the plasma slightly increased.

After cooling, the band-shaped member was withdrawn. The distribution the film thickness was measured along its width and length, revealing the distribution within 5% and an average deposition rate of 112 angstroms/second. Part of the deposited film was cut off and subjected to the measurement of IR absorption spectrum by a reference transmission method using FT-IR (1720X, available from Perkin-Elmer Inc.), with the result that there were recognized absorptions at 2000 cm$^{-1}$ and 630 cm$^{-1}$ with an absorption pattern inherent to the a-Si:H:F film. The amount of hydrogen in the film was quantitatively determined from the absorption attributed to the Si-H in the vicinity of 2000 cm$^{-1}$, revealing that the amount was 22±2 atomic %.

Moreover, the crystallinity of the film was evaluated using RHEED (JEM-100SX, available from Nippon Denshi K.K.), revealing a halo, from which the film was found to be amorphous.

Twenty gap electrodes which had been preliminarily formed were randomly cut off and were each subjected to measurement of a photocurrent under irradiation with AM-1 light (100 mW/cm$^2$) and a dark current in the dark by the use of HP4140B to determine a photoconductivity, $\sigma_p$ (S/cm), and the dark conductivity, $\sigma_d$ (S/cm). These conductivities were, respectively, within ranges of $(4.0\pm0.5)\times10^{-5}$ S/cm and $(2.0\pm0.5)\times10^{-11}$ S/cm.

The sample pieces were set in a CPM (constant photocurrent method) apparatus (apparatus of our company), and light was passed from the ITO film side to measure an inclination of the urbach tail with a result of 51±1 meV, from which the defects in the film was found to be small in number.

FILM-FORMING EXAMPLES 17 TO 21

Under the same operating and plasma-initiating conditions as in Film-forming Examples 11 to 15 except that the bias voltage was changed as indicated in Table 13, the respective deposited films were formed.

The thus formed deposited film were evaluated in the same manner as in Film-forming Examples 11 to 15. The overall evaluation of the respective films is shown in Table 13. In all the cases, any anomalous discharge did not take place with stable plasmas being generated, and the films obtained had good characteristics.

FILM-FORMING EXAMPLES 22 TO 26

Under the same operating and plasma-initiating conditions as in Film-forming Examples 11 to 15 except that the bias voltage applied to the second bias bar was changed as indicated in Table 14, the respective deposited films were formed. The bias voltage was applied according to the method shown in FIG. 21(d) wherein a voltage of +30 V was applied to the first bias bar in all cases.

The thus formed deposited films were evaluated in the same manner as in Film-forming Examples 11 to 15. The overall evaluation of the respective films is shown in Table 14. In all the cases, any anomalous discharge did not take place with stable plasmas being generated, and the films obtained had good characteristics.

FILM-FORMING EXAMPLE 27

In this example, a band-shaped member was transferred by means of the apparatus of FIG. 4 at a rate of 50 cm/minute to fabricate a Schottky diode having a layer structure as shown in FIG. 13.

The fabrication procedure is described below.

A 1000 angstrom thick Cr layer 1302 was formed on the band-shaped member 1301, which had been washed in the same manner as in Film-forming Example 11, by the use of a continuous vacuum deposition apparatus. Subsequently, the band-shaped member 1301 was set in the microwave plasma CVD apparatus of the invention shown in FIG. 4 so that the side on which the Cr layer had been formed was turned downward as viewed in the figure, followed by the same operations as in Film-forming Example 11 under film-forming conditions indicated in Table 15, thereby forming an n+-Si layer 1303.

After the continuous film formation over 20 minutes, the formation of the n+-Si layer 1303 was completed, followed by stopping the application of the microwave power and the introduction of the SiH₄ and H₂-diluted PH₃. Thereafter, the isolated container 403 was evacuated to a pressure of $1 \times 10^{-6}$ Torr.

Thereafter, the band-shaped member 401 wound up on the take-off roller 408 was transferred reversely from the right side toward the left side as viewed in the figure, under which the i-Si layer 1304 was continuously formed for 20 minutes according to the procedure described above under film-forming conditions indicated in Table 15. The transfer rate was 50 cm/minute.

After completion of the formation of the i-Si layer 1304, the band-shaped substrate 401 was withdrawn from the carrying-out chamber 402 according to the procedure described hereinbefore.

The average of the total thickness of the n+-Si layer and the i-Si layer was about 0.6 μm and the uniformity within the plane was as good as ±4%.

Sample pieces were optionally cut off from twenty portions of the band-shaped member 401 and each set in a vacuum deposition apparatus, followed by forming a gold deposited film 1305 with a diameter of 5 mmφ and a thickness of 100 angstroms of the i-Si layer 1304.

The gold deposited film and the Cr deposited film were, respectively, subjected to pressure welding with electric connection terminals 1306, 1307 to determine the characteristics of the Schottky diode. As a result, it was found that it had a good diode characteristic of a diode factor, n = 1.12±0.05. The uniformity in the characteristic in the plane was also good.

FILM-FORMING EXAMPLE 28

Using the continuous microwave plasma CVD apparatus of the invention shown in FIG. 4, a p-i-n type a-Si solar cell having a layer structure shown in FIG. 14 was continuously fabricated.

The stainless steel (SUS430BA) band-shaped member was sufficiently washed and defatted, after which Al and Cr were continuously vacuum deposited by the use of a continuous vacuum deposition apparatus, not shown, thereby forming the lower electrode 1402. The band-shaped member 401 on which the lower electrode 1402 had been formed was set in the apparatus of FIG. 4 so that the side on which the lower electrode 1402 had been formed was turned downward as viewed in the figure. According to the procedure described hereinbefore, deposited films of n-Si, i-Si and p-type μ x-Si were continuously formed in this order under conditions indicated in Table 14.

The indium tin oxide film 1406 (ITO) was vacuum deposited on the p-type μ x-Si layer as a transparent electrode, followed by vacuum deposition of the Al electrode 1407 as a current collector electrode and coating of a resin as a surface protective layer, thereby fabricating a solar cell having the layer structure of FIG. 14. The thus fabricated solar cell was subjected to measurement with a solar simulator with AM of 1.5 (100 mW/cm²), with the result that the photoelectric conversion efficiency was 8.4% on average and, thus, a good characteristic was obtained.

As compared with solar cell modules which were formed without application of any bias voltage, the rate of occurrence of defects such as by short-circuiting was improved by 20% or over.

FILM-FORMING EXAMPLE 29

A p-i-n type a-Si/a-SiC solar cell having a layer structure shown in FIG. 14 was continuously fabricated by the use of the continuous microwave CVD apparatus of the invention shown in FIG. 14, reference numeral 1404 is changed to indicate an i-SiC layer and reference numeral is changed to indicate a p-type μ x-SiC layer. The general procedure of Film-forming Example 28 was repeated under film-forming conditions indicated in Table 17 except for the above changes, thereby forming deposited films of n-Si, i-SiC and p-μ x-SiC in this order.

The utilization efficiency of the starting gases at the time of the formation of the i-Si layer was 50%. The results of the evaluation by measurement with a solar simulator as used in Film-forming Example 28 revealed that the photoelectric conversion efficiency was 6.3% or over on average.

The variation of the photoelectric conversion efficiency after continuous irradiation of AM 1.5 (100 mW/cm²) light over 500 hours relative to the initial value was found to be within 9%.

FILM-FORMING EXAMPLE 30

A tandem-type solar cell having a layer structure shown in FIG. 16 was continuously fabricated by the use of an apparatus (not shown) wherein three further film-forming chambers are connected between the film-forming chamber 405 of the continuous microwave CVD apparatus shown in FIG. 4 and the band-shaped member carrying-out chamber 407.

The solar cell was continuously fabricated under film-foming conditions indicated in Table 18 and in the same manner as described in Apparatus Example 4. As a result of the measurement with a solar simulator as used in Film-forming Example 28, the photoelectric rate was found to be 6.6% or over on average.

The variation of the photoelectric conversion efficiency after continuous irradiation of AM 1.5 (100 mW/cm²) light over 500 hours relative to the initial value was found to be within 9%.

As compared with solar cell modules which were formed without application of any bias voltage, the rate of occurrence of defects such as by short-circuiting was improved by 20% or over. These modules were connected, a power supply system of 3 kW could be made.

TABLE 1

| film-forming conditions | |
| --- | --- |
| microwave power | 1500 W |
| inner pressure of the film-forming chamber | 25 m Torr |
| substrate temperature | 250° C. |
| gas used and its flow rate | |
| SiH₄ | 120 sccm |
| H₂ | 100 sccm |
| the size of the slit opening | 8 mm × 400 mm |
| central conductor | 12 mm φ (applied with silver coating) |

TABLE 2

| specimen No. | inside diameter of film-forming space | evaluation |
| --- | --- | --- |
| — | 180 mm φ | discharge was not caused |
| 2-1 | 120 mm φ | unstable discharge |
| 2-2 | 80 mm φ | no problem |
| 2-3 | 60 mm φ | " |
| 2-4 | 40 mm φ | the antenna was overheated and |

TABLE 2-continued

| specimen No. | inside diameter of film-forming space | evaluation |
|---|---|---|
| | | the film was partly peeled off |

TABLE 3

| | |
|---|---|
| the kind of the substrate web | stainless (bright annealed) |
| the size of the substrate web | width 400 mm, thickness 0.2 mm |
| the size of the film-forming chamber | 80 mm φ × 400 mm |
| microwave power | 1500 W |
| gas used and its flow rate | $SiH_4$: 120 sccm<br>$H_2$: 100 sccm |
| substrate temperature | 250° C. (room temperature 25° C.) |
| film-forming period | 100 sec. |
| coaxial line | 60 mm φ and 12 mm φ, applied with silver coating |

TABLE 4

| specimen No. | the width of the slit opening [mm] | inner pressure of the film-forming chamber [Torr] | differencial pressure ΔP [Torr] | effective conductance Cef [l/sec] | evaluation |
|---|---|---|---|---|---|
| 1-1 | 0.9 | $300 \times 10^{-3}$ | $299 \times 10^{-3}$ | 14 | large film thickness distribution |
| 1-2 | 1.6 | $150 \times 10^{-3}$ | $149 \times 10^{-3}$ | 29 | large film thickness distribution |
| 1-3 | 3 | $75 \times 10^{-3}$ | $74 \times 10^{-3}$ | 58 | no problem |
| 1-4 | 8 | $25 \times 10^{-3}$ | $24 \times 10^{-3}$ | 179 | " |
| 1-5 | 17 | $10 \times 10^{-3}$ | $9 \times 10^{-3}$ | 478 | unstable discharge, leakage of plasma |
| — | 24 | $8 \times 10^{-3}$ | $7 \times 10^{-3}$ | 615 | no discharge |

TABLE 5

| specimen No. | the pressure of the space between the film-forming chamber and the housing chamber [m Torr] | effective exhaustion rate [l/sec] | evaluation |
|---|---|---|---|
| 3-1 | 20 | 861 | abnormal discharge was continuously centralized near the substrate web |
| 3-2 | 10 | 287 | abnormal discharge was intermittently caused |
| 3-3 | 6 | 227 | no problem |
| 3-4 | 4 | 205 | " |

TABLE 6

| wave form | 60 | 400 | 500 | 1.5K | 2K | 500K | 900K | 2M | 2.5M | 4M | maximum amplitude voltage ($V_{P-P}$) |
|---|---|---|---|---|---|---|---|---|---|---|---|
| (sine wave) | ○ | ○ | ○ | ○ | ○ | ○ | ○ | ○ | X | X | 180 |
| (triangular wave) | ○ | ○ | ○ | ○ | ○ | ○ | ○ | ○ | X | X | 190 |
| (square wave) | ○ | ○ | ○ | ○ | ○ | ○ | ○ | ○ | X | X | 230 |
| (pulse) | ○ | ○ | ○ | ○ | ○ | ○ | ○ | ○ | X | X | 170 |
| (pulse) | △ | △ | △ | △ | △ | △ | △ | △ | X | X | 170 |

TABLE 6-continued

| wave form | frequency (Hz) | | | | | | | | | | maximum amplitude voltage ($V_{p-p}$) |
|---|---|---|---|---|---|---|---|---|---|---|---|
| | 60 | 400 | 500 | 1.5K | 2K | 500K | 900K | 2M | 2.5M | 4M | |
| (pulsating current) | ○ | ○ | ○ | ○ | ○ | ○ | ○ | ○ | △ | △ | 65 |
| (sine wave) | ○ | ○ | ○ | ○ | ○ | ○ | ○ | ○ | △ | △ | 190 |

○: good
△: practically effective
X: not effective

TABLE 7

| inside diameter of curved portion (mm) | 80 φ |
|---|---|
| the size of the slit opening (mm) | 8 × 400 |
| diameter and inserted length of the central conductor (mm) | 15 φ, 455 |
| the kind and the size of the dielectric body (mm) | quartz tube (thickness 3 mm) 23 φ × 470 |

TABLE 8

| | film-forming conditions | |
|---|---|---|
| | i-type Si layer | $n^+$-type Si layer |
| gas used and its flow rate | | |
| $SiH_4$ | 300 sccm | 300 sccm |
| $H_2$ | 400 sccm | — |
| $PH_3$ (diluted to 3000 ppm by $H_2$ gas) | — | 400 sccm |
| inner pressure of the film-forming chamber | 25 m Torr | 25 m Torr |
| microwave power | 1500 W | 1500 W |
| substrate temperature | 250° C. | 250° C. |

TABLE 9

| | film-forming conditions | | |
|---|---|---|---|
| | n-type Si layer | i-type Si layer | p-type Si layer |
| layer thickness [Å] | 300 | 4000 | 100 |
| gas used and its flow rate (sccm) | | | |
| $H_2$ | 10 | 150 | 4 |
| $SiH_4$ | 11 | 160 | 4 |
| $PH_3$ (diluted to 2000 ppm by $H_2$ gas) | 30 | — | — |
| $B_2H_6$ (diluted to 2000 ppm by $H_2$ gas) | — | 5 | — |
| $B_2H_6$ (diluted to 1% by $H_2$ gas) | — | — | 10 |
| inner pressure of the film-forming chamber | 20 m Torr | 25 m Torr | 15 m Torr |
| microwave power | 400 W | 1500 W | 600 W |
| substrate temperature | 220° C. | 200° C. | 180° C. |
| inside diameter of the film-forming chamber (opened width) | 40 mm φ (4.5 mm) | 105 mm φ (8 mm) | 44 mm φ (3 mm) |
| the effective width of the substrate web | | 400 mm | |
| transportation speed of the substrate web | | 48 cm/min (= 8 mm/sec) | |

TABLE 10

| | comparison items | | | |
|---|---|---|---|---|
| Film-forming example Comparative example | deposition rate of the i-type Si layer | transportation speed | gas utilization efficiency upon formation of the i-type Si layer | average photoelectric conversion efficiency of the solar cell |
| Film-forming example 6 | 100 Å/S | 48 cm/min | 55% | 8.3% |
| Comparative example 4 | 20 Å/S | 15 cm/min | 14% | 8.2% |

TABLE 11

| | film-forming conditions | | |
|---|---|---|---|
| | n-type Si layer (300 Å thickness) | i-type SiC layer (3000 Å thickness) | p-type μx-SiC layer (100 Å thickness) |
| gas used and its flow rate (sccm) | | | |
| $H_2$ | 8 | 100 | 8 |

TABLE 11-continued

| | film-forming conditions | | |
|---|---|---|---|
| | n-type Si layer (300 Å thickness) | i-type SiC layer (3000 Å thickness) | p-type μx-SiC layer (100 Å thickness) |
| SiH₄ | 11 | 119 | 4 |
| PH₃ | 5 | — | — |
| B₂H₆ (diluted to 1% by H₂ gas) | — | — | 3 |
| CH₄ (diluted to 1% by H₂ gas) | — | 20 | 2 |
| inner pressure of the film-forming chamber (m Torr) | 24 | 40 | 35 |
| microwave power (W) | 400 | 2000 | 1800 |
| substrate temperature (°C.) | 200 | 200 | 180 |
| inside diameter of the film-forming chamber (mm φ) | 60 | 104 | 65 |
| width of the substrate web | | 400 mm | |
| transportation speed | | 48 cm/min (= 8 mm/sec) | |

TABLE 12

| | film-forming conditions | | | | | |
|---|---|---|---|---|---|---|
| | first n₁⁺-type Si layer | first i₁-type SiGe layer | first p₁⁺-type μx-Si layer | second n₂⁺-type Si layer | second i₂-type SiGe layer | second p₂⁺-type μx-Si layer |
| gas used and its flow rate (sccm) | | | | | | |
| H₂ | 14 | 100 | 10 | 8 | 100 | 8 |
| SiH₄ | 14 | 140 | 5 | 8 | 200 | 3 |
| GeH₄ | — | 140 | — | — | — | — |
| PH₃ (diluted to 3000 ppm by H₂ gas) | 3 | — | — | 2 | — | — |
| B₂H₆ (diluted to 200 ppm by H₂ gas) | — | 5 | 1 | — | 8 | 1 |
| film thickness (Å) | 300 | 3500 | 120 | 200 | 5000 | 80 |
| inner pressure (m Torr) | 12 | 40 | 15 | 16 | 60 | 18 |
| microwave power (W) | 400 | 2000 | 800 | 400 | 3000 | 1500 |
| substrate temperature (°C.) | 280 | 270 | 270 | 260 | 250 | 250 |
| inside diameter of the film-forming chamber (mm φ) | 60 | 120 | 78 | 48 | 105 | 52 |
| transportation speed | | | 48 cm/min (= 8 mm/sec) | | | |
| width of the substrate web | | | 400 mm | | | |

TABLE 13

| Film-forming example | Bias Voltage wave form | Bias Voltage frequency (Hz) | Bias Voltage maximum amplitude voltage (V_{P-P}) | film-forming conditions (other than the bias voltage) | the manner of applying a bias voltage | evaluated results |
|---|---|---|---|---|---|---|
| 17 | square wave | 1K | 170 | same as in the case of Film-forming example 11 | the manner shown in FIG. 21(b) | a few abnormal growth, excellent characteristics |
| 18 | pulse | 1.5K | 120 (reference voltage −30 V) | same as in the case of Film-forming example 12 | the manner shown in FIG. 21(c) | a few abnormal growth, excellent characteristics |
| 19 | sine wave | 500 | 180 | same as in the case of Film-forming example 13 | the manner shown in FIG. 21(a) | a few abnormal growth, excellent characteristics |
| 20 | pulsating current | 80 | 60 | same as in the case of Film-forming example 14 | the manner shown in FIG. 21(c) | excellent characteristics |
| 21 | triangular wave | 5K | 100 | same as in the case of Film-forming example 15 | the manner shown in FIG. 21(b) | a few abnormal growth, excellent characteristics |

Note
a nickel bar was used as the bias bar

TABLE 14

| Film-forming example | Bias Voltage wave form | Bias Voltage frequency (Hz) | Bias Voltage maximum amplitude voltage (V_{P-P}) | film-forming conditions (other than the bias voltage) | the manner of applying a bias voltage | evaluated results |
|---|---|---|---|---|---|---|
| 22 | sine wave | 900 | 130 (reference voltage −30 V) | same as in the case of Film-forming example 11 | the manner shown in FIG. 21 (d) | a few abnormal growth, excellent characteristics |
| 23 | square wace | 4K | 150 | same as in the case of Film-forming example 12 | the manner shown in FIG. 21(d) | a few abnormal growth, excellent characteristics |
| 24 | pulsating current | 1K | 70 | same as in the case of Film-forming exampel 13 | the manner shown in FIG. 21(d) | excellent characteristics |
| 25 | triangular wave | 1K | 170 | same as int he case of Film-forming example 14 | the manner shown in FIG. 21(d) | a few abnormal growth, excellent characteristics |
| 26 | sine wave | 500 | 160 | same as in the case of Film-forming example 15 | the manner shown in FIG. 21(d) | a few abnormal growth, excellent characteristics |

Note
a nickel bar was used as the bias bar

TABLE 15

| | film-forming conditions | |
|---|---|---|
| | i-type Si layer | n⁻-type Si layer |
| gas used and its flow rate | | |
| SiH₄ | 310 sccm | 310 sccm |
| H₂ | 300 sccm | 200 sccm |
| PH₃ | — | 50 sccm |
| (diluted to 3000 ppm by H₂ gas) | | |

TABLE 15-continued

| | film-forming conditions | |
|---|---|---|
| | i-type Si layer | n⁻-type Si layer |
| inner pressure of the film-forming chamber | 24 m Torr | 24 m Torr |
| microwave power | 1400 W | 1400 W |
| substrate temperature | 250° C. | 250° C. |
| bias voltage | 60 V/5.9 A | 60 V/5.8 A |

TABLE 16

| | film-forming conditions | | |
|---|---|---|---|
| | n-type Si layer | i-type Si layer | p-type Si layer |
| gas used and its flow rate (sccm) | | | |
| H₂ | 10 | 120 | 4 |
| SiH₄ | 12 | 170 | 5 |
| PH₃ (diluted to 3000 ppm by H₂ gas) | 9 | — | — |
| B₂H₆ (diluted to 2000 ppm by H₂ gas) | — | 5 | — |
| B₂H₆ (diluted to 1% by H₂ gas) | — | — | 8 |
| inner pressure of the film-forming chamber | 18 m Torr | 23 m Torr | 14 m Torr |
| microwave power | 350 W | 1400 W | 550 W |
| substrate temperature | 220° C. | 200° C. | 180° C. |
| inside diameter of the film-forming chamber (opened width) | 40 mm φ (4.5 mm) | 105 mm φ (8 mm) | 44 mm φ (3 mm) |
| bias voltage | DC. 40 V/4.3 A | 500 Hz sine wave 160 V$_{p-p}$ | DC. 50 V/5.2 A |
| the effective width of the substrate web | | 400 mm | |
| transportation speed of the substrate web | | 50 cm/min (= 8 mm/sec) | |

TABLE 17

| | film-forming conditions | | |
|---|---|---|---|
| | n-type Si layer | i-type SiC layer | p-type μx-SiC layer |
| gas used and its low rate (sccm) | | | |
| H₂ | 8 | 100 | 8 |
| SiH₄ | 12 | 122 | 5 |
| PH₃ | 5 | — | — |
| B₂H₆ (diluted to 1% by H₂ has) | — | — | 3 |
| CH₄ (diluted to 1% by H₂ gas) | — | 20 | 2 |
| inner pressure of the film-forming chamber (m Torr) | 23 | 38 | 33 |
| microwave power (W) | 350 | 1800 | 1700 |
| substrate temperature (°C.) | 200 | 200 | 180 |
| inside diameter of the film-forming chamber (mm φ) | 60 | 104 | 65 |
| bias voltage | 1 KHz pulse 140 V$_{p-p}$ | 900 Hz square wave 150 V$_{p-p}$ | DC 60 V/5.8 A |
| width of the substrate web | | 400 mm | |
| transportation speed | | 50 cm/min (= 8 mm/sec) | |

TABLE 18

| | film-forming conditions | | | | | |
|---|---|---|---|---|---|---|
| | first n₁⁺-type Si layer | first i₁-type SiGe layer | first p₁⁺-type μx-Si layer | second n₂⁺-type Si layer | second i₂-type SiGe layer | second p₂⁺-type μx-Si layer |
| gas used and its flow rate (sccm) | | | | | | |
| H₂ | 14 | 100 | 10 | 8 | 100 | 8 |
| SiH₄ | 15 | 150 | 7 | 9 | 220 | 4 |
| GeH₄ | — | 145 | — | — | — | — |
| PH₃ (diluted to 3000 ppm by H₂ gas) | 3 | — | — | 2 | — | — |
| B₂H₆ (diluted to 200 ppm by H₂ gas) | — | 5 | 1 | — | 8 | 1 |
| inner pressure (m Torr) | 1 | 38 | 14 | 15 | 55 | 16 |
| microwave power (W) | 350 | 1800 | 750 | 350 | 2700 | 1300 |
| substrate temperature (°C.) | 280 | 270 | 270 | 260 | 250 | 250 |
| inside diameter of the | 60 | 120 | 78 | 48 | 105 | 52 |

TABLE 18-continued

| | film-forming conditions | | | | | |
|---|---|---|---|---|---|---|
| | first $n_1^-$-type Si layer | first $i_1$-type SiGe layer | first $p_1^-$-type μx-Si layer | second $n_2^-$-type Si layer | second $i_2$-type SiGe layer | second $p_2^-$-type μx-Si layer |
| film-forming chamber (mm φ) bias voltage | DC 50 V/4.8 A | DC 60 V/5.9 A | 1 kHz pulse 100 $V_{p-p}$ (reference voltage 0 V) | 1.5 kHz triangular wave 120 $V_{p-p}$ | 500 Hz sine wave 140 $V_{p-p}$ | DC 50 V/5.1 A |
| transportation speed | | | 50 cm/min (= 8 mm/sec) | | | |
| width of the substrate web | | | 400 mm | | | |

What is claimed is:

1. A method for continuously forming a functional deposited film with a large area according to a microwave plasma CVD process, which method comprises the steps of:
    continuously traveling a band-shaped member containing a conductive member along its length during which a pillar-shaped film-forming space capable of being kept substantially in vacuum therein is established by the use of the traveling band-shaped member as a side wall for the film-forming space;
    charging starting gases for film formation through a gas feed means into the film-forming space;
    and simultaneously radiating a microwave in all directions through a microwave antenna which is extended into the pillar-shaped film forming space and is substantially parallel to said sidewall so that microwave power is supplied to the film-forming space to intiate a plasma in the space whereby the film is deposited on the surface of the continuously traveling band-shaped member which constitutes the side wall exposed to the plasma.

2. A method according to claim 1, wherein on the way of the travel of the band-shaped member, said band-shaped member is curved by the use of a curve-initiating edge forming means and a curve-completing edge forming means while leaving a space extending along the length of said band-shaped means between the curve-initiating edge forming means and the curve-completing edge forming means, so that the side wall of the film-forming space is formed.

3. A method according to claim 2, wherein said band-shaped member is made of a material whose linear expansion coefficient is larger than that of said deposited film; while the curved band-shaped member is kept at a film-forming temperature higher than room temoerature, a film is deposited on the curved band-shaped member at a concave side thereof; and while cooling the band-shaped member to room temperature, said band-shaped member is developed flat at outside of the film-forming space and discharged to outside of the apparatus or said band-shaped member is wound up in a convex form and discharged to outside of the apparatus.

4. A method according to claim 1, wherein the film-forming space established by the side wall of the band-shaped member is in a pillar-shaped from and said microwave antenna means is extended into the film-forming space from one of opposite end faces of the pillar-shaped film-forming space so that said microwave antenna means is juxtaposed to the film-forming space to supply microwave power to the film-forming space.

5. A method according to claim 4, wherein the microwave power is supplied from the microwave antenna means to the film-forming space through a microwave transmitting member provided between the microwave antenna means and the film-forming space.

6. A method according to claim 5, wherein said microwave antenna means is separated from the plasma initiated in the film-forming space through the microwave transmitting member.

7. A method according to claim 5, wherein an outer diameter of the microwave transmitting-member is controlled depending on the complex dielectric constant of the plasma.

8. A method for continuously forming a functional deposited film with a large area according to a microwave plasma CVD process, which method comprises the steps of:
    continuously traveling a band-shaped member containing a conductive member along its length during which a pillar-shaped film-forming space capable of being kept substantially in vacuum therein is established by the use of the traveling band-shaped member as a side wall for the film-forming space;
    charging starting gases for film formation through a gas feed means into the film-forming space;
    simultaneously radiating a microwave in all directions through a microwave antenna which is extended into the pillar-shaped film forming space and is substantially parallel to said sidewall so that microwave power is supplied to the film-forming space to initiate a microwave plasma in the space; and
    while controlling a plasma potential of the microwave plasma, forming a deposited film on the surface of the continuously traveling band-shaped member which constitutes the side wall exposed to the microwave plasma.

9. A method according to claim 8, wherein on the way of the travel of the band-shaped member, said band-shaped member is curved by the use of a curve-initiating edge forming means and a curve-completing edge forming means while leaving a space extending along the length of said band-shaped means between the curve-initiating edge forming means and the curve-completing edge forming means, so that the side wall of the film-forming space is formed.

10. A method according to claim 9, wherein said band-shaped member is made of a material whose linear expansion coefficient is larger than that of said deposited film; while the curved band-shaped member is kept at a film-forming temperature higher than room temperature, a film is deposited on the curved surface of a concave form which is continously formed by curving the band-shaped member; and when the band-shaped member is cooled down to room temperature at outside of the film-forming space, said band-shaped member is cooled by being developed or said band-shaped member is cooled by being wound up in a convex form.

11. A method according to claim 8, wherein the film-forming space established by the side wall of the band-shaped member is in a pillar-shaped form and said microwave antenna means extended into the film-forming space one of opposite end faces of the pillar-shaped film-forming space so that said microwave antenna means is juxtaposed to the film-forming space to supply microwave power to the film-forming space.

12. A method according to claim 11, wherein the microwave power is supplied from the microwave antenna means to the film-forming space through a microwave transmitting member provided between the microwave antenna means and the film-forming space.

13. A method according to claim 12, wherein said microwave antenna means is separated from the plasma initiated in the film-forming space through the microwave transmitting member.

14. A method according to claim 8, wherein said plasma potential is controlled through a bias applicator means separated from the band-shaped member.

15. A method according to claim 14, wherein said bias applicator means is so arranged so that at least a part thereof contacts the microwave plasma, and a bias voltage is applied to said bias applicator means.

16. A method according to claim 15, wherein the at least a part of the bias applicator means which contacts the microwave plasma is made electrically conductive.

17. A method according to claim 15, wherein the bias voltage is a DC, pulsating and /or AC voltage.

18. A method according to claim 15, wherein said bias applicator means has also a function as the gas feed means.

19. A method according to claim 15, wherein said bias applicator means is provided to separate from said gas feed means.

20. A method according to claim 19, wherein said bias applicator means is constituted of a single bias bar or a plurality of bias bars.

21. A method according to claim 8, wherein the plasma potential is controlled by the bias voltage applied to the band-shaped member.

22. A method according to claim 21, wherein the gas feed means is grounded, at least a part of which is contacted with the microwave plasma.

23. A method according to claim 22, wherein the at least a part of the gas feed means contacting the microwave plasma is made electrically conductive.

24. A method according to claim 8, wherein an outer diameter of the microwave transmitting member is determined depending on the complex dielectric constant of the plasma.

25. A method according to claim 8, wherein at least a side of the band-shaped member which is exposed to the microwave plasma is made electrically conductive.

* * * * *

UNITED STATES PATENT AND TRADEMARK OFFICE
CERTIFICATE OF CORRECTION

PATENT NO. : 5,114,770
DATED : May 19, 1992
INVENTOR(S) : HIROSHI ECHIZEN, ET AL.

It is certified that error appears in the above-identified patent and that said Letters Patent is hereby corrected as shown below:

COLUMN 2

Line 54, "bee" should read --been--.

COLUMN 5

Line 48, "of" should read --to-- and "extab-" should read --estab- --.

COLUMN 6

Line 21, "with" should read --width--.

COLUMN 9

Line 30, "space" should read --space.--.

COLUMN 10

Line 26, "form" should read --from--.

COLUMN 15

Line 59, "prevent of" should be deleted.

COLUMN 16

Line 53, "th" should read --the--.

COLUMN 17

Line 45, "COMPARATIVE EXAMPLE 2" should read --COMPARATIVE EXPERIMENT 2--.

UNITED STATES PATENT AND TRADEMARK OFFICE
CERTIFICATE OF CORRECTION

PATENT NO. : 5,114,770
DATED : May 19, 1992
INVENTOR(S) : HIROSHI ECHIZEN, ET AL.

It is certified that error appears in the above-identified patent and that said Letters Patent is hereby corrected as shown below:

COLUMN 20

Line 65, "are" should read --of--.

COLUMN 21

Line 12, "at" should read --as--.

COLUMN 22

Line 43, "that" (second occurrence) should be deleted.

COLUMN 24

Line 49, "the" should be deleted.
    Line 55, "or" (first occurrence) should be deleted.

COLUMN 26

Line 33, "th" should read --the--.
    Line 57, "of" should be deleted.

COLUMN 34

Line 8, "is" (second occurrence) should be deleted.

COLUMN 35

Line 14, "likewise" should read --likewise be--.
    Line 24, "critical" should read --critical,--.
    Line 67, "construced" should read --construed--.

UNITED STATES PATENT AND TRADEMARK OFFICE
CERTIFICATE OF CORRECTION

PATENT NO. : 5,114,770
DATED : May 19, 1992
INVENTOR(S) : HIROSHI ECHIZEN, ET AL.

It is certified that error appears in the above-identified patent and that said Letters Patent is hereby corrected as shown below:

COLUMN 40

Line 61, "th" should read --the--.

COLUMN 46

Line 27, "ber 301" should read --ber 401--.
    Line 28, "306" should read --406--.
    Line 39, "th" should read --the--.
    Line 48, "layer," should read --layer 1405,--.

COLUMN 47

Line 11, "1722" should read --1723--.
    Line 21, "1706" should read --1708--.
    Line 24, "1706" should read --1708--.

COLUMN 48

Line 3, "serves" should read --serve--.
    Line 9, "This" should read --This is--.
    Line 26, "to" should read --of--.
    Line 27, "th" should read --the--.
    Line 40, "14028" should read --1402--.
    Line 42, "1706" should read --1708--.
    Line 49, "1706" should read --1708--.

COLUMN 49

Line 28, "a-Si:F, a-SiGe:H:F," should read --a-Si:F, a-Si:H:F, a-SiC:H, a-SiC:F, a-SiC:H:F, a-SiGe:H, a-SiGe:F, a-SiGe:H:F,--.

UNITED STATES PATENT AND TRADEMARK OFFICE
CERTIFICATE OF CORRECTION

PATENT NO. : 5,114,770
DATED : May 19, 1992
INVENTOR(S) : HIROSHI ECHIZEN, ET AL.

It is certified that error appears in the above-identified patent and that said Letters Patent is hereby corrected as shown below:

COLUMN 49

Line 29, "semiconductos" should read --semiconductors--.
Line 36, "photovolatic" should read --photovoltaic--.
Line 60, "113" should read --113 (shown in Fig. 1)--.
Line 65, "301" should read --302--.

COLUMN 52

Line 47, "Other" should read --other--.

COLUMN 53

Line 2, "example 1" should read --Example 1--.
Line 5, "terephthalate" should read --terephthalate)--.
Line 11, "distribution" should read --distribution of--.

COLUMN 58

Line 9, "was" should read --were--.

COLUMN 59

Line 5, "was" should read --were--.

COLUMN 60

Line 1, "was" should read --were--.

UNITED STATES PATENT AND TRADEMARK OFFICE
CERTIFICATE OF CORRECTION

PATENT NO. : 5,114,770

DATED : May 19, 1992

INVENTOR(S) : HIROSHI ECHIZEN, ET AL.

It is certified that error appears in the above-identified patent and that said Letters Patent is hereby corrected as shown below:

COLUMN 61

Line 10, "Other" should read --other--.
    Line 43, "terephthalate" should read --terephthalate)--.
    Line 47, "with" should read --width--.
    Line 59, "distribution" should read --distribution of--.

COLUMN 62

Line 21, "was" should read --were--.

COLUMN 64

Line 6, "in FIG. 14," should read
        --in FIG. 4. In FIG. 14,--.
    Line 8, "meral" should read --meral 1405--.

COLUMN 69

TABLE 14, "wace" should read --wave--.

COLUMN 73

Line 48, "temoera-" should read --tempera- --.

COLUMN 75

Line 1, "extended" should read --is extended--.
    Line 2, "space" should read --space from--.

UNITED STATES PATENT AND TRADEMARK OFFICE
CERTIFICATE OF CORRECTION

PATENT NO. : 5,114,770

DATED : May 19, 1992

INVENTOR(S) : HIROSHI ECHIZEN, ET AL.

It is certified that error appears in the above-identified patent and that said Letters Patent is hereby corrected as shown below:

<u>COLUMN 76</u>

Line 14, "grounded," should read --grounded, and--.

<u>COLUMN 49</u>

Line 40, "FILM-FORMING EXAMPLES" should be deleted."

Signed and Sealed this

Twenty-sixth Day of October, 1993

Attest:

BRUCE LEHMAN

Attesting Officer

Commissioner of Patents and Trademarks